US009529057B2

(12) United States Patent
Shrestha et al.

(10) Patent No.: US 9,529,057 B2
(45) Date of Patent: Dec. 27, 2016

(54) APPARATUS AND METHOD FOR OUT-OF-STEP PROTECTION USING THE ANALYSIS OF TRAJECTORIES OF ELECTRICAL MEASUREMENTS IN STATE PLANE

(71) Applicants: Binod Shrestha, Regina (CA); Ramakrishna Gokaraju, Saskatoon (CA)

(72) Inventors: Binod Shrestha, Regina (CA); Ramakrishna Gokaraju, Saskatoon (CA)

( * ) Notice: Subject to any disclaimer, the term of this patent is extended or adjusted under 35 U.S.C. 154(b) by 730 days.

(21) Appl. No.: 13/949,629

(22) Filed: Jul. 24, 2013

(65) Prior Publication Data
US 2014/0032138 A1    Jan. 30, 2014

Related U.S. Application Data

(60) Provisional application No. 61/675,005, filed on Jul. 24, 2012.

(51) Int. Cl.
*H01H 83/20* (2006.01)
*G05B 9/02* (2006.01)
(Continued)

(52) U.S. Cl.
CPC ............ *G01R 31/40* (2013.01); *G01R 31/343* (2013.01); *G06F 11/30* (2013.01); *H02H 1/0092* (2013.01);
(Continued)

(58) Field of Classification Search
None
See application file for complete search history.

(56) References Cited

U.S. PATENT DOCUMENTS 5,014,997 A    5/1991 Smith et al.
5,459,624 A    10/1995 Erickson et al.
(Continued)

FOREIGN PATENT DOCUMENTS

AU    2012206985 A1    2/2014
CA    2783755 A1    1/2014
WO    9705604 A1    2/1997

OTHER PUBLICATIONS

C. C. Chu, "Multi-swing transient instability problems in electric power systems: a preliminary study," in Proc. IEEE Int Circuits and Systems ISCAC '97. Symp, vol. 2, 1997, pp. 805-808.
(Continued)

*Primary Examiner* — Edward Cosimano
(74) *Attorney, Agent, or Firm* — Bereskin & Parr LLP/S.E.N.C.R.L., s.r.l.; Tony Orsi

(57) ABSTRACT

Various embodiments are described herein for a device and method for predicting an out-of-step or transient instability condition in a power system due to a disturbance, such as a fault, where the power system comprises a power generator. The method comprises determining values for a state plane trajectory for the power generator during the disturbance based on using an internal voltage angle of the power generator or an equivalent power generator and a during fault rotor speed of the power generator or equivalent power generator as state variables, determining time scale values; determining values for a critical state plane trajectory for the power generator after clearing the fault, determining values for a state plane trajectory for the power generator after clearing the fault, determining a critical clearing angle and a critical clearing time, and predicting that the power generator will be stable or unstable by comparing the time to clear the fault with the critical clearing time.

24 Claims, 23 Drawing Sheets

(51) Int. Cl.

| | |
|---|---|
| G01R 31/00 | (2006.01) |
| G01D 21/00 | (2006.01) |
| G06F 11/30 | (2006.01) |
| G06F 17/40 | (2006.01) |
| G06F 19/00 | (2011.01) |
| G01R 31/40 | (2014.01) |
| H02H 1/00 | (2006.01) |
| G01R 31/34 | (2006.01) |
| G01R 31/42 | (2006.01) |

(52) U.S. Cl.
CPC .............. *G01D 21/00* (2013.01); *G01R 31/00* (2013.01); *G01R 31/42* (2013.01); *G05B 9/02* (2013.01); *G06F 17/40* (2013.01); *G06F 19/00* (2013.01); *H01H 83/20* (2013.01)

(56) References Cited

U.S. PATENT DOCUMENTS

| | | | |
|---|---|---|---|
| 6,199,028 B1 | 3/2001 | Repperger et al. | |
| 6,868,311 B2* | 3/2005 | Chiang | H02J 3/24 700/286 |
| 8,588,984 B2* | 11/2013 | Rajapaske | G05B 23/0254 322/20 |
| 2003/0200010 A1* | 10/2003 | Chiang | H02J 3/24 700/286 |
| 2011/0022240 A1 | 1/2011 | Rajapaske | |

OTHER PUBLICATIONS

P. Forsyth, T. Maguire, and R. Kuffel, "Real time digital simulation for control and protection system testing," in Proc. IEEE 35th Annual Power Electronics Specialists, Conf. PESC 04, vol. 1, 2004, pp. 329-335.
D. X. Du, Z. Q. Bo. Z. X. Zhou, A. Perks, L. Denning, and B. Smith, "An advanced real time digital simulator based test system for protection relays," in Proc. 41st Int. Universities Power Engineering Conf. UPEC '06, vol. 3., 2006, pp. 851-855.
ADSP-BF533 EZ-KIT Lite Evaluation System Manual, Analog Devices Inc., Apr. 2004.
Advancement in Microprocessor based protection and Communication, IEEE Tutorial Course, Sponsored by the Power Engineering Education Committee and the Power System Relaying Committee of the IEEE Power Engineering Society, 97TP120-0, 1996.
M. Haque, "Identification of coherent generators for power system dynamic equivalents using unstable equilibrium point," Generation, Transmission and Distribution, IEE Proceedings C, vol. 138, No. 6, pp. 546-552, Nov. 1991.
S. Paudyal, G. Ramakrishna, and M. Sachdev, "Out-of-step Protection Using the Equal Area Criterion in Time Domain—SMIB and 3-Machine Case Studies," in TENCON 2008—2008 IEEE Region 10 Conference, Nov. 2008, pp. 1-6.
H. Saadat, Power System Analysis. Chapter 6: Power Flow Analysis, pp. 189-207; Chapter 11: Stability, pp. 460-520; WCB/McGraw-Hill, 1999.
A.Y. Abdelaziz, M.R. Irving, M.M. Mansour, A.M. El-Arabaty, and A.I.Nosseir "Adaptive detection of generator out-of-step conditions in power systems using an artificial neural network" UKACC International Conference on Control. Control '96, Sep. 2-5, 1996. Chung, H. Dept. of Electron. Eng., City Univ. of Hong Kong, "Design of feedback gain vector of two-state basic PWM multi feedback regulators for large-signal stability", IEEE Transactions on Circuits and Systems I: Fundamental Theory and Applications, Aug. 1997.
Walbridge, A.E. "Phase plane analysis for the optimal control of transients in a power system" Proceedings of the IEEE, Nov. 1970.
Shrestha, B., Gokaraju, R. and Sachdev, M.S. (2013). Out-of-Step Protection Using State Plane Trajectories Analysis, IEEE Transactions on Power Delivery, 28(2), Apr. 2013, 1083-1093.

Gokaraju, R. (2013). Fast Methods for Transient Stability Prediction in Power Systems: HIL Simulation Studies with RTDS, Conference Presentation, 2nd biennial RTDS User's Group Meeting, Centre for Advanced Power Systems, Florida State University, Tallahassee, FL, USA, May 7-9, 2013. Available online at: nayakcorp.com/RTDS-UGM-2013/Index.htm.
Shrestha, B., Sharma, P., Gokaraju, R. Out-of-Step Protection Using the Analysis of Electrical Power Vs Speed Deviation in State Plane, Panel Paper, IEEE Innovative Smart Grid Technologies Conference, Copenhagen, Denmark, Oct. 6-9, 2013. pp. 1-5.
Sharma, P., Gokaraju, R. (Jul. 2012). Transient stability Studies on Large Power Systems, 2012 IEEE Electrical Power Engineering Society General Meeting, San Diego, U.S.A. Jul. 22-26, Poster No. 5116.
Shrestha, B., Gokaraju, R. and Sachdev, M.S. (2011). Fast Out-of-Step Detection in Large Power Systems Using State Plane Analysis, IEEE PES General Meeting, Detroit, MN, U.S.A., Jul. 25-28, Poster No. 5082.
Aylett, P.D., The Energy-Integral Criterion of Transient Stability Limits of Power Systems, The Institution of Electrical Engineers, Monograph No. 308 S, Jul. 1958 pp. 527-536.
J. Mooney and N. Fischer, "Application guidelines for power swing detection on transmission systems," in Power Systems Conference: Advanced Metering, Protection, Control, Communication, and Distributed Resources, Clemson, South Carolina, Mar. 2006, pp. 159-168.
"Power swing and out-of-step considerations on transmission lines," IEEE PERC WG D6, Jun. 2005.
J.M. Haner, T.D. Laughlin, and C. W. Taylor, "Experience with the R-Rdot Out-of-Step relay," IEEE Transactions on Power Systems, vol. PWRD-1, No. 2, Apr. 1986, p. 35-39.
D. Hou, G. Benmouyal, and D. Tziouvaras, "Zero-setting power-swing blocking protection," IEE Conference Publications, vol. 2005, No. CP508, pp. 249-254, 2005. [Online]. Available: link.aip.org/link/abstract/IEECPS/v2005/iCP508/p249/s1.
S. Jiang, U. Annakkage, and A. Gole, "A platform for validation of FACTS models," Power Delivery, IEEE Transactions on, vol. 21, No. 1, pp. 484-491, Jan. 2006.
F. Plumptre, S. Brettschneider, A. Hiebert, M. Thompson, and M. Mynam, "Validation of out-of-step protection with a real time digital simulator," presented at the 60th Annu. Georgia Tech Protect. Relay. Conf., Atlanta, GA. May 2006.
C. Taylor, J. Haner, L. Hill. W. Mittelstadt, and R. Cresap, "A new out-of-step relay with rate of change of apparent resistance augmentation," IEEE Trans. Power App. Syst., vol. PAS-102, No. 3, pp. 631-639, Mar. 1983.
E. Farantatos, R. Huang, G.J. Cokkinides, and A.P. Meliopoulos, "A predictive out of step protection scheme based on PMU enabled dynamic state estimation," presented at the IEEE Power Energy Soc. Gen. Meeting, San Diego, CA, 2011.
Y. Xue, T. Van Custem, and M. Ribbens-Pavella, "Extended equal area criterion justifications, generalizations, applications," IEEE Trans. Power Syst., vol. 4, No. 1, pp. 44-52, Feb. 1989.
V. Centeno, A. Phadke, A. Edris, J. Benton, M. Gaudi, and G. Michel, "An Adaptive out-of-step relay," IEEE Trans. Power Del., vol. 12, No. 1, pp. 61-71, Jan. 1997.
W. Rebizant and K. Feser, "Fuzzy logic application to out-of-step protection of generators," in Proc. IEEE Power Eng. Soc. Summer Meet., 2001, vol. 2, pp. 927-932.
A. Abdelaziz, M. Irving, M. Mansour, A. El-Arabaty, and A. Nossier, "Adaptive protection strategies for detecting power system out-of-step conditions using neural networks," Proc. Inst. Elect. Eng., Gen., Transm. Distrib., vol. 145, No. 4, pp. 387-394, Jul. 1998.
A. D. Rajapske, F. Gomez, K. Nanayakkara, P. A. Crossley, and V. V. Terzija, "Rotor angle instability prediction using post-disturbance voltage trajectories," IEEE Trans. Power Syst., vol. 25, No. 2, pp. 947-956, May 2010.
K.H. So, J.Y. Heo, C.H. Kim, R.K. Aggarwal, and K. B. Song, "Out-of-step detection algorithm using frequency deviation of voltage," IET Gen. Transm. Distrib., vol. 1, No. 1, pp. 119-126, 2007.
L. Wang and A. Girgis, "A new method for power system transient instability detection," IEEE Trans. Power Del., vol. 12, No. 3, pp. 1082-1089, Jul. 1997.

(56) References Cited

OTHER PUBLICATIONS

S. Paudyal, G. Ramakrishna, and M. S. Sachdev, "Application of equal area criterion conditions in the time domain for out-of-stop protection," IEEE Trans. Power Del., vol. 25, No. 2, pp. 600-609, Apr. 2010.
S. H. Zak, Systems and Control, Chapter 2: Analysis of Modeling Equations, A. S. Sedra, Ed. New York: Oxford Univ. Press, 2003, pp. 48-54.
M. Pavella, D. Ernst and D. Ruiz-Vega, Transient Stability of Power Systems. Chapter 2—Introduction to SIME, A Unified Approach to Assessment and Control. Norwell, MA: Kluwer Academic Publishers, 2000, pp. 55-61.
H-D Chiang, Direct Methods for Stability Analysis of Electric Power Systems. Theoretical Foundation, BCU Methodologies, and Applications, Chapter 3: Lyapunov Stability and Stability Regions of Nonlinear Dynamical Systems, Hoboken, NJ: Wiley, 2011, pp. 29-47, 50.
J. Machowski, J. W. Bialek and J. R. Bumby, Power System Dynamics: Stability and Control, Second Edition. Chapter 6—Electromechanical Dynamics—Large Disturbances, Hoboken, NJ: John Wiley & Sons, Ltd., 2008, pp. 207-237.
E. J. S. Pires de Souza and A. M. Leite da Silva, "An efficient methodology for coherency-based dynamic equivalents [power system analysis]," Proc. Inst. Elect. Eng., Gen., Transm. Distrib. C. vol. 139, No. 5, pp. 371-382, Sep. 1992.
R. Podmore, "Identification of coherent generators for dynamic equivalents," IEEE Trans. Power. App. Syst., vol. PAS-97, No. 4. pp. 1344-1354, Jul. 1978.
P. Kundur, Power System Stability and Control. The EPRI Power System Engineering Series. Chapter 2: Introduction to the Power System Stability Problem, pp. 17-41; Chapter 13: Transient Stability, pp. 827-958, New York: TATA McGraw-Hill, 2004.
W.D. Stevenson, Jr., Elements of Power System Analysis, 4th Ed. New York: McGraw-Hill, 1982, pp. 390-421.
J. Casazza and F. Delea, Understanding Electric Power Systems. An Overview of the Technology and the Marketplace. IEEE Press Understanding Science & Technology Series, John Wiley & Sons, New York, 2003, pp. 29, 38-40.
J. L. Blackburn and T. J. Domin, Protective Relaying Principles and Applications, 3rd ed. Chapter 14: Stability, Reclosing, Load Shedding, and Trip Circuit Design, CRC Press, Taylor & Francis Group, 2007, pp. 511-528.
S. H. Horowitz and A. G. Phadke, Power System Relaying, 3rd ed. John Wiley & Sons, New York, 2008, pp. 23-48, 180, 243-253, 268-272.
D. Novosel, G. Bartok, G. Henneberg, P. Mysore, D. Tziouvaras, and S. Ward, "IEEE PSRC Report on Performance of Relaying During Wide-Area Stressed Conditions," IEEE Transactions on Power Delivery, vol. 25, No. 1, pp. 3-16, Jan. 2010.
A. G. Phadke and J. S. Thorp, Computer Relaying for Power Systems, 2nd ed. John Wiley & Sons, New York, 2009, pp. 25-54, 189-212, 285-291.
M. G. Adamiak, A. P. Apostolov, M. M. Begovic, C. F. Henville, K. E. Martin, G. L. Michel, A. G. Phadke, and J. S. Thorp, "Wide area protection-technology and infrastructures," IEEE Transactions on Power Delivery, vol. 21. No. 2, pp. 601-609, 2006.
P. Kundur, J. Paserba, V. Ajjarapu, G. Anderson, A. Bose, C. Canizares, N. Hatziargyriou, D. Hill, A. Stankovic, C. Taylor, T. Van Cutsem, and V. Vittal, "Definition and classification of power system stability IEEE/CIGRE joint task force on stability terms and definitions," IEEE Transactions on Power Systems, vol. 19, No. 3, pp. 1387-1401, Aug. 2004.
S. Paudyal, "Out-of-step protection using energy equilibrium criterion in the time domain," Master's thesis, University of Saskatchewan, 2008.
V. Madani, D. Novosel, S. Horowitz, M. Adamiak, J. Amantegui, D. Karlsson, S. Imai, and A. Apostolov, "IEEE PSRC Report on Global Industry Experiences with System Integrity Protection Schemes (SIPS)," IEEE Transactions on Power Delivery, pp. 2143-2155, 2010.
Network Protection and Automation Guide. Chapter 11, Distance Protection, Areva, Jul. 2002, pp. 171-191.
A. A. Fouad and V. Vittal, Power System Transient Stability Analysis Using Transient Energy Function Method. Chapter 1: Power System Transient Stability pp. 1-9; Chapter 3: Transient Stability Analysis Using Energy Functions—An Introduction, pp. 25-41, Prentice-Hall, Inc., 1992.
M. Bozchalui and M. Sanaye-Pasand, "Out of Step Relaying Using Phasor Measurement Unit and Equal Area Criterion," in Power India Conference, 2006 IEEE.
D. A. Tziouvaras and D. Hou, "Out-of-step protection fundamentals and advancements," in Proc. 57th Annual Conf Protective Relay Engineers for, 2004, pp. 282-307.
C. A. Gross, Electric Power Engineering Handbook, Second Edition, Power Systems, Chapter 4: Fault Analysis in Power Systems, L.L. Grigsby, Ed., CRC Press, Taylor & Francis Group, 2007, pp. 4-1-4-17.
K. R. Padiyar and S. Krishna, "Online Detection of Loss of Synchronism Using Energy Function Criterion," IEEE Transactions on Power Delivery, vol. 21, No. 1, pp. 46-55, 2006.
J. Berdy, Application of Out-of-Step Blocking and Tripping Relays, General Electric Company, downloaded from //store.gedigitalenergy.com/faq/Documents/Alps/GER-3180.pdf on Aug. 8, 2014.
G. Ziegler, Numerical Distance Protection: Principles and Applications, Chapter 3: Mode of Operation (pp. 48-52) Chapter 5: Application (pp. 189-193), B. Siemens Aktiengesellschaft and Munchen, Eds. Publicis Corporate Publishing, Erlangen, 2008.
Schweitzer Engineering Laboratories, Inc., SEL-421 Relay, Instruction manual, User's Guide, Protection and Automation System, Jan. 2005.—Section 1:Protection Functions\Out of step logic R.1.43).
REL 531*2.3, ABB, Application Manual, High speed line distance protection terminal, Document No: IMRK 506 107-UEN, Issued: Jun. 2003, Revision A.—Chapter 4\Section 5,6 and 7.
RTDS Manuals, RTDS Technologies Inc., Winnipeg, Canada.—Chapter 2 and Chapter 3B.
ADSP-BF533 Blackfin Processor Hardware Reference, Revision 3.3, Sep. 2008.—Chapter 1.

\* cited by examiner

APPARATUS AND METHOD FOR OUT-OF-STEP PROTECTION USING THE ANALYSIS OF TRAJECTORIES OF ELECTRICAL MEASUREMENTS IN STATE PLANE

CROSS REFERENCE TO RELATED APPLICATIONS

This application claims the benefit of U.S. Provisional Patent Application No. 61/675,005, filed Jul. 24, 2012; the entire contents of which are hereby incorporated by reference.

FIELD

The various embodiments described herein generally relate to devices and associated methods for providing out-of-step protection or transient stability prediction for various systems and devices in power systems.

BACKGROUND

The generators and loads in an electrical power network are often located far apart from one another and are connected through distribution units and a transmission network. The generators operate in parallel to continuously supply the loads. The interconnections between multiple generators, networks and loads have multiplied the complexity to solve the engineering problems in a power system. The generators generate electrical energy from other forms of energy such as coal, hydro, wind or fossil fuel, which are interconnected through networks of transmission lines called an electric grid. The transmission network transmits the bulk amount of generated energy from one location to another location at higher voltage levels. The distribution units distribute the energy to the consumers at lower voltage levels.

The electrical energy balance between generation and consumption is important for power system operation. However, the consumption or the demand of electricity is usually random and the power system has no control over it. To accommodate these changes, the power system is equipped with power generation and flow control devices throughout the transmission network and the generators (such as an excitation system, governor, regulating transformers, etc.). These devices help to achieve the required operation of the power system by maintaining voltage, frequency and other system variables within the values defined by power generation standards.

Disturbances such as faults, load changes, generator input changes, line trip-outs and the like in a power system cause system variables to deviate from the normal values. The deviations due to small disturbances can be handled by control devices which bring them back to a normal condition. However, the control devices cannot handle changes due to large disturbances which lead the power system to an abnormal condition which may in turn lead to an unstable situation. For example, an imbalance between the input mechanical power and the output electrical power due to the disturbance causes generators in one region to run faster than the generators in another region. This results in angular separation between the rotors of these generators in these two regions, which keeps on increasing if the power system cannot absorb the kinetic energy corresponding to the rotor speed differences. If the angular separation exceeds 180 degrees, the generators in the two regions lose synchronization. This is called an Out-Of-Step, Pole-Slipping or transient instability condition. To deal with such a condition, out-of-step tripping needs to be initiated for selected breakers in the power system located on transmission lines or at the generator terminals. Out-of-step tripping is now receiving more attention because of the very large generators, long transmission lines that are connected to extra high voltage and ultra-high voltage circuits. However, the lower inertias and the higher reactances of the generators that are used today have reduced the stability limit of the power systems. Also more and more power is being transmitted on the lines, which has reduced the stability (or security margins of the system). Therefore, if the out-of-step condition is not identified in time, it initiates undesired tripping of transmission line relays, cascade outage of generators, and a wide area blackout, which has a severe technical, economic and social impact.

A power system is a complex dynamic system with multiple generators, loads, motors and other fast-acting power electronic units which together form a highly non-linear system, where each unit has different characteristics and responses. All of the dynamic units have to be steady state stable in order to ensure the steady operation of the whole power system. The power system is stable if it can absorb any excess energy developed due to disturbances, and return to the previous stable state or to a new stable operating state. However, when a disturbance happens, the power system might suffer from different forms of stability issues, which are classified into three major areas: rotor angle stability, frequency stability and voltage stability. Further classification of power system stability is based on the strength of the disturbance and the time duration to be considered for the stability studies.

The power system disturbances are an abnormal situation that causes the power system state to move from its steady state equilibrium. Small disturbances such as continuous load changes result in small shifts in power system state from which the power system can recover. However, the large disturbances, such as faults, major line tripping, loss of generation or huge load changes, result in a large shift in the states of the power system and result in high oscillations in voltage and current throughout the power system. For example, in the case of a large disturbance, the power output from a synchronous machine starts fluctuating, which causes the rotor of the synchronous machine to accelerate and decelerate with respect to the stator circuit. As a result, the synchronous machine starts oscillating with other synchronous machines in the power system. If the power system has sufficient synchronizing and damping energy, the oscillations dampen out and settle to an equilibrium state in a finite time. This implies stable operation of the power system. However, in the case of the power system not being able to dampen the oscillations, an unstable situation arises from which the power system cannot return to a steady state and the generator rotor angles keep separating from each other resulting in the out-of-step condition. This is also referred to as loss of synchronism or rotor angle instability. If the out-of-step condition is not detected quickly, it can have a cascading effect, such as unnecessary tripping of other major lines, generator tripping and so on. The situation, therefore, demands a fast out-of-step protection strategy to be designed and implemented in the power system.

Power system protection consists of a system of entities that protect the power system components, such as generators, transformers, transmission lines, and the devices at the consumer level from the high system currents and voltages during or after a power system disturbance. The main function of the protection system is to ensure the prompt isolation of the power system components that might cause damage or otherwise interfere in the effective operation of the rest of the power system. The entities that provide protection (i.e. protective devices) mainly include instrument transformers (e.g. Current Transformers (CTs) and Potential Transformers (PTs)), protective relays, breakers and communication devices. Instrument transformers act as sensors which sense current and voltage and feed them to the protective relays. A protective relay acts as the brain of the protection system since it detects dangerous and intolerable situations in the power system via sensors and makes decisions using operating principles or past experiences to perform corrective action as soon as possible. The protective relay usually protects only a certain portion of the power system. Accordingly, the power system is divided into various overlapping sections called zones of protection which are each protected by a protective relay. A zone of protection is normally defined for a generator, transformer, substation, transmission line, distribution line or a motor. An edge of a zone of protection is defined by the CTs through which the associated protective relay sees (i.e. monitors) the power system inside the zone of protection. Communication devices can be used to establish continuous communication between two or more protective relays to ensure a coordinated operation of the whole protection system.

SUMMARY OF VARIOUS EMBODIMENTS

In one aspect, in at least one embodiment described herein, there is provided a method for predicting an out-of-step condition in a power system due to a disturbance, such as a fault, said power system comprising a power generator. The method comprises determining values for a state plane trajectory for the power generator during the disturbance based on using an internal voltage angle ($\delta$) of the power generator and a during fault rotor speed ($\omega_1$) of the power generator as state variables; determining time scale values based on values of $\delta$ and $\omega_1$ during the disturbance; determining values for a critical state plane trajectory for the power generator after clearing the fault to obtain values for a post fault critical rotor speed ($\omega_{2cl}$) with respect to $\delta$; determining values for a state plane trajectory for the power generator after clearing the fault to obtain values for a post fault rotor speed ($w_2$) with respect to $\delta$; determining a critical clearing angle ($\delta_{cr}$) and a critical clearing time ($t_{cr}$) that occur when a difference between the post fault rotor speed ($w_2$) and the post fault critical rotor speed ($\omega_{2cl}$) is at a minimum; and predicting that the power generator will be stable after the fault is cleared when a time to clear the fault ($t_{cl}$) is less than the critical clearing time ($t_{cr}$) or predicting that the power generator will be unstable after the fault is cleared if $t_{cl}$ is greater than $t_{cr}$.

In at least one embodiment, values for $\omega_1$ are obtained according to $\omega_1 = \pm\sqrt{2(P_1(\delta-\delta_0)+\cos\delta-\cos\delta_0)}$, where $P_1$ is $P_m/P_{max}$, $P_m$ is an output power of the power generator, $P_{max}$ is a maximum electrical power of the power generator and $\delta_0$ is an initial internal voltage angle of the power generator when the fault occurs.

In at least one embodiment, the time scale values are determined based on consecutive values of $\delta$ and $\omega_1$ as well as a time factor ($TF_1$) during the disturbance defined according to $$TF_1 = \sqrt{\frac{180*M}{\pi*P_{maxdf}}}$$

where $P_{maxdf}$ is a maximum power that can be transferred during the fault condition and M is an inertia constant of the power generator.

In at least one embodiment, the post fault critical rotor speed ($\omega_{2cl}$) is obtained according to $$\omega_{2cl} = \left(\frac{TF_1}{TF_2}\right)\omega_1$$

where $$TF_1 = \sqrt{\frac{180*M}{\pi*P_{maxdf}}},$$

$$TF_2 = \sqrt{\frac{180*M}{\pi*P_{maxaf}}},$$

$P_{maxdf}$ is a maximum power that can be transferred during the fault condition, $P_{maxaf}$ is a maximum power that can be transferred after the fault condition and M is an inertia constant of the power generator.

In at least one embodiment, the critical state plane trajectory is a separatrix separating stable state plane trajectories within the separatrix from unstable state plane trajectories outside of the separatrix.

In at least one embodiment, a model for the power generator is derived from a plurality of generators in a power system by separating the plurality of generators into first and second groups of generators to form a two machine power system; and converting the two machine power system into a single power generator.

In at least one embodiment, coherency analysis is used to separate the plurality of generators into the first and second groups of generators.

In at least one embodiment, the coherency analysis comprises forming a first group of generators by selecting a reference generator from the plurality of generators, determining a first change in generator voltage angle for a given generator and a second change in generator voltage angle for the reference generator, and assigning the given generator to the first group of generators if the first change is within a certain amount of the second change.

In at least one embodiment, a Single Machine Infinite Bus (SMIB) model is used to convert the two machine power system into a single power generator.

In at least one embodiment, a blocking signal is generated if the power generator is predicted to be stable after the fault is cleared and generating a trip signal if the power generator is predicted to be unstable after the fault is cleared.

In another aspect, in at least one embodiment described herein, there is provided a device for predicting an out-of-step condition in a power system due to a disturbance, such as a fault and the power system comprises a power generator. The device comprises an input for receiving information on voltage and current for the power generator; a processing unit coupled to the input for receiving the information and processing the information to: determine values for a state plane trajectory for the power generator during the disturbance based on using an internal voltage angle ($\delta$) of the power generator and a during fault rotor speed ($\omega_1$) of the power generator as state variables; determine time scale values based on values of $\delta$ and $\omega_1$ during the disturbance; determine values for a critical state plane trajectory for the power generator after clearing the fault to obtain values for a post fault critical rotor speed ($\omega_{2cl}$) with respect to δ; determine values for a state plane trajectory for the power generator after clearing the fault to obtain values for a post fault rotor speed ($w_2$) with respect to δ; determine a critical clearing angle ($\delta_{cr}$) and a critical clearing time ($t_{cr}$) that occur when a difference between the post fault rotor speed ($w_2$) and the post fault critical rotor speed ($\omega_{2cl}$) is at a minimum; and predict that the power generator will be stable after the fault is cleared when a time to clear the fault ($t_{cl}$) is less than the critical clearing time ($t_{cr}$) or predict that the power generator will be unstable after the fault is cleared if $t_{cl}$ is greater than $t_{cr}$; and an output coupled to the processing unit, the output providing an indication of whether the power generator will be stable or unstable after the fault is cleared.

In at least one embodiment, the device is one of a protective relay and a central control center for a power system.

In at least one embodiment, the processing unit comprises at least one processor, the at least one processor including a digital signal processor.

In another aspect, in at least one embodiment described herein, there is provided a method of a computer readable medium comprising a plurality of instructions executable on a microprocessor of an electronic device for adapting the electronic device to implement a method of predicting an out-of-step condition in a power system due to a disturbance, such as a fault, said power system comprising at least one power generator and wherein the method comprises: determining values for a state plane trajectory for the power generator during the disturbance based on using an internal voltage angle (δ) of the power generator and a during fault rotor speed ($\omega_1$) of the power generator as state variables; determining time scale values based on values of δ and $\omega_1$ during the disturbance; determining values for a critical state plane trajectory for the power generator after clearing the fault to obtain values for a post fault critical rotor speed ($\omega_{2cl}$) with respect to δ; determining values for a state plane trajectory for the power generator after clearing the fault to obtain values for a post fault rotor speed ($\omega_2$) with respect to δ; determining a critical clearing angle ($\delta_{cr}$) and a critical clearing time ($t_{cr}$) that occur when a difference between the post fault rotor speed ($\omega_2$) and the post fault critical rotor speed ($\omega_{2cl}$) is at a minimum; and predicting that the power generator will be stable after the fault is cleared when a time to clear the fault ($t_{cl}$) is less than the critical clearing time ($t_{cr}$) or predicting that the power generator will be unstable after the fault is cleared if $t_{cl}$ is greater than $t_{cr}$.

It should be noted that the term "out-of-step condition" in the power systems protection area and the term "transient instability condition" in power systems stability area are analogous conditions and both can be addressed by at least one of the various embodiments described herein for out-of-step protection. Accordingly, while the term "out-of-step condition" will be primarily used in the description, it can be substituted with the term "transient instability condition". Furthermore, while the embodiments described herein for out-of-step protection can be normally used in power system protection, at least one of these embodiments can also be used in a planning software package in the application of power systems stability.

It should also be noted that in at least one of the various embodiments described herein for out-of-step protection, the state plane trajectory can be determined for a power generator, an equivalent power generator, or a portion of a power system (which may be referred to as an "affected area" and may include at least one power generator or other components). Accordingly, the term "affected area of a power system" may be used to cover these different scenarios.

It should also be noted that in at least one of the various embodiments described herein for out-of-step protection, an internal voltage angle of a power generator, an internal voltage angle of an equivalent power generator, or a bus voltage angle of an affected area may be used. The term "voltage angle" may be used to cover off these different scenarios.

It should also be noted that at least one of the various embodiments described herein for out-of-state protection may be applied to more than one affected area and can be applied for situations in which there is at least one affected area with corresponding rotor speed(s)($\omega_{1 \ldots n}$).

Accordingly, in another aspect, in at least one embodiment described herein, there is provided a method for predicting an out-of-step condition or a transient instability condition in an affected area of a power system due to a disturbance, such as a fault, said power system comprising at least one power generator. The method comprises determining values for a state plane trajectory for the affected area during the disturbance based on using a voltage angle (δ) of the at least one power generator and during fault rotor speed(s) ($\omega_{1 \ldots n}$) of the at least one power generator as state variables; determining time scale values based on values of δ and $\omega_{1 \ldots n}$ during the disturbance; determining values for a critical state plane trajectory for the affected area after clearing the fault to obtain values for a post fault critical rotor speed ($w_{2d}$) with respect to δ; determining values for a state plane trajectory for the affected area after clearing the fault to obtain values for a post fault rotor speed ($w_2$) with respect to δ; determining a critical clearing angle ($\delta_r$) and a critical clearing time ($t_{cr}$) that occur when a difference between the post fault rotor speed ($w_2$) and the post fault critical rotor speed ($\omega_{2cl}$) is at a minimum; and predicting that the affected area will be stable after the fault is cleared when a time to clear the fault ($t_{cl}$) is less than the critical clearing time ($t_{cr}$) or predicting that the affected area will be unstable after the fault is cleared if $t_{cl}$ is greater than $t_{cr}$.

BRIEF DESCRIPTION OF THE DRAWINGS

For a better understanding of the various embodiments described herein, and to show more clearly how these various embodiments may be carried into effect, reference will be made, by way of example, to the accompanying drawings which show at least one example embodiment, and in which.

DETAILED DESCRIPTION OF THE EMBODIMENTS

Figure 1:
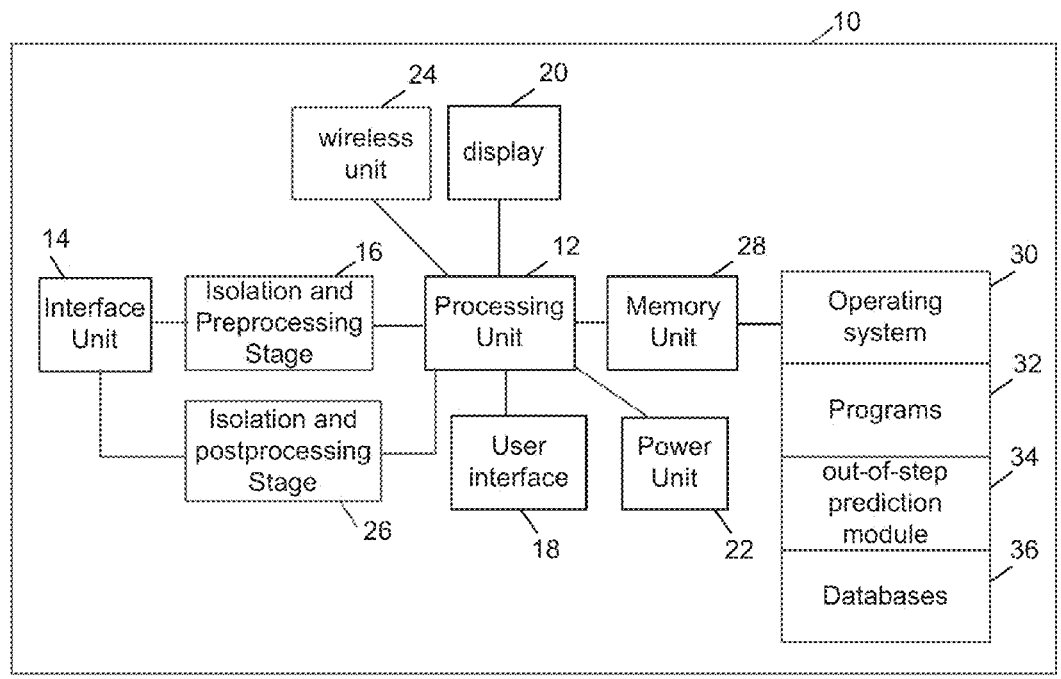
FIG. 1 is a block diagram of an example embodiment of a protective relay.

Various apparatuses or processes will be described below to provide an example of an embodiment of the claimed invention. No embodiment described below limits any claimed invention and any claimed invention may cover processes or apparatuses that differ from those described below. The claimed inventions are not limited to apparatuses or processes having all of the features of any one apparatus or process described below or to features common to multiple or all of the apparatuses or processes described below. It is possible that an apparatus or process described below is not an embodiment of any claimed invention. Any invention disclosed in an apparatus or process described below that is not claimed in this document may be the subject matter of another protective instrument, for example, a continuing patent application, and the applicants, inventors or owners do not intend to abandon, disclaim or dedicate to the public any such invention by its disclosure in this document.

Furthermore, it will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

It should be noted that the term "coupled" used herein indicates that two elements can be directly coupled to one another or coupled to one another through one or more intermediate elements. It should also be noted that the term coupled as used herein can have several different meanings depending on the context in which the term is used. For example, the term coupling can have a mechanical or electrical connotation. For example, in some contexts, the term coupling indicates that two elements or devices can be physically coupled to one another or coupled to one another through one or more intermediate elements or devices via a physical coupling, such as a wire, cable or transmission line, for example.

It should be noted that a generator is one type of machine. A synchronous motor can also be considered to be one type of machine. Therefore, the term machine is broader than the terms generator and synchronous motor. It should also be noted that faults are just one example of a disturbance and the SPA-based methods described herein can be performed for other types of disturbances (which are listed herein) by using the word "disturbance" rather than the word "fault" in the various steps and equations described herein.

Furthermore, in the following passages, different aspects of the embodiments are defined in more detail. Each aspect so defined may be combined with any other aspect or aspects unless clearly indicated to the contrary. In particular, any feature indicated as being preferred or advantageous may be combined with at least one other feature or features indicated as being preferred or advantageous.

It should be noted that terms of degree such as "substantially", "about" and "approximately" as used herein mean a reasonable amount of deviation of the modified term such that the end result is not significantly changed. These terms of degree should be construed as including a deviation of up to ±10% of the modified term if this deviation would not negate the meaning of the term it modifies.

Furthermore, the recitation of numerical ranges by endpoints herein includes all numbers and fractions subsumed within that range (e.g. 1 to 5 includes 1, 1.5, 2, 2.75, 3, 3.90, 4, and 5). It is also to be understood that all numbers and fractions thereof are presumed to be modified by the term "about." The term "about" means up to plus or minus 10% of the number to which reference is being made.

Various embodiments are described herein of devices and associated methods for providing out-of-step prediction and protection using the state-plane representation of a generator's speed and its power angle to predict rotor angle transient stability. Following the State Plane Analysis (SPA), the Critical Clearing Angle (CCA) is determined using the principle that the total energy of the power system at the instant the fault is cleared should be equal to the maximum potential energy of the power system during the post-fault condition. The Critical Clearing Time (CCT), corresponding to the time instant for the CCA, is obtained relatively simultaneously using the time calibration of the relative speed versus the power angle solution curve.

The various devices and associated methods described herein can be used to predict the first swing out-of-step condition in a Single Machine Infinite Bus (SMIB) system as well as larger power system configurations (e.g. two-area and IEEE 39-bus test systems) using system wide information. This involves representing the two generators with an SMIB equivalent system, and the state plane-based approach is then used on the SMIB equivalent system. For multi-machine systems, analysis can be performed, such as coherency analysis for example, to find out the two critical groups of generators. The critical generator groups are then represented with an SMIB equivalent system, and the state plane method can be applied to the SMIB equivalent system.

Electromagnetic transient simulations were carried out using PSCAD™ to test the out-of-step prediction methods described herein. PSCAD™ is a commercially available electromagnetic time domain simulation tool for analyzing power system transients. The simulation environment provides detailed transient models of the various power system components, and therefore gives an accurate representation of power system behavior under various operating conditions. The simulation studies showed that the methods described herein are computationally efficient as well as accurate even for the larger power systems, and do not require any offline studies. It has also been found for various test cases that the simultaneous determination of the CCA and the CCT allows for the faster prediction of stable and unstable states compared to conventional methods, such as the two-blinder scheme, the Equal Area Criterion (EAC) method, the rate of change of impedance method, the Swing Center Voltage (SCV) method, the transient energy calculation method, and the frequency deviation calculation from the voltage signal method discussed, for example.

It has been found that the SPA-based methods described herein allow for faster out-of-step protection and that the computation effort is significantly reduced. This is due in part to the ability of obtaining the CCT and the CCA simultaneously with the SPA-based methods described herein as well as the structure of the SPA-based methods which results in computational efficiency. Therefore, with the SPA-based methods described herein, the decision on the stability of a power element or a power system after a fault occurs can be made as soon as the fault is cleared. Since the prediction of an out-of-step condition is made faster with the SPA-based methods described herein, the power angle at the time of prediction may be about 90 to 120 degrees for an unstable swing. This is beneficial as the breaker voltage rating reduces as compared to that which is required for larger detection angles with the conventional methods. For the conventional methods listed above, the time of detection is closer to around 180 degrees.

The SPA-based methods described herein can be applied to a generator or as part of a network in a power system. This can be done by incorporating the SPA-based methods described herein as part of a protective relay, a central control centre or any other suitable device. For example, the SPA-based methods described herein may be used within power system security software. The SPA-based methods can be used in new protective relays or they can be used in existing protective relays.

1. Protective Relay

Modern protection schemes for power systems use multifunction relays that are digital or numerical and have communication capabilities. Digital relays typically provide low cost, fast performance, increased flexibility, a wider range of settings and greater accuracy when compared to mechanical relays. However, in some implementations, the limited computational power of the microprocessors used in digital relays results in longer operation time and also limits the number of protection functions that can be provided in the digital relay. Numerical relays overcome these limitations by using specialized digital signal processors and dedicated microprocessors as computational hardware. For example, the SEL 421 relay, manufactured by Schweitzer Engineering Laboratories Inc., is a numerical relay which encompasses 26 protection functions including auto-reclosing, synchronism check, communication interfaces, synchrophasor capabilities, etc. in a single unit.

Referring now to FIG. 1, shown therein is a block diagram of an example embodiment of a protective relay 10. The protective relay 10 comprises a processing unit 12, an interface unit 14, an isolation and preprocessing stage 16, a user interface 18, a display 20, a power unit 22, a wireless unit 24, an isolation and post-processing stage 26 and a memory unit 28. Some of these components can be optional in various embodiments such as, for example, the wireless unit 24, the display 18 and the user interface 20. The memory 28 stores software code for implementing an operating system 30, various programs 32, an out-of-step prediction module 34 and databases 36, which may be optional. The protective relay 10 is usually a standalone device with dedicated hardware and associated software and firmware that is configured to predict an out-of-step condition as described herein. However, in some cases it can be incorporated into a power control center for a power system.

The processing unit 12 controls the operation of the protective relay 10 and can be any suitable microprocessor, microcontroller or digital signal processor that can provide sufficient processing power. For example, the processing unit 12 may be an ADSP-BF533™ high performance general processor. In alternative embodiments, the processing unit 12 can include more than one processor. For example, one processor can be used to control the protective relay 10 while the other processor can be used for a dedicated task such as signal processing and out-of-step prediction. In alternative embodiments, specialized hardware can be used to provide some of the functions provided by the processing unit 10 such as filtering, for example.

The interface unit 14 can be any interface or communication port that allows the protective relay 10 to communicate with other devices or computers. In some cases, the interface unit 14 can include at least one of a serial port, a parallel port or a USB port that provides USB connectivity. The interface unit 14 may also include at least one of an Internet or local area network connection through an Ethernet, Firewire or modem connection or through a digital subscriber line. For example, the interface unit 14 may be used to implement a communication protocol to allow the protective relay 10 to be part of a SCADA system. Examples of communication ports include, but are not limited to, a MODBUS interface or an RS232/RS485 interface. Various combinations of these elements can be incorporated within the interface unit 14 in various embodiments.

The isolation and preprocessing stage 16 is used to protect the internal processing components of the protective relay 10 from any voltages or currents in the power system that may damage these components. The isolation and preprocessing stage 16 also includes components that are used to preprocess the input data so that it can be processed by the processing unit 14. The isolation and preprocessing stage 16 generally includes isolation elements such as voltage and current transformers, voltage and current reduction elements (such as a potentiometer), filters and an Analog to Digital Converter (ADC). The ADC may operate in the 0 to 5 V or 10 V range for unipolar operations and −5 to 5 V or −10 to +10 V range for bipolar operation. In some embodiments, the ADC may be part of the processing unit 12.

The protective relay 10 receives various types of information which includes current and voltage information about the portion of the power system that the protective relay 10 is monitoring for disturbances. The protective relay 10 typically receives this information via the interface unit 14; however, it may also receive some input data via the wireless unit 24. Since the protective relay 10 is connected to the power system to receive this information, the isolation elements are used to provide isolation from dangerous voltages or currents from the power system. For example, a voltage transformer can be used as an isolation element in order to reduce input voltage levels as well as provide electrical isolation to the rest of the relay equipment. Other elements can also be used for isolation such as a metal oxide varistor at an input of an isolation transformer to provide protection against large transients in the power system.

Since the current and voltage information are provided by instrument transformers, this information typically has a large magnitude that is not suitable for the processing unit 12. Accordingly, the isolation and preprocessing stage 16 includes components that can be used to scale down the input voltage and current information to a level that is suitable for use with the processing unit 12. In some cases, the isolation elements, such as transformers, can be used to provide at least a portion of this scaling. Further scaling can be provided by various other components such as a potentiometer, for example. In some embodiments, a current transformer can also be used to reduce the magnitude of input currents, and a resistor can be coupled to the secondary winding of the current transformer to convert the input current to a corresponding input voltage.

Filtering is used after isolation and scaling in order to avoid aliasing when the input data is sampled by the ADC. Low pass filters are used to accomplish this task as well as limit the effects of unwanted noise at higher frequencies. The amount of filtering that is needed depends on the nature of the tasks being performed by the protective relay 10. For example, a $3^{rd}$, $4^{th}$ or $5^{th}$ order filter with a cutoff frequency of around 90 Hz can be used since in practice the sampling frequency used in analog to digital conversion is on the order of 240 Hz. Higher cutoff frequencies can be used for filtering depending on the type of conditions that are to be detected by the protective relay 10.

In some embodiments, the isolation and preprocessing stage 16 may also downsample the input data before sending it to the processing unit 12 for processing. In an alternative embodiment, the isolation and preprocessing stage 16 may not provide a downsampling function while the processing unit 12 may downsample the input data prior to processing it. In another alternative embodiment, downsampling may not be used.

The user interface 18 allows an individual, such as a technician, to set certain parameters for the protective relay 10. Accordingly, the user interface 18 can include at least one of rotary dials, switches, buttons, slide switches, a keyboard, a touch screen, a thumbwheel, and the like depending on the particular implementation of the protective relay 10. In some cases, the user interface 18 may be optional if input to the protective relay 10 can be provided in some other fashion, such as through a data port.

The display 20 can be any suitable display that provides visual information depending on the configuration of the protective relay 10. For instance, the display 20 can be a monitor, an LCD display, a series of fights, instrumentation outputs and the like. The display 20 may be used to show relay settings, and real-time measurements of current/voltage in the power system protection zone corresponding to the protective relay 10. In some embodiments, the display 20 may also provide metering information if that is generated by the processing unit 12.

The power unit 22 can be any suitable device that provides power to the various components of the protective relay 10. For example, the power unit 22 may be a power supply, a power adaptor that is connected to a power supply, a rechargeable battery pack and the like depending on the implementation of the protective relay 10 as is known by those skilled in the art.

The wireless unit 24 is optional and can be a radio that communicates utilizing the CDMA, GSM, GPRS or Bluetooth protocol according to standards such as IEEE 802.11a, 802.11b, or 802.11g. The wireless unit 24 can therefore be used by the protective relay 10 to communicate with other protective relays or a control center for the power system, which can be used in various tasks, such as providing coordinated action when dealing with a large disturbance in the power system.

The isolation and post-processing stage 26 typically comprises a Digital to Analog Controller (DAC), scaling elements and isolation elements. Accordingly, the isolation and post-processing stage 26 receives output data from the processing unit 12, post-processes the data and then sends the post-processed data to the interface unit 14 or the wireless unit 24 depending on the nature of the output data. Scaling elements that can be used in the isolation and post-processing stage 26 include amplifiers and transformers. Isolation elements that can be used in the isolation and post-processing stage 26 include voltage transformers and current transformers.

The memory unit 28 can include RAM and flash memory elements as well as other storage elements such as disk drives, hard drives and ROM. The memory unit 28 is used to store an operating system 30 and various programs 32 as is commonly known by those skilled in the art. For instance, the operating system 30 and some of the programs 32 provide various basic operational processes for the protective relay 10. The programs 32 include various utility programs as well as user programs so that a user can interact with the protective relay 10 including running various diagnostic programs as well as downloading and sending data.

The memory unit 28 also stores the out-of-step prediction module 34 and one or more databases 36. The out-of-step prediction module 34 is generally used to predict whether a swing in the power system after a disturbance will be stable or unstable which is described in more detail below. In some embodiments, the out-of-step prediction module 34 may also be configured to provide an appropriate output signal to proactively deal with an unstable condition in the portion of the power system that is being monitored by the protective relay 10. For example, the output signal can be a trip or block signal that is sent to a breaker. The one or more databases 36 can be used to store data for various faults, the prediction made by the out-of-step prediction module 24 after these faults and how the power system behaved after these faults. The one or more databases 36 can also store other information required for the operation of the programs 32 or the operating system 28, such as dynamically linked libraries and the like.

In use, the processing unit 12 analyzes the input data provided to the ADC to determine the voltage and current of the protection zone that the protective relay 10 is monitoring. The protective relay 10 may analyze the data in various ways such as by using a phasor estimation algorithm to obtain the magnitude and the phase of the current and voltage in the protection zone. There are many different phasor estimation algorithms that may be used by the processing unit 12. For example, the processing unit 12 may use the Fourier Transform, or some variation or alternative thereof such as the least squares method, Kalman filtering, or some other spectral estimation method, and possibly some form of averaging to determine the magnitude and phase of the current and voltage in the protection zone of the power system. In some embodiments, the processing unit 12 may also use other algorithms such as waveform-model algorithms to determine at least one of the peak value of sinusoidal current for overcurrent protection, the fundamental frequency of voltage and current phasors for distance relaying, the magnitude of harmonics of current waveforms for transformer protection or the fundamental frequency of a periodic signal for frequency relays.

The processing unit 12 then monitors the magnitude and phase of the voltage and current in the protection zone to determine when a fault occurs. When a fault occurs, the processing unit 12 uses the out-of-step prediction module 34 to predict whether there will be a stable or unstable swing after the fault. If the swing will be stable after the fault occurs then it is preferable to avoid tripping any of the power system elements. However, if the swing will be unstable after the fault then the processing unit 12 generates an output signal that is sent to another component of the power system so that appropriate action can be taken to counteract the unstable swing. For example, the output signal can be used to trip at least one appropriate circuit breaker in the protection zone. Other possibilities include tripping tie lines, or sending appropriate signals to reduce mechanical power or to disconnect the generator. In order to do this, the processing unit 12 may require the status of the various circuit breakers in the protection zone.

In some embodiments, the processing unit 12 may also provide an event recording function in which information related to a fault event is recorded such as the key decisions that were made, the timing of those decisions, the resulting voltage and current magnitude and phase in the protection zone, and the like. This information can be recorded in the one or more databases 36 for later retrieval or may be sent in real-time to a central processing center for the power system.

In some embodiments, the processing unit 12 may also perform other tasks such as supporting communications, self-testing, providing a time clock function, distance protection, blockage of zone three distance relays due to power swing and various other tasks.

2. Real-Time Coherency and SMIB Equivalent System

2A. Real Time Coherency Determination

The generators in a coherent group oscillate together. Accordingly, a coherent group of generators can be identified by looking at the individual generator swing curves. A real time coherency method uses online measurements of generator bus voltage angles and compares the angles with respect to a reference generator voltage angle to determine the coherency among the generators during a post fault condition. Accordingly, the protective relay 10 measures generator bus voltage angle separation from a reference generator bus during every time step. The criterion to check whether the generator being monitored falls in a coherent group of generators is given by equation 1:

$$\Delta\theta_i - \Delta\theta_r \epsilon \qquad (1)$$

where $\epsilon$ is the specified tolerance in degrees, i represents the machine being analyzed for clustering (e.g. placing in a coherent group), and r represents the reference generator. Various values for the tolerance may be used such as 5 degrees, for example. This value can be chosen differently depending on the power system's transient response and the size of the generator. For example, for very large generators the tolerance value will be smaller. Alternatively, for very small generators the tolerance value will be larger. Any generator violating the criterion of equation 1 forms a new group.

2B. SMIB Equivalent System

The protective relay 10 approximates a multi-machine power system by using the classical model, where each generator is represented with a constant voltage source behind a transient reactance and each load is represented by a constant impedance. With the classical model, the generator dynamics are described by equation 2.

$$\dot{\delta}_i = \omega_i, \qquad (2)$$
$$M_i \frac{d\omega_i}{dt} = P_{mi} - P_{ei}$$

where $$P_{ei} = E_i^2 Y_{ii} \cos\theta_{ii} + \sum_{\substack{j=1 \\ j \neq i}}^{n} E_i E_j Y_{ij} \cos(\delta_i - \delta_j - \theta_{ij}) \qquad (3)$$

Figure 2:
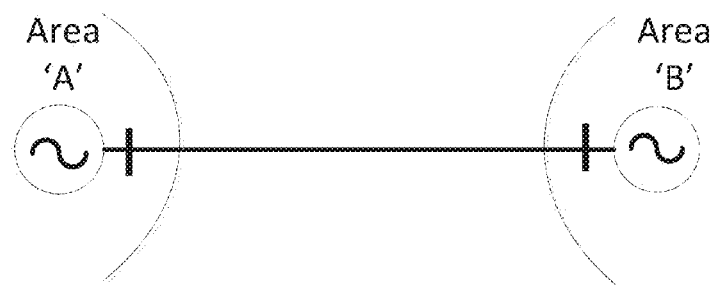
FIG. 2 is an illustration of a two machine representation.

$M_i$ is the inertia constant of $i^{th}$ generator
$\delta_i$ is the internal voltage angle of the $i^{th}$ generator
$\omega_i$ is the rotor speed of the $i^{th}$ generator
$P_{mi}$($P_{ei}$) is the mechanical input (electrical output) power of the $i^{th}$ generator
$E_i$, $E_j$ is the voltage behind transient reactance
Y is the admittance matrix reduced at an internal generator node
$Y_{ij}$=($\theta_{ij}$) is the modulus (argument) of the $ij^{th}$ element of Y Using the assumption that the disturbed multi-machine system separates in two groups, two groups of machines can be defined as an Area A and an Area B as shown in FIG. 2.

The partial COA of Area A and Area B are given by equations 4a, 4b, 4c and 4d.

$$\delta_a = \sum_{i \in A} \frac{M_i \delta_i}{M_a} \qquad (4a)$$

$$M_a = \sum_{i \in A} M_i \qquad (4b)$$

$$\delta_b = \sum_{j \in B} \frac{M_j \delta_j}{M_b} \qquad (4c)$$

$$M_b = \sum_{j \in B} M_j \qquad (4d)$$

where $\delta_a$ is the COA of the generators in Area A, $M_a$ is the sum of the inertia constants of the generators in Area A, $\delta_b$ is the COA of the generators in Area B, and $M_b$ is the sum of the inertia constants of the generators in Area B. The COA of a group is assumed to be equal to the rotor angles of the generators in that group, i.e.:

$$\delta_a = \delta_i \; \forall i \in A \qquad (5a)$$

$$\delta_b = \delta_j \; \forall j \in B \qquad (5a)$$

Using the above formulations, two groups of generators can be transformed into a two machine system running in its own partial center of angles (PCOA). The motion of PCOAs of Group A and Group B in a two machine system are described by equations 6a and 6b.

$$M_a \ddot{\delta}_a = \sum_{i \in A} (P_{mi} - P_{ei}) \qquad (6a)$$

$$M_b \ddot{\delta}_b = \sum_{j \in S} (P_{mj} - P_{ej}) \qquad (6b)$$

where $$P_{ei} = E_i^2 Y_{ii} \cos\theta_{ii} + E_i E_j Y_{ij} \cos(\delta_a - \delta_b - \theta_{ij}) + \sum_{\substack{i \in A \\ i \neq j}} E_i E_j Y_{ij} \cos\theta_{ij} \qquad (7)$$

$$P_{ej} = E_j^2 Y_{jj} \cos\theta_{jj} + E_j E_i Y_{ji} \cos(\delta_b - \delta_a - \theta_{ji}) + \sum_{\substack{j \in B \\ j \neq i}} E_j E_i Y_{ji} \cos\theta_{ji} \qquad (8)$$

The two machine system can further be reduced to an SMIB equivalent system with single machine parameters: $\delta$, w, M, $P_m$, $P_e$. The motion of the resulting SMIB equivalent system can be described using equation 9.

$$M\ddot{\delta} = P_m - (P_c + P_{max} \sin(\delta - \gamma)) \qquad (9)$$

where $$\delta = \delta_b - \delta_a \qquad (10a)$$

$$M = \frac{M_b M_a}{M_T} \qquad (10b)$$

$$M_T = \sum_{i=1}^{n} M_i \qquad (10c)$$

$$P_m = \left( M_a \sum_{j \in B} P_{mj} - M_b \sum_{i \in A} P_{mi} \right) M_T^{-1} \qquad (10d)$$

$$P_c = \left( M_a \sum_{j,k \in B} E_j E_k G_{jk} - M_b \sum_{i,l \in A} E_i E_l G_{il} \right) M_T^{-1} \qquad (10e)$$

$$P_{max} = \sqrt{C^2 + D^2} \qquad (10f)$$

$$\gamma = -\arctan\left(\frac{C}{D}\right) \qquad (10g)$$

$$C = (M_a - M_b) M_T^{-1} \sum_{i \in A, j \in B} E_i E_j G_{ij} \qquad (10h)$$

$$D = \sum_{i \in A, j \in B} E_i E_j B_{ij} \qquad (10i)$$

where $\delta$ and M are the rotor angle and inertia constant of the SMIB equivalent system respectively, $M_T$ is the sum of the inertia constants of n generators, n represents the total number of generators, $P_m$ and $P_e$ are the mechanical input power and electrical output power respectively of the SMIB equivalent system, and B and G are the susceptance and conductance of the network respectively.

2C. State Plane Analysis Applied to a Multi-Machine System

The proposed out-of-step prediction methods based on state plane analysis described herein can be used in a multi-machine system after the multi-machine system is represented with an SMIB equivalent system. Equation 9 representing the SMIB equivalent system can be written in a form given by equation 11, where $P_{mc}=P_m-P_c$ and $\beta=\delta-\gamma$.

$$M\ddot{\delta}=P_{mc}-P_{max}\sin\beta \tag{11}$$

Figure 3:
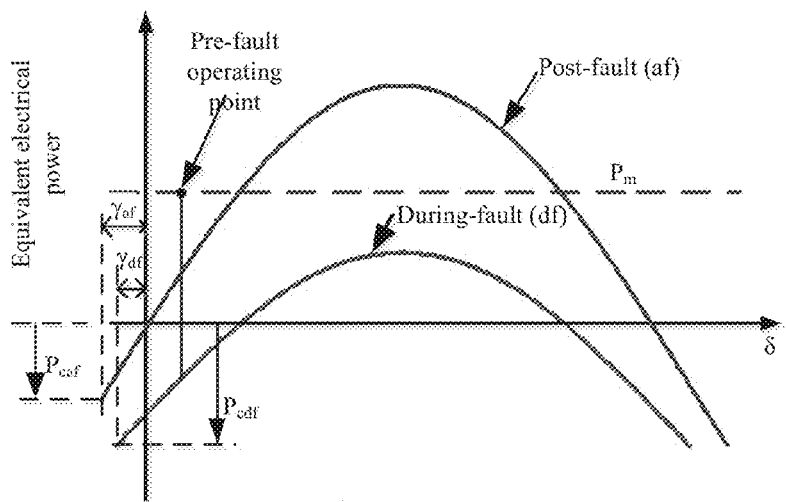
FIG. 3 is a plot of the Power-angle characteristics for an SMIB equivalent system.

FIG. 3 shows the power-angle characteristics of the during-fault and post-fault conditions for an SMIB equivalent system.

The SMIB equivalent technique uses the reduced bus admittance matrix of both the during-fault and after-fault conditions to calculate the SIMB equivalent system parameters as explained in section 2B. The network is reduced between the internal generator buses. The procedure for network admittance reduction is described in Appendix C.

3. State Plane Analysis
3A. Mathematical Formulation

Consider that a power system is described with the following second order differential equation:

$$\ddot{y}=f(y,\dot{y}) \tag{12}$$

then state variables can be defined as:

$$x_1=y \tag{13a}$$

$$x_2=\dot{y} \tag{13b}$$

Equation 12 can now be represented with a set of first order differential equations:

$$\dot{x}_1=x_2 \tag{14a}$$

$$\dot{x}_2=f(x_1,x_2) \tag{14b}$$

The plane, with coordinates $x_1$ and $x_2$ is called a state plane. The solution of equations 14a and 14b with respect to time could be represented as a curve in the state plane (i.e. state plane trajectory). If one knows the initial states of the power system, the dynamics followed by the power system during faults could be predicted using the state plane trajectory. Also, the state plane trajectories for different initial states could be represented in a graphical fashion to analyse the power system behaviour for various types of contingencies in the power system.

3B. Singular Points

Eliminating time from equations 14a and 14b gives:

$$\frac{dx_2}{dx_1}=\frac{f(x_1,x_2)}{x_2} \tag{15}$$

Equation 15 can be written as:

$$\frac{dx_2}{dx_1}=\frac{Q(x_1,x_2)}{P(x_1,x_2)} \tag{16}$$

The point for which the power system is going to be at rest, i.e. $P(x_{1s},x_{2s})=0$ and $Q(x_{1s},x_{2s})=0$, is a singular point. The power system will continuously stay at a singular point if it is left undisturbed. Hence, singular points represent points of equilibrium. Determination of singular points is a step in the process of plotting the state plane trajectories. Most linear systems consist only of one singular point, whereas highly nonlinear power systems have many singular points corresponding to many states of equilibrium. Accordingly, the stability status of the power system can be determined at these points. These points can either represent stable or unstable equilibrium. The stability around the singular points is found by linearizing the system at the singular points. State plane trajectories in general converge towards a stable equilibrium point and will diverge away from an unstable equilibrium point. The stable and unstable equilibrium points are called the vortex and the saddle, respectively.

3C. Determining Time from Trajectories

Figure 4:
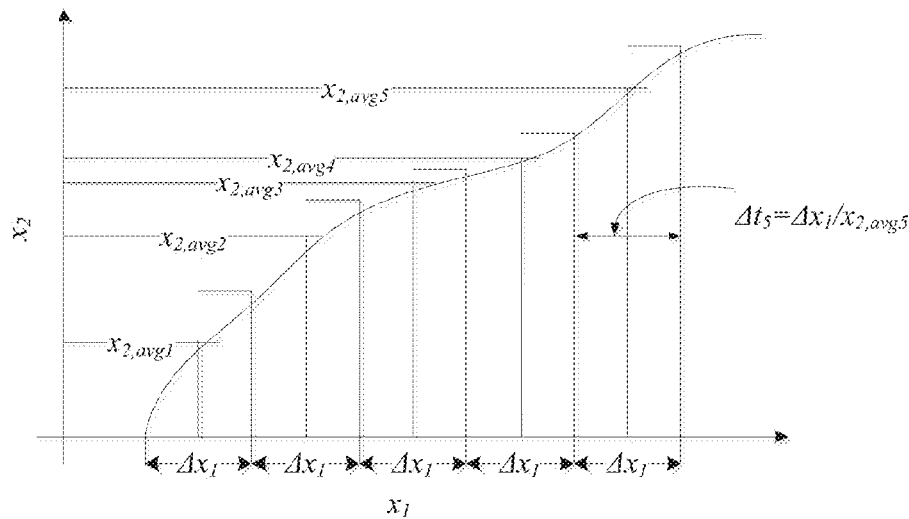
FIG. 4 shows an example of a time calculation from a state plane trajectory.

A state plane trajectory contains time information implicitly. The time information can be extracted from the trajectory by using the following procedure, State variable $x_1$ can be evenly or unevenly divided into small intervals. For each small increment of $x_1$, an average increment in $x_2$ can be calculated and the corresponding small increment in time can be calculated using equation 17a. In FIG. 4, $x_1$ is evenly divided into small intervals $\Delta x_1$. The small increment in time $\Delta t$ for $\Delta x_1$ and $x_{2,avg}$ corresponding to the $i^{th}$ interval is given by equation 17b.

$$dt=\frac{dx_1}{x_2} \tag{17a}$$

$$\Delta t_i=\frac{\Delta x_1}{x_{2,avgi}} \tag{17b}$$

Time for each interval point may be calculated by cumulatively adding the incremental time for each interval:

$$t(i)=t(i-1)+\Delta t_i \tag{18}$$

3D. Analysis of System Stability in State Plane

As explained before, the loss of synchronism in an interconnected system happens due to the separation of rotor angle of the machines with respect to one another. This may happen because of the inability of each generator to restore equilibrium between electromagnetic torque and mechanical torque. The stability behaviour of the power system has been analysed using a new State Plane Analysis (SPA) method which is explained in the following sections.

3E. Representing Machine Dynamics: Swing Equation

Figure 5:
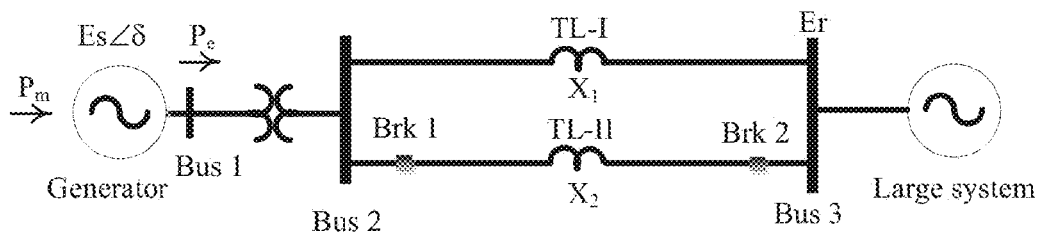
FIG. 5 is an illustration of a single machine connected to a large system.

Transient stability analysis of the power system involves solving of the classical swing shown in equation 19.

$$M\frac{d^2\delta}{dt^2}=P_m-P_e(\delta) \tag{19}$$

where M is the inertia constant, $\delta$ is the rotor angle of the generator, $P_m$ is the mechanical input power and $P_e$ is the electrical output power. For a single machine connected to a large system through a purely inductive transmission line, as shown in FIG. 5, electrical power output is given by equation 20a.

$$P_e(\delta)=\frac{E_s*E_r}{X}\sin\delta \tag{20a}$$

$$=P_{max}\sin\delta \tag{20b}$$

where X is the total impedance between the generator and the receiving ends and $P_{max}$ is the maximum possible electrical power transfer. The solution of the swing equation gives the dynamic behaviour of the power system during transient conditions. Under a steady state condition, there is equilibrium between the input mechanical power and the output electrical power, and hence the speed remains constant. Whenever the power system is perturbed, the equilibrium condition is violated and hence the machine accelerates or decelerates according to the swing equation. Consider a three phase fault on the transmission line TL-II of the power system shown in FIG. 5. Because of the fault, the transfer reactance of the faulted network increases, which decreases the electrical power transfer between the generator and the infinite bus (i.e. bus 3). As a result, the generator starts accelerating. The dynamic motion of the generator for the during-fault condition is given by equation 21.

$$M\frac{d^2\delta}{dt^2} = P_m - P_{edf}(\delta) \tag{21}$$

where $P_{edf}$ is the electrical power output during a disturbance.

When the fault is cleared by opening the breakers Brk1 and Brk2, the electrical power transfer increases as the transfer reactance is reduced from that of the during-fault condition. If the electrical power transfer for the post-fault condition is greater than the mechanical power, the generator starts decelerating. The dynamic motion of the system for the post-fault condition is given by equation 22.

$$M\frac{d^2\delta}{dt^2} = P_m - P_{eaf}(\delta) \tag{22}$$

where $P_{eaf}$ is the electrical power output after the disturbance is cleared. State plane analysis can be used to determine the solution of the swing equation as will now be discussed.

3F. State Plane Representation of Swing Equation

Substituting equation 20b into the swing equation 19 gives:

$$M\frac{d^2\delta}{dt^2} = P_m - P_{max}\sin\delta \tag{23}$$

Equation 23 could be modified as:

$$\frac{d^2\delta}{dT^2} = P - \sin\delta \tag{24}$$

where $$P = \frac{P_m}{P_{max}}, \quad T = t\sqrt{\frac{\pi * P_{max}}{180 * M}}$$

and $P_{max}$ is the maximum electrical power value that could flow through the lines. The state space representation of equation 24 is given by:

$$\dot\delta = \omega \tag{25a}$$

$$\dot\omega = P - \sin\delta \tag{25b}$$

where $\delta$ and $\omega$ are two state variables and $\omega$ represents the speed of the machine with respect to the synchronous speed. The two state variables give the current dynamic state of the machine. During a transient condition, the machine starts oscillating because of the change in P in equation 24. As a result, the state variables exhibit an oscillatory behaviour. The dynamic motion of the machine is hence represented by the change in the state variables of the power system, which can be demonstrated by plotting state variables $\omega$ versus $\delta$ in a state plane. The path followed by the state variable $\omega$ in a state plane with respect to $\delta$ gives important information about stability for synchronous machines. The angle $\delta$ gives the position of the rotor and the speed $\omega$ represents the energy associated with the machine. An increase in $\omega$ represents an increase in kinetic energy or a decrease in potential energy and vice-versa. The variation in the states of the state plane during a disturbance condition therefore mimics the variation in machine energy during a disturbance condition. Equations 25a and 25b can also be written as:

$$\frac{d\omega}{d\delta} = \frac{P - \sin\delta}{\omega} \tag{26}$$

The singular points of the system can be found by equating the numerator and the denominator of the right hand side of equation 26 to zero, i.e. p $\sin(\delta)$=0 and $\omega$=0. The singular points will be $(\sin^{-1} P, 0)$ and $(\pi - \sin^{-1} P, 0)$. The stability of the power system around these points can be determined by analyzing the eigenvalues of the power system, which may be done using Lyapunov's indirect method, for example. Using this analysis, the first point is found to be a stable equilibrium point and the second point is found to be an unstable equilibrium point. Equation 26 can be rearranged so that the same variables appear on one side:

$$\omega d\omega = (P - \sin\delta)d\delta \tag{27}$$

Integrating both sides of equation 27 gives:

$$\frac{\omega^2}{2} + \int_0^\delta (\sin\delta - P)d\delta = 0 \tag{28}$$

where the first term in the left hand side of equation 28 represents the kinetic energy of the machine and the second term represents the potential energy of the machine, Since the kinetic energy is zero at the singular point, it gives a maxima or minima of potential energy.

3G. State Plane Trajectories Obtained from the Swing Equation for Different Types of Disturbances Following a disturbance, the power system could continue to remain stable or become unstable. Sustained faults, if not cleared quickly, result in an unstable condition in a power system. To understand machine dynamics in the state plane under different fault conditions, consider a single machine connected to a large system as shown in FIG. 5. The system parameters are given in Appendix A. Under normal operating conditions, the power system operates at a stable equilibrium point delivering constant power output. Faults, such as a single phase to ground fault, a double phase to ground fault, and a three phase fault, are applied at the middle of transmission line II and are cleared by opening the breakers Brk1 and Brk2 at the two ends of the transmission line II. The operating conditions are referred to as a pre-fault condition, a during-fault condition and a post-fault condition. With the SMIB parameters as given in Appendix A and the initial state of the generator (0.738 rad, 0 rad/s), the state plane trajectories were plotted for the above conditions with randomly selected initial points. They are shown in FIGS. 6, 7, 8, 9 and 10 respectively. In the figures, the three different lines denote the following:

1. The dashed lines are isoclines plotted for different values of slopes varying from −5 to 5 with an equal interval of 0.5. All isoclines go through the singular points and hence the intersections of the isoclines give the singular points.
2. The black solid lines are the state plane trajectories.
3. The dotted line is a critical trajectory known as separatrix. The shaded area inside the separatrix is a stable region and the region outside the separatrix is an unstable region.

1) Pre-Fault Condition

Figure 6:
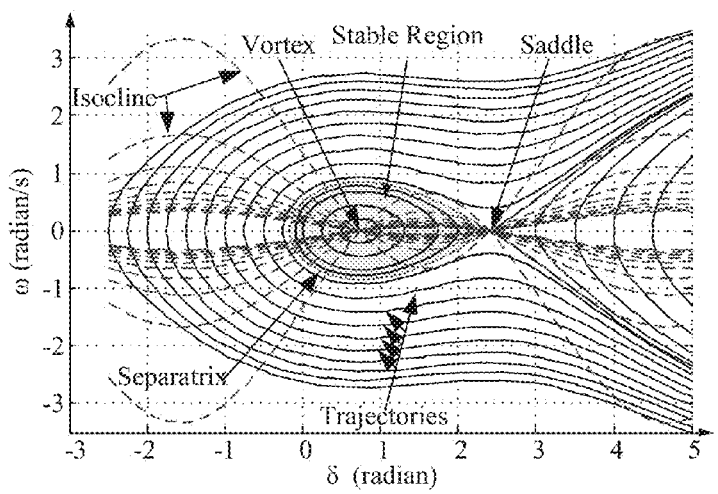
FIG. 6 is a plot of state plane trajectories of an SMIB equivalent system for a pre-fault condition.

For the power system in the pre-fault condition, the value of P is 0.673 p.u. ($P_{max}$ for the pre-fault condition is 1.3370 p.u.). FIG. 6 shows the various possible paths that the machine can follow during the pre-fault condition. Since the machine is operating at (0.738 rad, 0 rad/s), which is the vortex of the power system, the machine stays stable. The trajectories near the vortex are bounded around it and the region is a stable region. The trajectories around the saddle are unbounded (where ω increases as δ increases) and the region is called an unstable region. These two regions are separated by the separatrix.

2) During-Fault Condition a) Single Phase to Ground Fault

Figure 7:
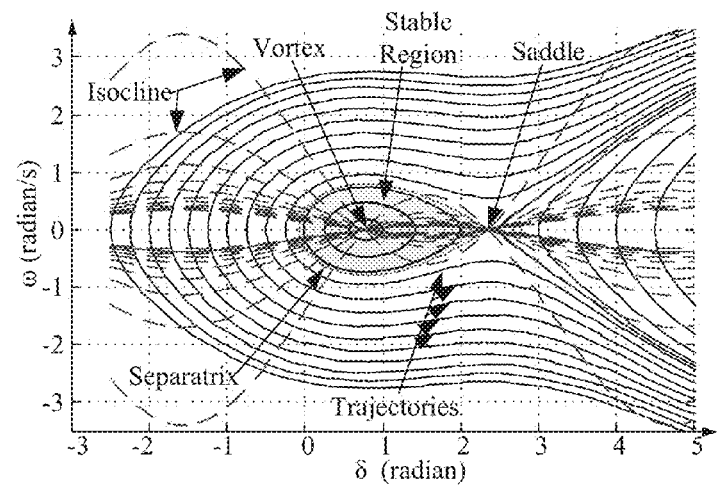
FIG. 7 is a plot of state plane trajectories of an SMIB equivalent system for a during-fault condition (single phase to ground fault)

The value of P for a single line to ground fault at the middle of the transmission line TL-II is 0.7 p.u. ($P_{max}$=1.2866 p.u.). The state plane trajectories for this fault condition are shown in FIG. 7. It is apparent from the trajectories that it has a stable region and an unstable region. Because of the fault, the machine starts oscillating along the trajectory from its initial state. The initial state decides which path the trajectory will follow during the fault, and the fault duration will determine the new state of the machine at the moment when the fault is cleared. Looking at the figures for the pre-fault condition (FIG. 6) and the during-fault condition (FIG. 7), it can be seen that the stable region for the during-fault condition is smaller than that for the pre-fault condition.

b) Double Phase to Ground Fault

Figure 8:
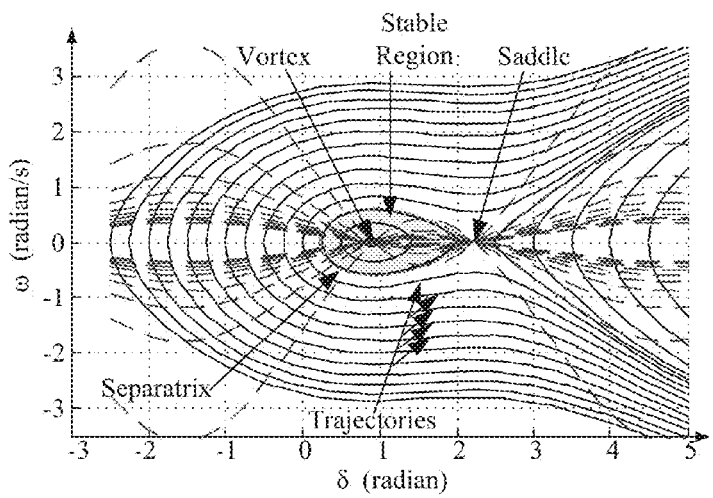
FIG. 8 is a plot of state plane trajectories of an SMIB equivalent system for a during-fault condition (double phase to ground fault)

For the double phase to ground fault condition, the value of P is 0.79 p.u. ($P_{max}$=1.1395 p.u.). FIG. 8 shows the state plane trajectories for a double phase to ground fault. The trajectories seems similar to that for a single phase to ground fault, but the stable region in this case is much smaller than that for the single phase to ground fault scenario. If the initial pre-fault state of the machine lies inside the stable region, the machine oscillations will be stable. If the initial pre-fault state of the machine lies in the unstable region, the trajectories become unbounded and the machine will become unstable.

c) Three Phase Fault

Figure 9:
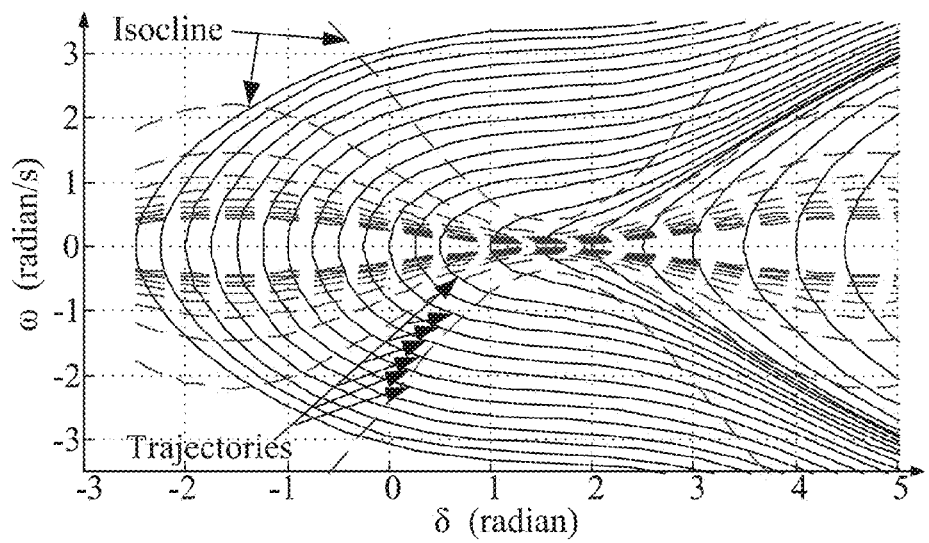
FIG. 9 is a plot of state plane trajectories of an SMIB equivalent system for a during-fault condition (three phase fault)

For the three phase fault condition, the value of P is 1.20 p.u. ($P_{max}$=0.7480 p.u.). FIG. 9 shows the state plane trajectories for a three phase fault. As can be seen from the trajectories, there are no singular points. This means that there is no stable region throughout the state plane and all of the trajectories are unbounded. This suggests that the fault must be cleared to prevent unstable operation.

3) Post-Fault Condition

Figure 10:
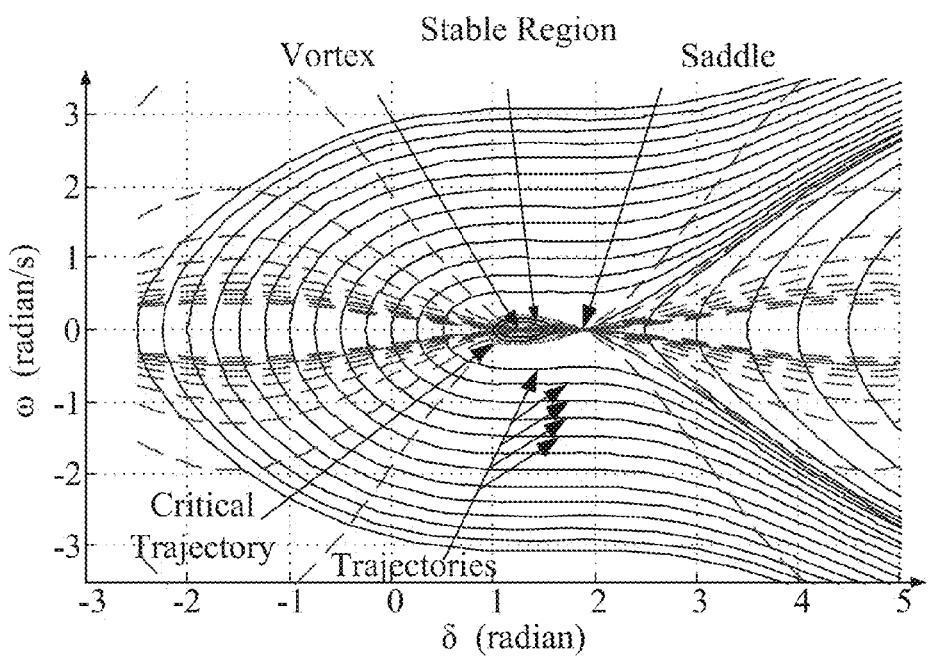
FIG. 10 is a plot of state plane trajectories of an SMIB equivalent system for a post-fault condition.

The fault is cleared by removing the faulted line from the power system of FIG. 5. The P value becomes 0.95 p.u. ($P_{max}$=1.1024 p.u.) and the post fault trajectories are shown in FIG. 10. The post-fault figure has a smaller stable region as compared to the pre-fault figure. If the states at the moment of clearing the fault lie inside the stable region, the machine remains stable. If the states at the instant of clearing the fault have reached a value beyond the separatrix, the machine is going to become unstable.

4. Out-of-Step Prediction Using State Plane Analysis

The state plane trajectory analysis technique explained in section 3G for assessing transient stability along with the time calculation technique from the state plane trajectory discussed in section 3C are used to develop a method to predict an out-of-step condition in a power system. The method determines the power system's critical clearing angle ($\delta_{cr}$) and the critical clearing time ($t_{cr}$) simultaneously using the state plane plots of the during-fault condition and the post-fault condition. The $t_{cr}$ that is determined is compared with the fault clearing time ($t_{cl}$) to make a decision as to whether the power system will be stable or unstable.

Figure 11:
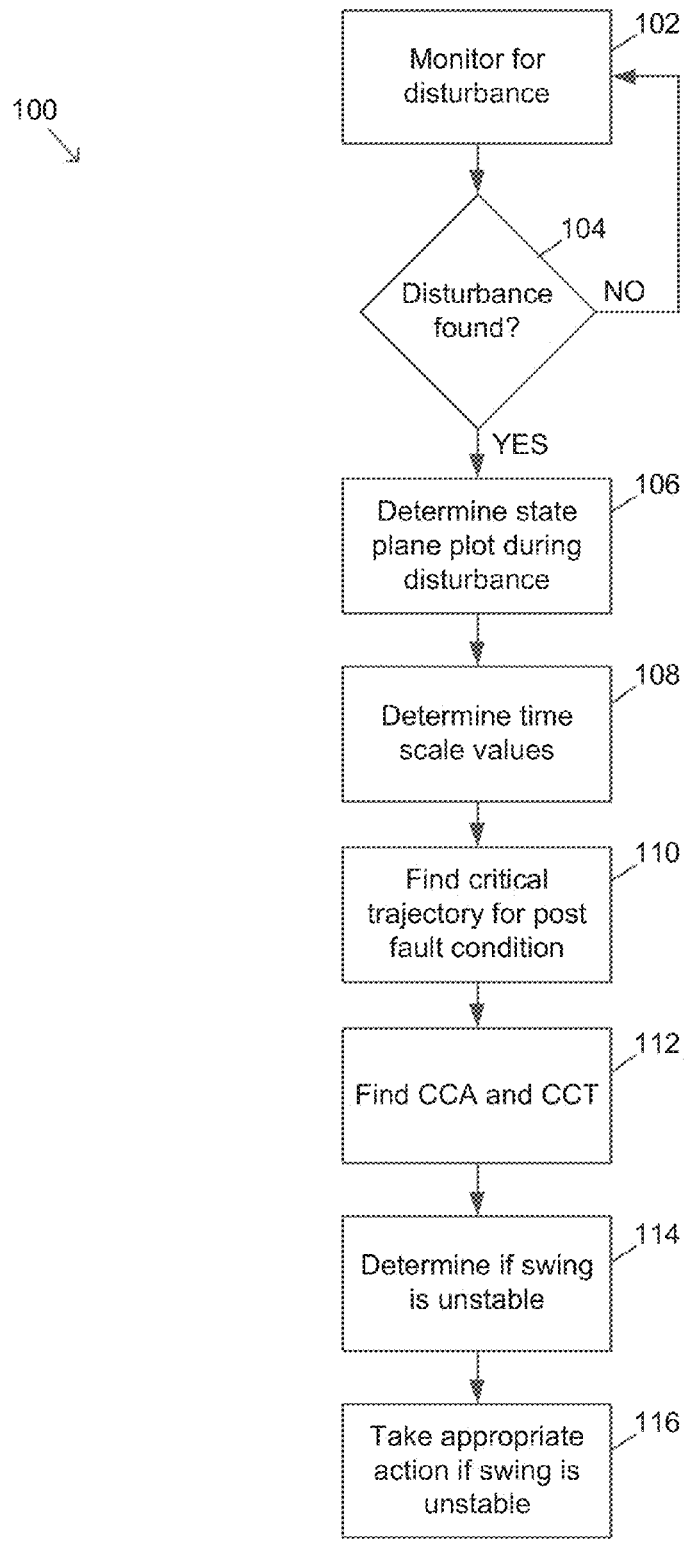
FIG. 11 is a flowchart of an example embodiment of an out-of-step prediction method.

Referring now to FIG. 11, shown therein is an example embodiment of an out-of-step prediction method 100. At 102, the power element or power system that requires protection by the protective relay 10 is being monitored for a disturbance. This can include monitoring the voltage and current of the power element or power system in a protection zone corresponding to the protective relay. At 104, the method 100 determines whether there is a disturbance. This can be done using different techniques and/or different thresholds. For example, if the magnitude of the voltage being monitored drops by 20%, then the method 100 determines that a fault is occurring. If a disturbance has been detected, then the method 100 moves to 106. If a disturbance has not been detected, then the method 100 continues to monitor for a disturbance.

At 106, the method 100 determines the state plate plot during the disturbance. This determination can be done as follows. Suppose the initial state is ($\delta_0$,0) and equation 26 is used to calculate ω for incremental values of δ. The derived expression for $\omega_1$ is given by equation 29 which gives the values of $\omega_1$ versus δ during a disturbance.

$$\omega_1 = \pm\sqrt{2(P_1(\delta-\delta_0)+\cos\delta-\cos\delta_0)} \quad (29)$$

where $\omega_1 = d\delta/dT_1$ is the speed of the machine and $P_1$ is the value of P for the during-fault condition.

The method 100 then proceeds to 108 where the method 100 determines the time scale values that correspond to the state plane plot that was obtained at 106. These time scale values may be calculated using the method described in section 3C. The calculated time is the time $T_1$ from which the exact time is calculated using equation 30.

$$t(i) = T_1(i) \times TF_1 \quad (30)$$

where $$TF_1 = \sqrt{\frac{180*M}{\pi*P_{maxdf}}} \quad (31)$$

where $P_{maxdf}$ refers to the maximum power that can be transferred for during-fault condition.

To illustrate the method, a three phase fault is applied on TL-II at $\frac{1}{4}^{th}$ distance from the bus 2 for the power system shown in FIG. 5. The test case is named as 'E'. The initial generator bus voltage angle ($\delta_t$) is 30 degrees and the initial voltage angle behind the transient reactance is 44.1803 degrees (0.7711 radian). The mechanical input power is 0.9486 p.u. For the faulted network condition, the power-angle characteristic is obtained using the standard YBUS network reduction technique. The $P_e$–δ curve obtained is 0.5661 sin δ. The $\omega_1$ and time (t) values calculated for the during-fault condition are given in Table I.

TABLE I

CALCULATION OF DURING-FAULT TRAJECTORY AND TIME SCALE

| δ (radian) | $\omega_1$ (radian/s) | Δδ (radian) | $\omega_{1avg}$ (radian/s) | ΔT (s) | Δt (s) | T (s) |
|---|---|---|---|---|---|---|
| 0.7711 | 0.0000 | | | | | 0.00 |
| 0.8025 | 0.2466 | 0.0314 | 0.1233 | 0.2548 | 0.0462 | 0.0462 |
| 0.8339 | 0.3467 | 0.0314 | 0.2966 | 0.1059 | 0.0192 | 0.0653 |
| 0.8653 | 0.4223 | 0.0314 | 0.3845 | 0.0817 | 0.0148 | 0.0801 |
| 0.8968 | 0.4849 | 0.0314 | 0.4536 | 0.0693 | 0.0125 | 0.0927 |
| 0.9282 | 0.5392 | 0.0314 | 0.5121 | 0.0614 | 0.0111 | 0.1038 |
| 0.9596 | 0.5875 | 0.0314 | 0.5633 | 0.0558 | 0.0101 | 0.1139 |
| 0.9910 | 0.6312 | 0.0314 | 0.6093 | 0.0516 | 0.0093 | 0.1232 |
| 1.0224 | 0.6713 | 0.0314 | 0.6512 | 0.0482 | 0.0087 | 0.1320 |
| 1.0538 | 0.7083 | 0.0314 | 0.6898 | 0.0455 | 0.0082 | 0.1402 |
| 1.0853 | 0.7429 | 0.0314 | 0.7256 | 0.0433 | 0.0078 | 0.1480 |
| 1.1167 | 0.7754 | 0.0314 | 0.7591 | 0.0414 | 0.0075 | 0.1555 |
| 1.1481 | 0.8060 | 0.0314 | 0.7907 | 0.0397 | 0.0072 | 0.1627 |
| 1.1795 | 0.8350 | 0.0314 | 0.8205 | 0.0383 | 0.0069 | 0.1697 |
| 1.2109 | 0.8626 | 0.0314 | 0.8488 | 0.0370 | 0.0067 | 0.1764 |
| 1.2423 | 0.8889 | 0.0314 | 0.8757 | 0.0359 | 0.0065 | 0.1829 |
| 1.2737 | 0.9142 | 0.0314 | 0.9015 | 0.0348 | 0.0063 | 0.1892 |
| 1.3052 | 0.9384 | 0.0314 | 0.9263 | 0.0339 | 0.0061 | 0.1953 |

Referring once again to FIG. 11, the method 100 proceeds to 110 where the method 100 determines the critical trajectory (i.e. separatrix) for the post-fault condition or in other words the method 100 determines the post-fault power-angle characteristic using the post-fault network condition. The power-angle characteristic for test case E is 1.1024 sin δ. The post-fault swing equation is given by equation 32.

$$\frac{d^2\delta}{dT_2^2} = P_2 - \sin\delta \tag{32}$$

$$\frac{d^2\delta}{dT_2^2} = 0.8604 - \sin\delta \tag{33}$$

The above equation can be put in the following form:

$$\frac{d\omega_2}{d\delta} = \frac{0.8604 - \sin\delta}{\omega_2} \tag{34}$$

where $\omega_2 = d\delta/dT_2$ and $P_2$ is the value of P for the post-fault condition.

The singularities for equation 34 are obtained by equating the numerator and denominator to zero. The singular points are located at (1.036, 0) and (2.105, 0). For the first singular point (1.036, 0), define translated states as $\tilde\delta = \delta - 1.036$ and $\tilde{w}_2 = w_2$. The corresponding state equation becomes:

$$\frac{d\tilde{w}_2}{d\tilde\delta} = \frac{0.8604 - \sin(\tilde\delta + 1.036)}{\omega_2} \tag{35}$$

which could also be written as:

$$\begin{bmatrix} \dot{\tilde\delta} \\ \dot{\tilde{w}_2} \end{bmatrix} = \begin{bmatrix} \omega_2 \\ 0.08604 - \sin(\tilde\delta + 1.036) \end{bmatrix} \tag{36}$$

Equation 36 is linearized around the point (0, 0). The linearized system is given by equation 37:

$$\begin{bmatrix} \dot{\tilde\delta} \\ \dot{\tilde{w}_2} \end{bmatrix} = \begin{bmatrix} 0 & 1 \\ -0.51 & 0 \end{bmatrix} \begin{bmatrix} \tilde\delta \\ \omega_2 \end{bmatrix} \tag{37}$$

The eigenvalues of the system are ±0.712i, which results in an oscillatory system with zero damping. This singular point corresponds to a vortex point. Following a similar procedure for the singular point (2.105, 0), the eigenvalues that are obtained are ±0.712. This will result in an unstable system and hence the singular point is a saddle point.

Equation 28 for the post-fault condition can be written as:

$$\frac{\omega_2^2}{2} + \int_0^\delta (\sin\delta - P_2)d\delta = 0 \tag{38}$$

Equation 38 can be written as:

$$\frac{\omega_{2cl}^2}{2} + \int_0^{\delta cl} (\sin\delta - P_2)d\delta = 0 \tag{39}$$

where $\delta_{cl}$ is the value of δ and $\omega_{2cl}$ is the speed of the machine, when the fault is cleared. The $\omega_{2cl}$ is given by equation 40.

$$\omega_{2cl} = \left(\frac{d\delta}{dT_2}\right)_{T_2=0} = \frac{dT_1}{dT_2}\frac{d\delta}{dT_1} = \left(\frac{TF_1}{TF_2}\right)\omega_1 \tag{40}$$

where $TF_1$ is given by equation 31 and $$TF_2 = \sqrt{\frac{180 * M}{\pi * P_{maxaf}}} \tag{41}$$

where $P_{maxaf}$ is the maximum possible power transfer for the post-fault condition. As discussed in section 3F, the potential energy $(V(\delta)=\int_0^\delta(\sin\delta - P_2)d\delta)$ of the machine will have a maximum and a minimum at the singular points. It can be seen by setting the first derivative of potential energy $$\left(\frac{dV}{d\delta}\right)$$

to zero which means $(\sin\delta - P_2 = 0)$. The second derivative of $V(\delta)$ is cos δ. For singular point $(\sin^{-1}P_2, 0)$, the second derivative is positive and therefore it results in a minimum, and for singular point $(\pi - \sin^{-1}P_2, 0)$ it is negative, resulting in a maximum.

Figure 12:
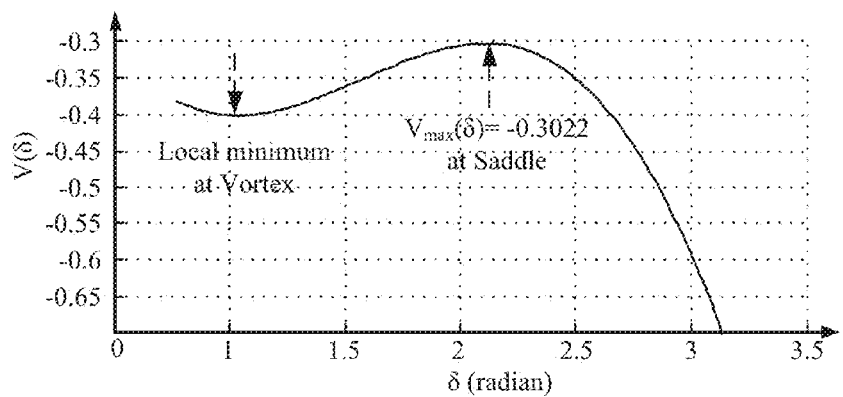
FIG. 12 is a plot of potential energy for test case E.

FIG. 12 shows the plot of potential energy for the test case E. The minimum potential energy occurs at a vortex point and the maximum potential energy $(V_{max})$ occurs at the saddle point. If the total energy (i.e. the sum of kinetic energy gained during the fault condition and the potential energy gained for the post-fault condition) of the machine is less than $V_{max}$ at the moment when the disturbance is cleared, the machine becomes stable. Otherwise, the machine becomes unstable.

Equation 38 can be written in the form given by equation 42. From equation 42, the state $\omega_2$ can be calculated, which is given by equation 43.

$$\frac{\omega_2^2}{2} + V(\delta) = E \qquad (42)$$

$$w_2 = \sqrt{2(E - V(\delta))} \qquad (43)$$

Figure 13:
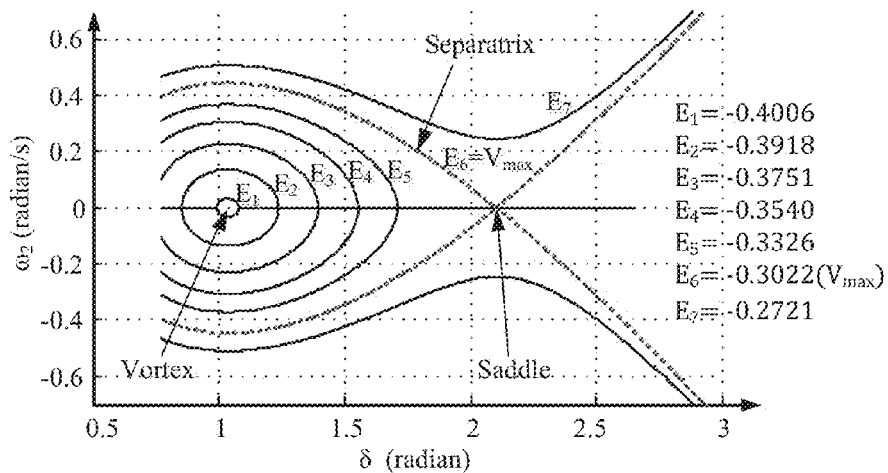
FIG. 13 is a plot of state plane trajectories of an SMIB equivalent system for a post-fault condition for different values of E.

For different values of total energy $E_i$ (where i=1, 2, ..., 7), state plane plots for $\omega_2$ are shown in FIG. 13. When the value of E becomes equal to $V_{max}$, the corresponding trajectory gives the separatrix. For (i=1, 2, ..., 5), $E_i$ is less than $V_{max}$, which means the power system is stable, while the total energy $E_7$ is greater than $V_{max}$, which indicates that the power system becomes unstable.

The method 100 then proceeds to 112 where the method 100 determines the CCA ($\delta_{cr}$) and the CCT ($t_{cr}$). Two techniques may be used for calculating the CCA of the power system. In the first technique, when the sum of the kinetic energy gained by the machine during the fault condition and the potential energy that can be gained by the machine for the after-fault condition is equal to the maximum potential energy ($V_{max}$), it gives the CCA ($\delta_{cr}$).

$$E = \frac{\omega_{2cl}^2}{2} + \int_0^{\delta cr} (\sin\delta - P_2) d\delta = V_{max} \qquad (44)$$

Figure 14:
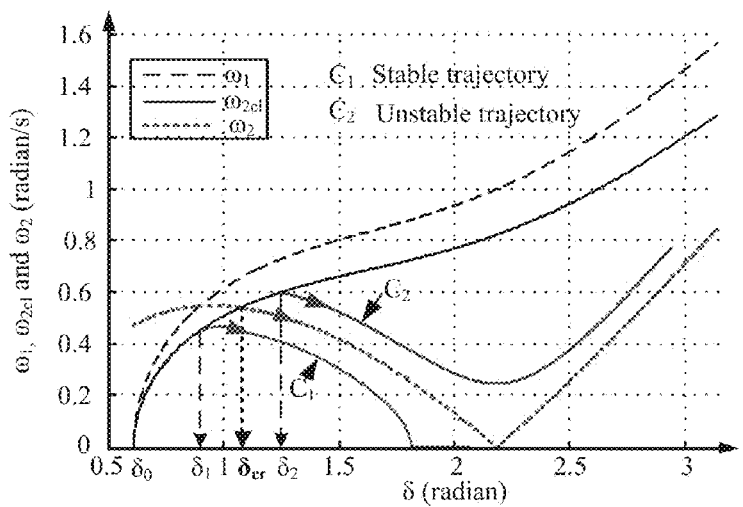
FIG. 14 shows an example of how to find critical clearing angle.

In the state plane plot shown in FIG. 14, starting from $\delta_0$, the $\omega_{2cl}$ represents the kinetic energy gained by the machine at the moment when the fault is cleared and the $\omega_2$ is the separatrix which represents the gain in potential energy by the machine after the fault condition. If the fault is cleared at angle $\delta_1$, the post-fault speed will follow curve $C_1$, which shows stable operation. At the point of intersection of these two plots, the sum of the gain in kinetic energy gained during the fault and the potential energy obtained after the fault will be equal. The point of intersection gives the critical clearing point and the corresponding angle will be the CCA ($\delta_{cr}$) as shown in FIG. 14. If the fault is cleared at angle $\delta_2$, the post-fault speed will follow curve C2 which leads to instability (since the speed keeps on increasing the machine becomes unstable). If the fault is not cleared from the power system due to a breaker failure, the speed will follow the during-fault trajectory ($\omega_1$) and the machine becomes unstable.

In the second technique, the point of intersection of $\omega_{2cl}$ and $\omega_2$ is found by calculating the absolute difference between $\omega_{2cl}$ and $\omega_2$. The minimum of this absolute difference gives the point of intersection. In at least one embodiment of the method 100, the second technique is used to determine the CCA.

Figure 15:
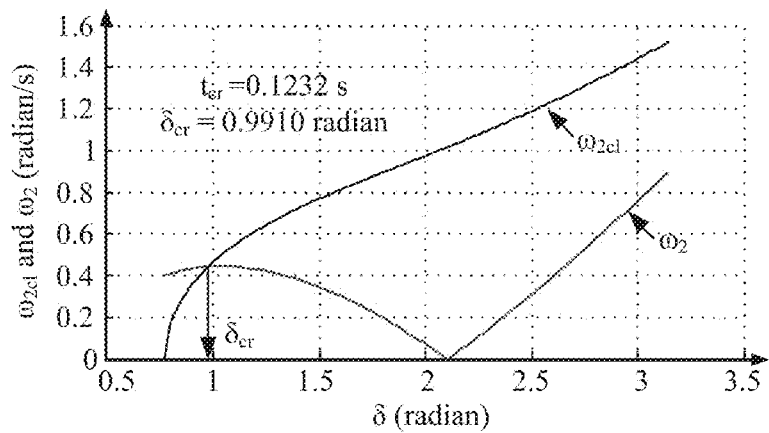
FIG. 15 shows an example of how to use state plane trajectories to find CCA and CCT for test case E.

The angle $\delta$, time scale (t), as well as $\omega_{2cl}$ and $\omega_2$ were calculated for test case E and are shown in Table II. The critical clearing time ($t_{cr}$) can be calculated using the time scale determined according to step 108. From Table II, the CCA was determined to be 0.9910 radians and the CCT was observed to be 0.1232 s. FIG. 15 demonstrates this procedure pictorially.

TABLE II

CALCULATION OF CCA AND CCT

| index | $\delta$ (radian) | t (s) | $\omega_{2cl}$ (radian/s) | $\omega_2$ (radian/s) | abs($\omega_{2cl} - \omega_2$) (radian/s) |
|---|---|---|---|---|---|
| 1 | 0.7711 | 0.0000 | 0.0000 | 0.3961 | 0.3961 |
| 2 | 0.8025 | 0.0462 | 0.1767 | 0.4080 | 0.2313 |
| 3 | 0.8339 | 0.0653 | 0.2485 | 0.4179 | 0.1695 |

TABLE II-continued

CALCULATION OF CCA AND CCT

| index | $\delta$ (radian) | t (s) | $\omega_{2cl}$ (radian/s) | $\omega_2$ (radian/s) | abs($\omega_{2cl} - \omega_2$) (radian/s) |
|---|---|---|---|---|---|
| 4 | 0.8653 | 0.0801 | 0.3026 | 0.4261 | 0.1235 |
| 5 | 0.8968 | 0.0927 | 0.3475 | 0.4326 | 0.0851 |
| 6 | 0.9282 | 0.1038 | 0.3864 | 0.4376 | 0.0512 |
| 7 | 0.9596 | 0.1139 | 0.4210 | 0.4412 | 0.0203 |
| 8 | 0.9910 | 0.1232 | 0.4523 | 0.4436 | 0.0088 |
| 9 | 1.0224 | 0.1320 | 0.4810 | 0.4447 | 0.0364 |
| 10 | 1.0538 | 0.1402 | 0.5076 | 0.4446 | 0.0630 |
| 11 | 1.0853 | 0.1480 | 0.5324 | 0.4434 | 0.0890 |
| 12 | 1.1167 | 0.1555 | 0.5556 | 0.4412 | 0.1144 |
| 13 | 1.1481 | 0.1627 | 0.5776 | 0.4380 | 0.1396 |
| 14 | 1.1795 | 0.1697 | 0.5983 | 0.4338 | 0.1645 |
| 15 | 1.2109 | 0.1764 | 0.6181 | 0.4288 | 0.1894 |
| 16 | 1.2423 | 0.1829 | 0.6370 | 0.4228 | 0.2142 |
| 17 | 1.2737 | 0.1892 | 0.6551 | 0.4160 | 0.2391 |
| 18 | 1.3052 | 0.1953 | 0.6725 | 0.4083 | 0.2641 |

The method 100 then proceeds to 114 where the method determines if the swing will be stable or unstable. Once the $t_{cr}$ and $t_{cl}$ are determined, this decision can be made based on the following logic:

If $t_{cr} > t_{cl}$: Stable swing

If $t_{cr} = t_{cl}$: Critical condition

If $t_{cr} < t_{cl}$: Unstable swing

The method 100 then proceeds to 116 where appropriate action is taken if the swing is unstable. Examples of appropriate action were given previously when the protective relay 10 was described in section 1. It should be noted that step 116 is optional as there may be cases in which the method 100 is used to determine if the swing will be stable and unstable and the result is provided to another method that acts on the prediction. If the swing is determined to be stable at 114, the method 100 generally proceeds to 102 to continue to monitor for disturbances.

5. Case Studies: Two Area System

Figure 16:
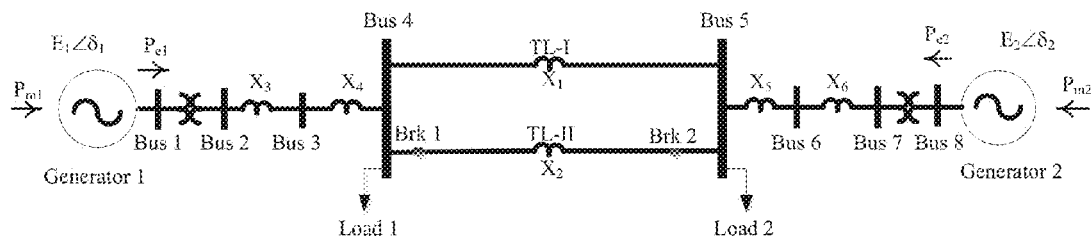
FIG. 16 is an illustration of an example embodiment of another two machine system.

In an electrical power network, two areas are interconnected through tie lines. The network should hold synchronism during both steady state and transient conditions. Transient instability in an area might lead to an angular separation between the interconnected areas, causing a loss of synchronism. To study the out-of-step conditions in an interconnected power system due to transient conditions, a two area power system model consisting of a machine with finite inertia in each area is considered for the transient stability study. FIG. 16 shows an example embodiment of a power system configuration. Parameters for the generators and the transmission line of the power system are given in Appendix A. The two area system studies are considered under different fault locations and fault durations to achieve various power swing conditions. Accordingly, the power system is tested for stable and unstable power swing conditions. The effectiveness of the out-of-step prediction method to predict such phenomena is determined in comparison with the conventional two blinder scheme.

5A. Test Procedure

The two machines under disturbed conditions form two groups oscillating with each other. The separation between the two areas can be identified by measuring angular deviation between the two machines. The identification of groups of machines was discussed previously and can be determined using coherency analysis. The two area system can then be transformed into an SMIB equivalent system using the procedure described in section 2B. The procedure predicts the power-angle characteristics of the SMIB equivalent system for the during-fault condition and the post-fault condition. Transient stability analysis using state plane analysis is then performed on the SMIB equivalent system to calculate the CCT. The calculated CCT gives the stability boundary for the two area system. The decision is hence made based on the decision criterion explained in section 4. The power system as shown in FIG. 16 is modeled in the PSCAD/EMTDC™ environment. A number of time domain simulations were performed to produce various stable, unstable and multi-swing unstable scenarios.

5B. Test Cases

The two area system is tested for various fault durations and two different fault locations. In case 1, a three phase fault was applied on the transmission line TL-II which was 50 km away from the bus 4 and the fault is cleared by opening the faulted transmission line between the bus 4 and the bus 5. For fault durations of 6 to 20 cycles, stable, unstable and multi-swing unstable cases were observed. In case 2, a three phase fault was applied on transmission line TL-II which was 75 km away from the bus 4 and was cleared by opening breakers Brk1 and Brk2. Fault duration was varied from 8 to 26 cycles to develop stable, unstable and multi-swing unstable cases. In all of the test cases, the prediction time was calculated from the time of fault inception.

1) Stable Swings

Figure 17:
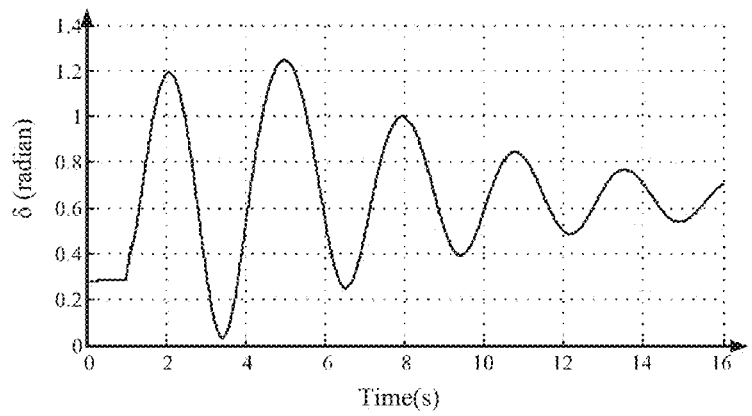
FIG. 17 shows an SMIB equivalent power angle plot for case 1 (a fault duration of 6 cycles)
Figure 18:
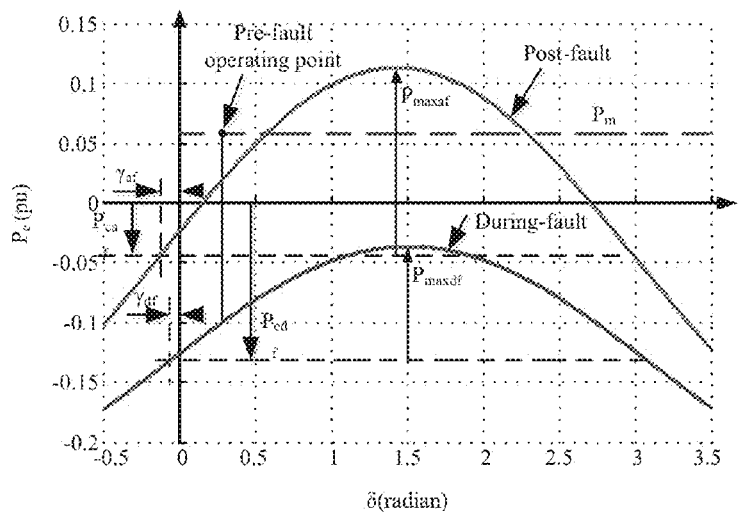
FIG. 18 shows power-angle characteristics of an SMIB equivalent system (case 1)

Two stable cases are discussed in this section. For case 1, a three phase fault was applied for 6 cycles (0.1 s). Angular separation of the two generator buses is shown in FIG. 17. When the post-fault rotor angles separate more than 5 degrees from the initial post-fault value, the protective relay 10 starts the SMIB equivalent procedure for the two area system. The system information, i.e. fault location and breaker status both during and after the fault are communicated to the protective relay 10. The power-angle characteristics for both during and post fault that were predicted by the protective relay 10 for case 1 are shown in FIG. 18. The values for the parameters in FIG. 18 are shown in Table III.

TABLE III

POWER-ANGLE CHARACTERISTIC VALUES FOR CASE 1

| | During-fault | | Post-fault |
|---|---|---|---|
| $P_{cdf}$ (pu) | −0.1318 | $P_{caf}$ (pu) | −0.0458 |
| $P_{maxdf}$ (pu) | 0.0954 | $P_{maxaf}$ (pu) | 0.1591 |
| $\gamma_{df}$ (radian) | 0.0584 | $\gamma_{af}$ (radian) | 0.1383 |
| | CCT(s) | | 0.2704 |

Figure 19:
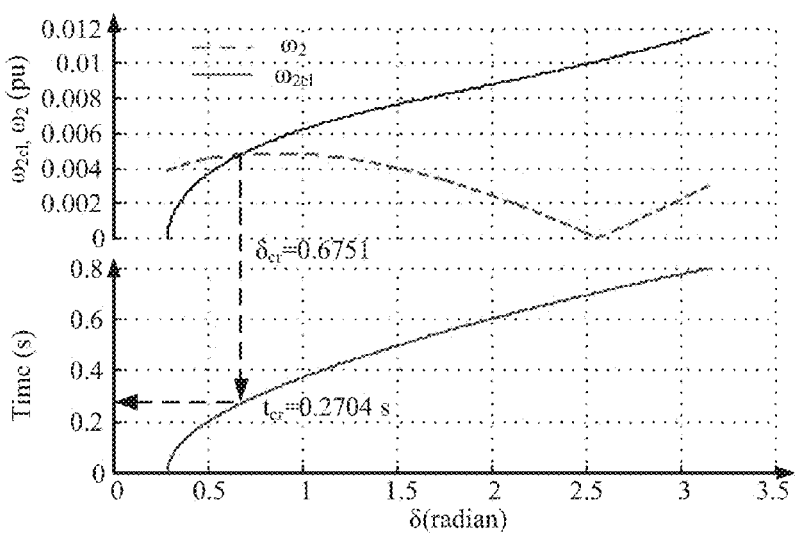
FIG. 19 shows state plane and time scale plots used to calculate CCT for case 1.
Figure 20:
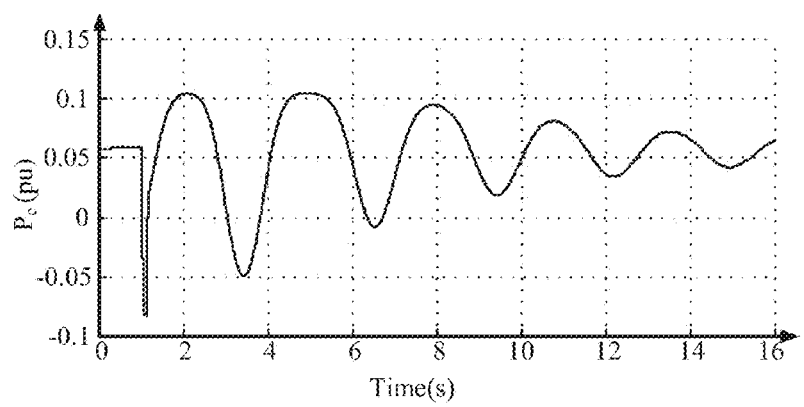
FIG. 20 shows an SMIB equivalent electrical power plot for case 1 (a fault duration of 6 cycles)

Using the predicted values of the parameters as shown in Table III, the protective relay 10 calculates the CCT of the power system. FIG. 19 shows the state plane plot and the time scale generated by the protective relay 10 to calculate the CCT. The CCT that was calculated for this case is 0.2704 s. Since the fault clearing time (i.e. 0.1 s) is less than the calculated CCT, the swing is determined to be stable and the prediction time is 0.2400 s. The electrical power from the SMIB equivalent system obtained from the simulation is shown in FIG. 20.

Figure 21:
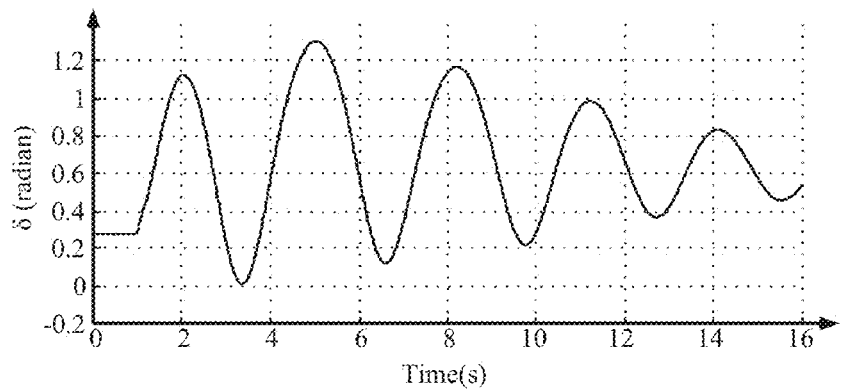
FIG. 21 shows an SMIB equivalent power angle plot for case 2 (a fault duration of 8 cycles)
Figure 22:
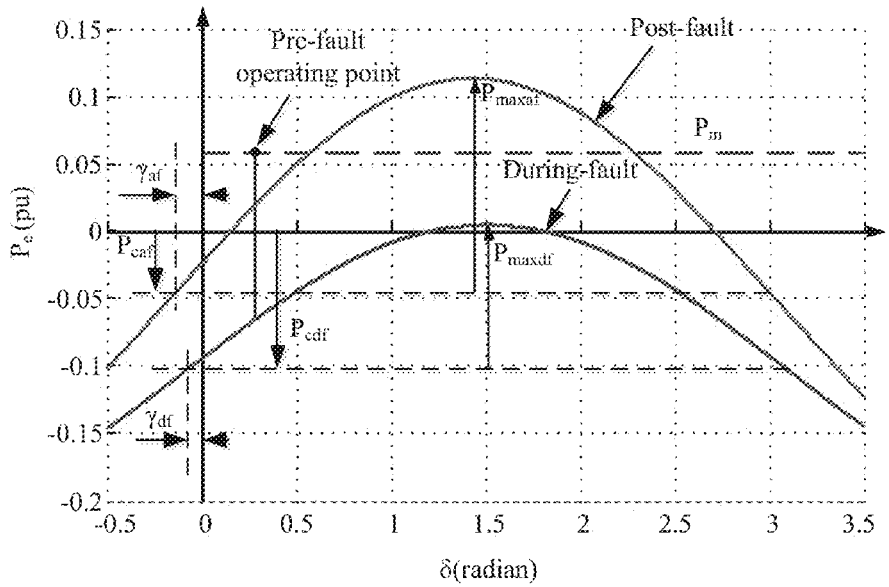
FIG. 22 shows power-angle characteristics of an SMIB equivalent system (case 2)

For case 2, a three phase fault was applied for 8 cycles (0.1330 s). The two machines oscillated with each other in response to the disturbance as shown in FIG. 21. As soon as the generator bus angle separation exceeded 5 degrees during the post-fault period, the protective relay 10 started the SMIB equivalent procedure. The power-angle characteristics predicted by the protective relay 10 for the during-fault condition and the post-fault condition of the power system are shown in FIG. 22. The values of the parameters in FIG. 22 are given in Table IV.

Figure 23:
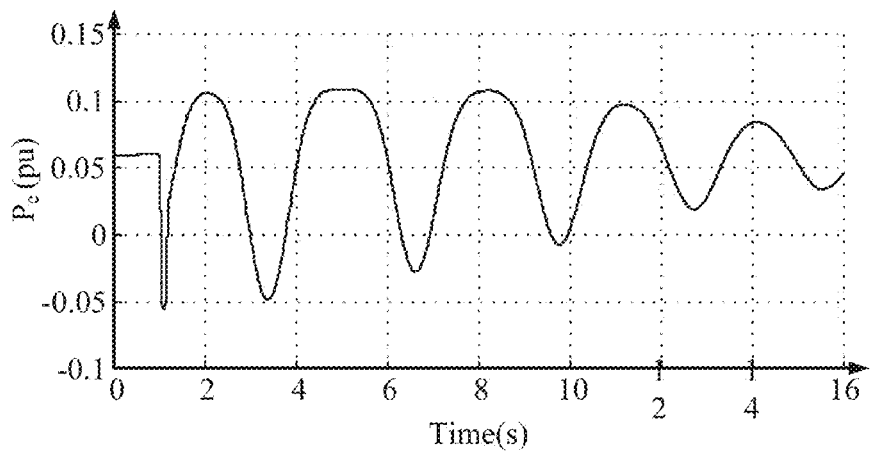
FIG. 23 shows an SMIB equivalent electrical power plot for case 2 (fault duration of 8 cycles)

Using the predicted values of the parameters as shown in Table IV the protective relay 10 calculated the CCT of the power system. The CCT calculated for this case was 0.3679 s. Since the fault clearing time (i.e. 0.1330 s) is less than the calculated CCT, the swing is determined to be stable and the prediction time was 0.2600 s. The electric power from the SMIB equivalent system obtained from the simulation is shown in FIG. 23, which shows a stable power swing.

TABLE IV

POWER-ANGLE CHARACTERISTIC VALUES FOR CASE 2

| | During-fault | | Post-fault |
|---|---|---|---|
| $P_{cdf}$ (pu) | −0.1012 | $P_{caf}$ (pu) | −0.0458 |
| $P_{maxdf}$ (pu) | 0.1059 | $P_{maxaf}$ (pu) | 0.1591 |
| $\gamma_{df}$ (radian) | 0.0601 | $\gamma_{af}$ (radian) | 0.1383 |
| | CCT(s) | | 0.3679 |

2) Unstable Swings

To get an unstable swing, a longer fault duration was used. Four unstable cases are discussed here. For case 1, fault durations of 18 cycles (0.3 s) and 20 cycles (0.3330 s) were used.

Figure 24:
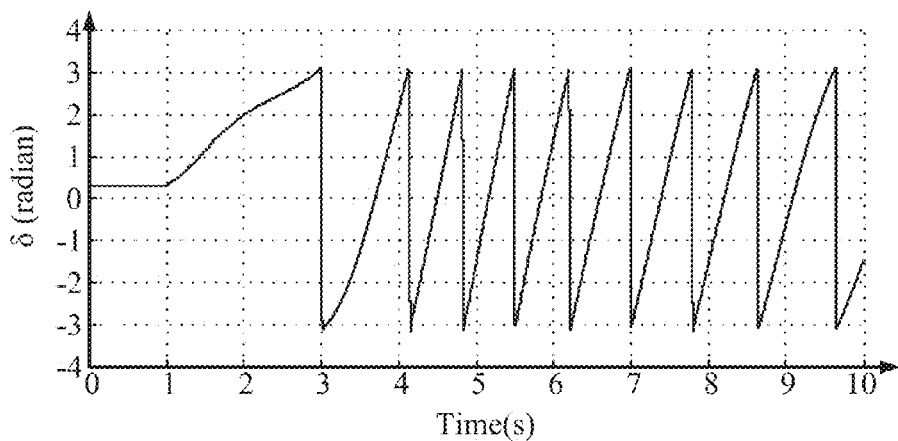
FIG. 24 shows an SMIB equivalent power angle plot for case 1 (fault duration of 18 cycles)
Figure 25:
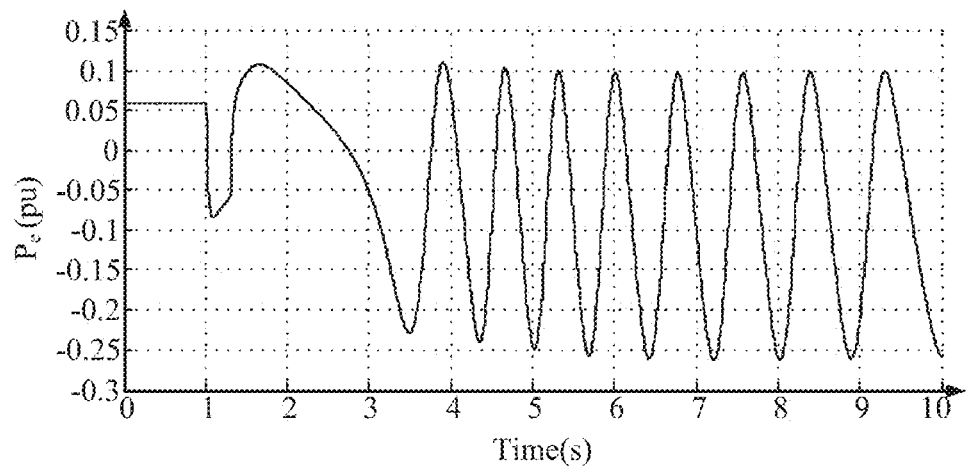
FIG. 25 shows an SMIB equivalent electrical power plot for case 1 (fault duration of 18 cycles)

When the fault was applied at 1 s and cleared after 18 cycles, the two areas started separating. FIG. 24 shows the rotor angle separation of the generators. As soon as the angle separation exceeded 5 degrees, the protective relay started calculating the SMIB equivalent system parameters. The parameters calculated for case 1 were the same as that shown in Table III. The calculated CCT was 0.2704 s. Since the fault clearing time (0.3 s) was greater than the calculated CCT, the protective relay 10 determines that the swing is an unstable swing at 0.3700 s. The electrical power swing for the SMIB equivalent system shown in FIG. 25 also confirms the prediction from the protective relay 10.

Figure 26:
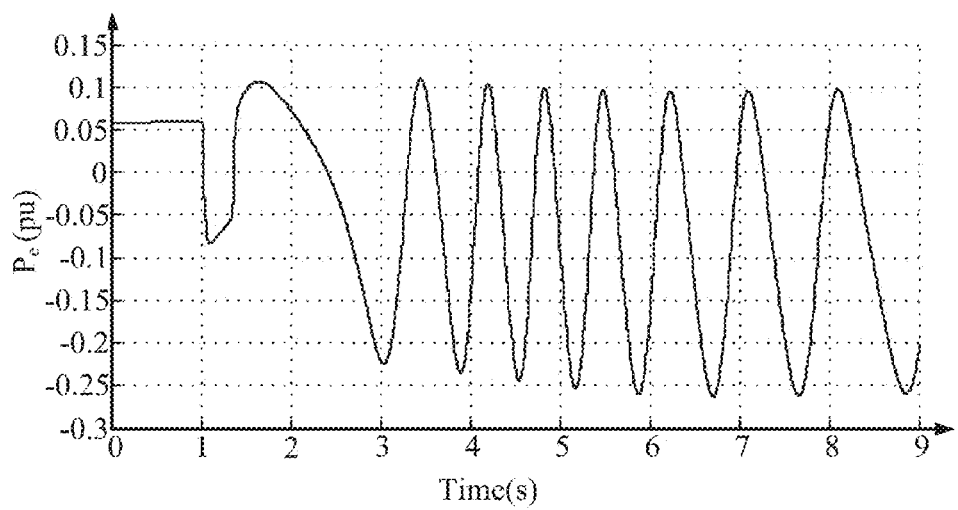
FIG. 26 shows an SMIB equivalent electrical power plot for case 1 (fault duration of 20 cycles)

Similarly, for a fault duration of 20 cycles (0.3330 s), the protective relay 10 follows the same procedure and determined that the swing is an unstable swing at 0.3950 s. FIG. 26 shows the unstable electrical power oscillation of the SMIB equivalent system after the fault is cleared.

Figure 27:
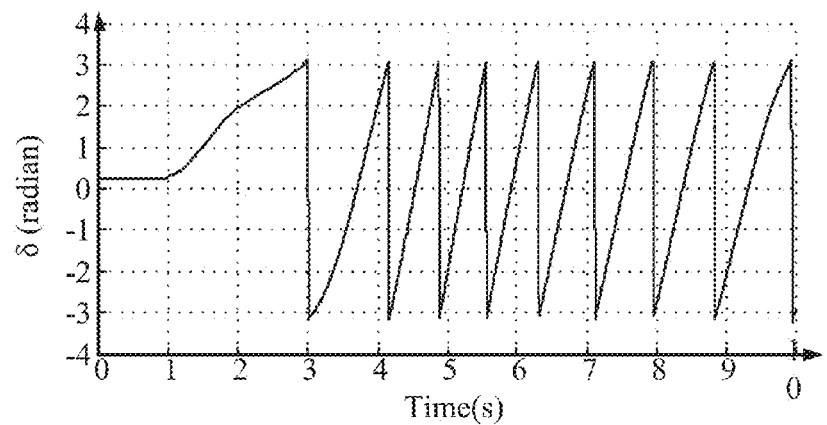
FIG. 27 shows an SMIB equivalent power angle plot for case 2 (fault duration of 24 cycles)
Figure 28:
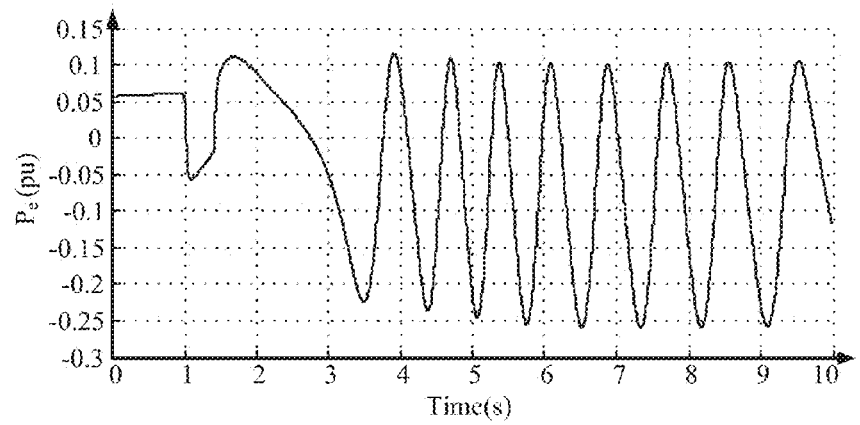
FIG. 28 shows an SMIB equivalent electrical power plot for case 2 (fault duration of 24 cycles)
Figure 29:
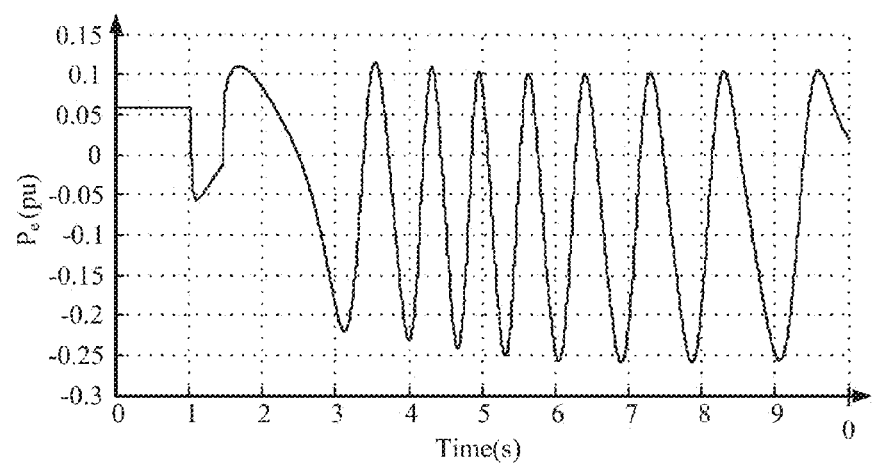
FIG. 29 shows an SMIB equivalent electrical power plot for case 2, fault duration of 26 cycles)

For case 2, unstable cases are created by applying fault for 24 cycles (0.4 s) and 26 cycles (0.4330 s). FIG. 27 shows the rotor angle separation between the generators for a fault duration of 24 cycles. The predicted parameters of the power-angle characteristics are shown in Table IV. The calculated CCT using SPA was 0.3679 s. The fault was cleared beyond the CCT, and hence the system became unstable. The instability was predicted at 0.4700 s. FIG. 28 shows that the electrical power oscillation for the SMIB equivalent system was unstable. Using a similar procedure for a fault duration of 26 cycles, the swing was predicted to be unstable at 0.5040 s. The unstable power swing of the SMIB equivalent system in this case is shown in FIG. 29. Table V shows the summary of the results for the stable and unstable swings predicted using the protective relay 10.

TABLE V

SUMMARY OF STABLE AND UNSTABLE SWING DETECTION RESULTS USING THE PROPOSED STATE PLANE TECHNIQUE FOR A TWO AREA SYSTEM

| Case No. | Fault duration (cycle) | Fault duration (s) | Detection time (s) | Decision |
|---|---|---|---|---|
| Case 1 | 6 | 0.1000 | 0.2400 | Stable |
| | 8 | 0.1330 | 0.2650 | Stable |

TABLE V-continued

SUMMARY OF STABLE AND UNSTABLE SWING DETECTION RESULTS USING THE PROPOSED STATE PLANE TECHNIQUE FOR A TWO AREA SYSTEM

| Case No. | Fault duration (cycle) | Fault duration (s) | Detection time (s) | Decision |
|---|---|---|---|---|
|  | 18 | 0.3000 | 0.3700 | Unstable |
|  | 20 | 0.3330 | 0.3950 | Unstable |
| Case 2 | 8 | 0.1330 | 0.2600 | Stable |
|  | 24 | 0.400 | 0.4700 | Unstable |
|  | 26 | 0.4330 | 0.5040 | Unstable |

5C. Comparison with the Two Blinder Scheme

The prediction of stable and unstable swings based on SPA was compared with the conventional two blinder technique. A distance relay with a two blinder scheme was placed at the transmission line TL-I near bus 5. This distance relay protects 80% of the line. The inner blinder was set at 0.85 p.u. and the outer blinder was set at 4 p.u. The power swing blocking time delay was taken as 2.5 cycles as is generally recommended. For each test case (case 1 and case 2), one stable and one unstable case is discussed here.

Figure 30:
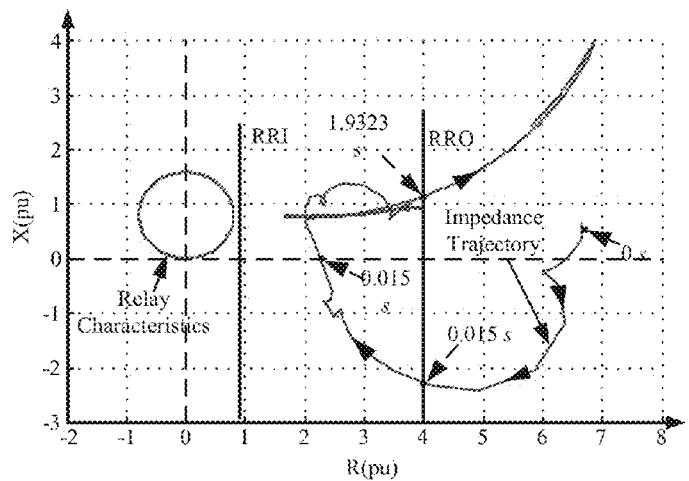
FIG. 30 shows an impedance trajectory for case 1 and a fault duration of 6 cycles using the two blinder scheme.
Figure 31:
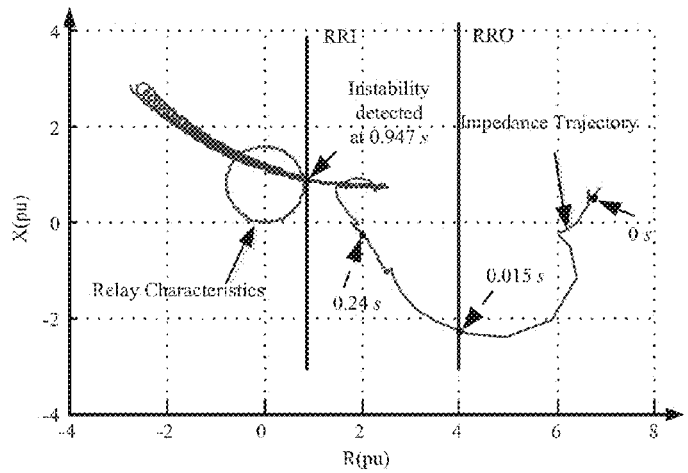
FIG. 31 shows an impedance trajectory for case 1 and a fault duration of 18 cycles using the two blinder scheme.

For case 1 and a fault duration of 6 cycles, the apparent impedance seen by the distance relay is shown in FIG. 30. Since the impedance locus does not enter the inner blinder, the swing is a stable swing and was detected at 1.9320 s, whereas the prediction time when using SPA was only 0.2400 s. For case 1 and a fault duration of 18 cycles, the apparent impedance seen by the distance relay is shown in FIG. 31. Since the impedance locus enters the inner blinder, the swing is an unstable swing and was detected as an unstable swing at 0.9470 s whereas the prediction time when using the SPA was only 0.3700 s.

Figure 32:
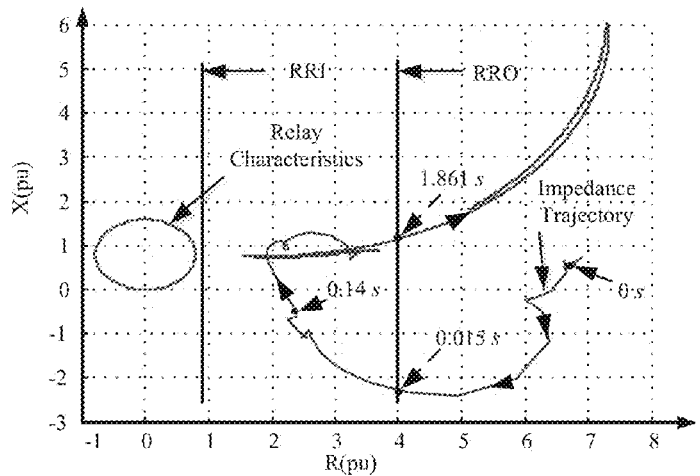
FIG. 32 shows an impedance trajectory for case 2 and a fault duration of 8 cycles using the two blinder scheme.
Figure 33:
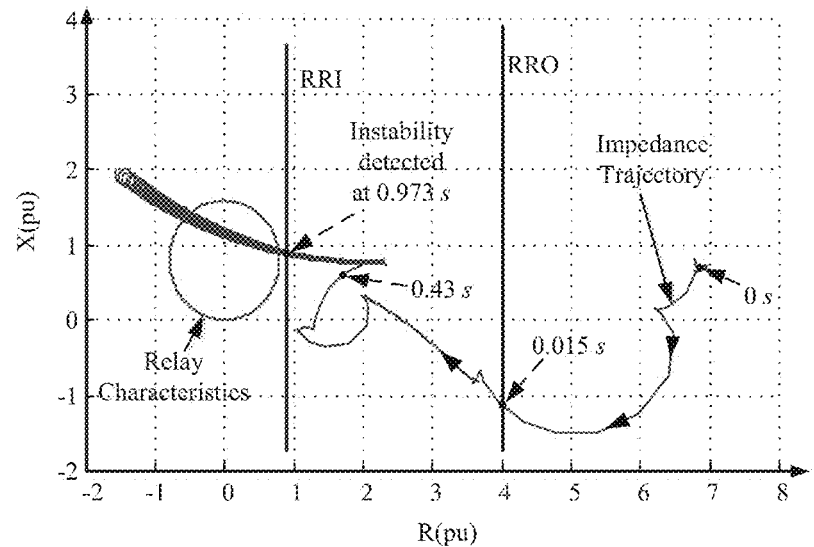
FIG. 33 shows an impedance trajectory for case 2 and a fault duration of 24 cycles using the two blinder scheme.

For case 2, a fault was applied for 8 cycles (0.1330 s). The impedance trajectory seen by distance relay is shown in FIG. 32. The swing was detected as a stable swing at 1.8610 s whereas the method based on SPA predicted it at 0.2600 s. Similarly, for case 2 and a fault duration of 24 cycles, the impedance seen by the distance relay is shown in FIG. 33. The impedance locus crosses the inner blinder at time 25.9730 s and hence was detected as an unstable swing at time 0.9730 s. Table VI shows the test results for both the stable and unstable swings using the conventional two blinder scheme.

TABLE VI

SUMMARY OF RESULTS USING THE TWO BLINDER TECHNIQUE FOR A TWO AREA SYSTEM

| Case No. | Fault duration (cycle) | Fault duration (s) | Detection time (s) | Decision |
|---|---|---|---|---|
| Case 1 | 6 | 0.1000 | 1.9323 | Stable |
|  | 8 | 0.1330 | 01.9010 | Stable |
|  | 18 | 0.3000 | 0.9470 | Unstable |
|  | 20 | 0.3330 | 0.8600 | Unstable |
| Case 2 | 8 | 0.1330 | 1.8610 | Stable |
|  | 24 | 0.4000 | 0.9730 | Unstable |
|  | 26 | 0.4330 | 0.9120 | Unstable |

6. Out-of-Step Prediction in Large Multi-Machine Power Systems

This section discusses the use of the SPA-based method for out-of-step protection for multi-machine power systems. An IEEE 39-bus test system (i.e. the New England test system) was modeled in PSCAD™, and the SPA-based method was tested by creating various transient scenarios.

Power systems have grown in size and complexity with significantly large distances between generating plants and load areas. The different generating plants are interconnected so that the entire power system operates in a more reliable fashion. For example, these power systems are designed so that there is more than one generation source that is available to meet the load demand in case of a failure at one of the other generators. When such a large multi-machine power system is subjected to a disturbance, inter-area oscillation may occur in the transmission lines interconnecting the different areas of the power system, i.e. a large group of generators in one area oscillate with respect to a large group of generators in another area. If the disturbance is severe, it may lead to a loss of synchronism condition in the power system with the generators in the different areas separating from each other. Protection against loss of synchronism is important in large power systems as such loss may cause widespread blackouts.

Out-of-step protection is often done by using conventional distance relays and the natural tripping of the distance element is allowed during an out-of-step condition. However, the tripping may be at a non-optimal angle and location which might cause unwanted outage of the other lines and generators from the power system. Challenges also exist with the other methods that have been created to provide out-of-step protection.

As described previously in section 2, the SPA-based method can be adapted to multi-machine systems with the assumption that the machines will separate into two groups. This is a fairly valid assumption, because whenever a disturbance occurs in a power system, a group of generators tends to oscillate with another group of generators, forming two coherent groups.

Figure 38:
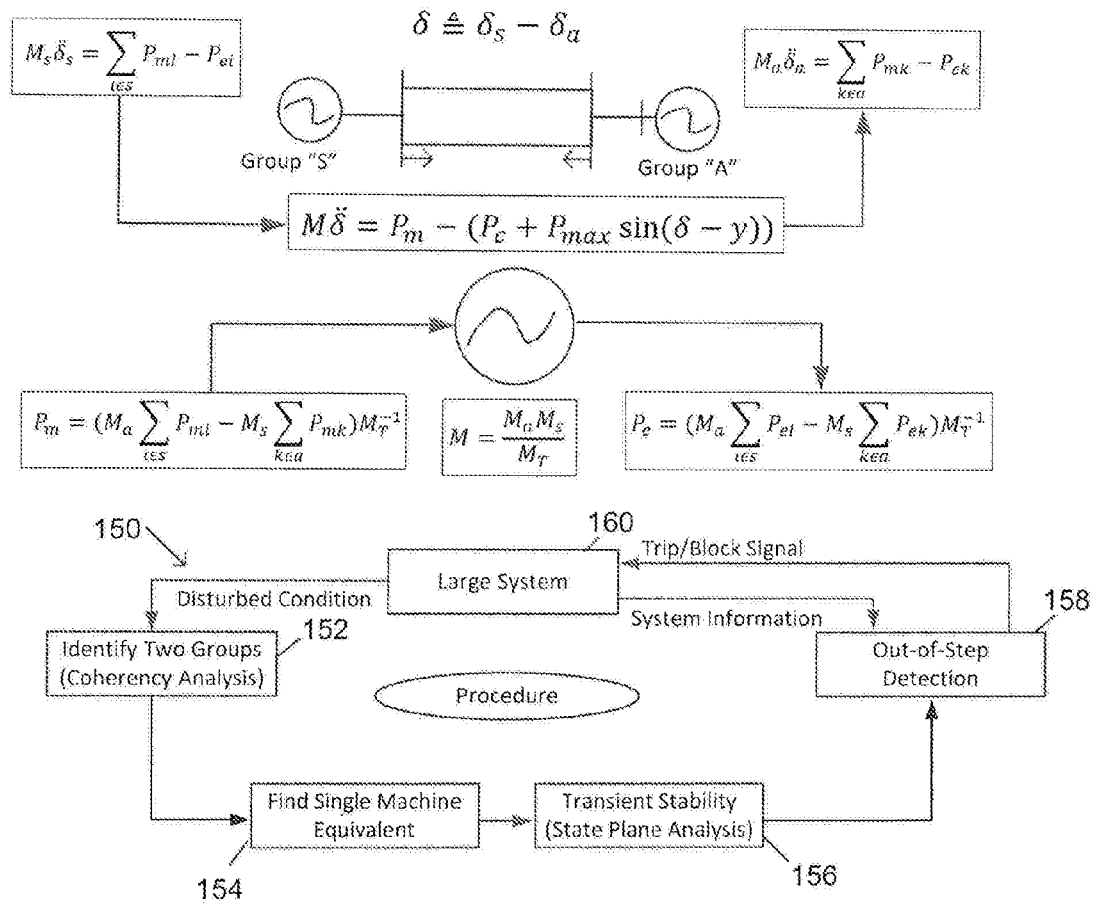
FIG. 38 is a flowchart of an example embodiment of an out-of-step prediction method for a multi-machine system.

Referring now to FIG. 38, shown therein is a flowchart of an example embodiment of an out-of-step prediction method 150 that can be used for a large system such as a multi-machine system. At 152, two groups of machines are identified from the large system. This may be done using coherency analysis, for example, as described in section 2A. At 154, the single machine equivalent model is determined. This can be done using the SMIB model, for example, as described in section 2B. At 156, the transient stability of the large system can be analyzed using SPA as was described in sections 2C and 3. Based on the SPA, out-of-step conditions can be predicted at 158 based on system information and SPA analysis of the large system. If an out-of-step condition is predicted for which the power swing in at least one portion of the large system will be unstable after the fault condition, trip and/or block signals can be generated and sent to the appropriate components within the large system at 160.

The separation of machines can be found using a different method including real time coherency analysis. Once the two groups of generators are determined, each group is then represented with an equivalent machine, thereby reducing the two groups of machines into a simple two machine system. The inertia of the equivalent machines is equal to the respective sum of inertias of all of the machines in the group, and the angle is equal to the Center Of Angle (COA) of all of the machines in the group. The two machine system is then further simplified into an SMIB equivalent system. The SPA method can then be used to find the CCT of the SMIB equivalent system. This CCT value can then be compared to the fault duration value to predict the instability in the large system. Out-of-step tripping can then be performed on pre-selected lines to restore the stability of the system.

Figure 39:
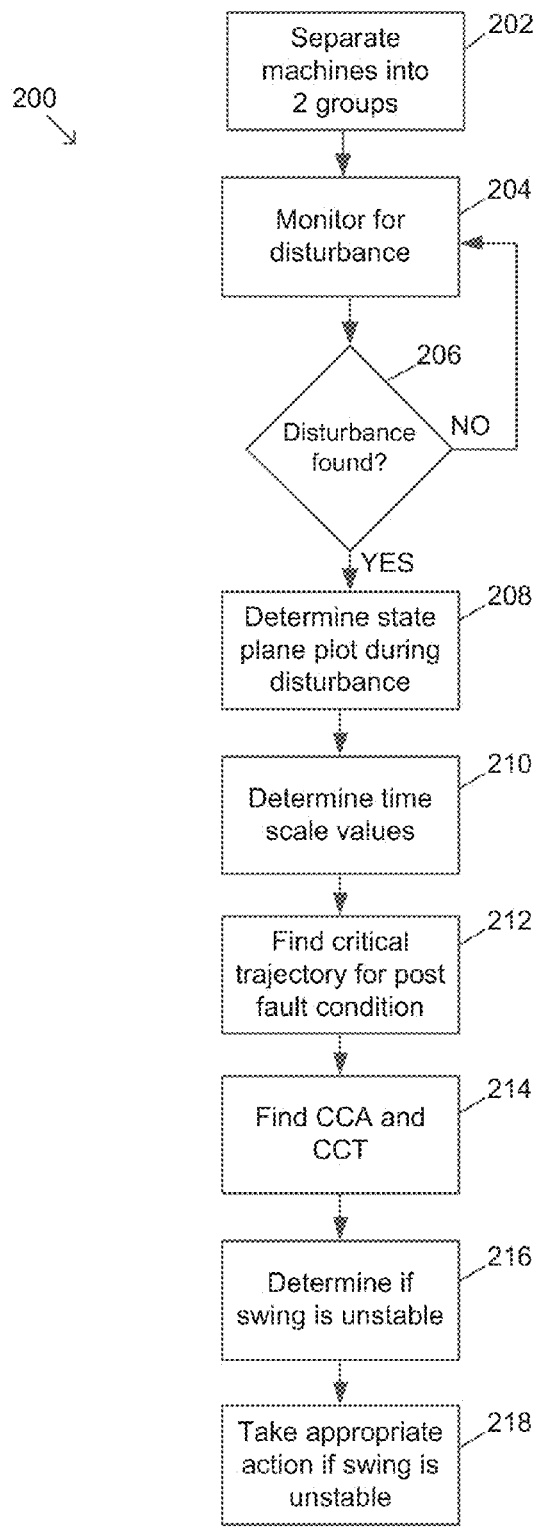
FIG. 39 is a flowchart of another example embodiment of an out-of-step prediction method for a multi-machine system.

Referring now to FIG. 39, shown therein is a flowchart of a more detailed embodiment of an out-of-step prediction method 200 that can be used for a multi-machine system. At 202, the machines from the multi-machine system are separated into two groups. This may be done using coherency analysis, for example, as described in section 2A. The single machine equivalent model can also be determined at 202. This can be done using the SMIB model for example, as described in section 2B. The remaining steps 204 to 218 are similar to steps 102 to 116 of method 100 that were previously described.

6A. Real Time Coherency Determination

As described in section 2A, a coherent group of generators can be identified by analyzing the individual generator swing curves. A real time coherency study can use an online measurement of generator bus voltage angles to determine the coherency in the early part of the post-fault condition and the coherency in the latter part of the disturbance can be determined using generator internal voltage swing curves.

A time domain simulation was run for testing the system under investigation (the IEEE 39-bus test system), and the generator bus voltage angle separation from a reference generator bus was measured at every simulation time step. Some examples of real time coherency determination in the IEEE 39-bus test system are now discussed.

Figure 34:
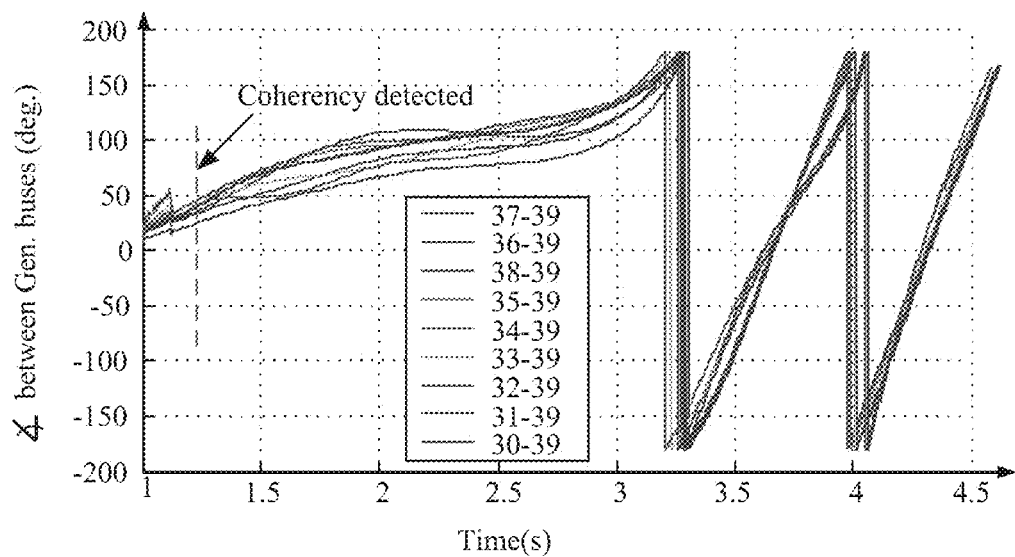
FIG. 34 shows the generator bus voltage swing curves with respect to the reference generator bus (generator 1 at bus 39) for a three phase fault applied at bus 5 for a fault duration of 110 ms for the IEEE 39-bus test system.
Figure 35:
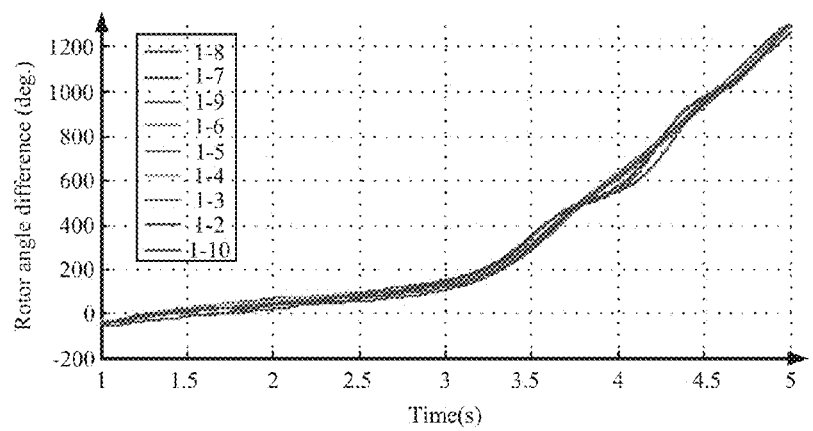
FIG. 35 shows the coherency between the generators using the internal voltage angle deviation of the generator groups with respect to the reference generator.
Figure 36:
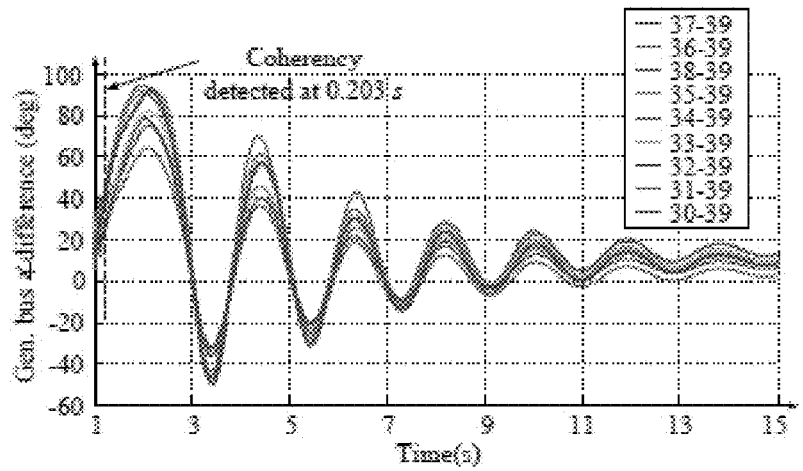
FIG. 36 shows the generator bus voltage angle with respect to the reference generator bus for a fault at bus 27 of the IEEE 39-bus test system which was cleared after 110 ms.
Figure 37:
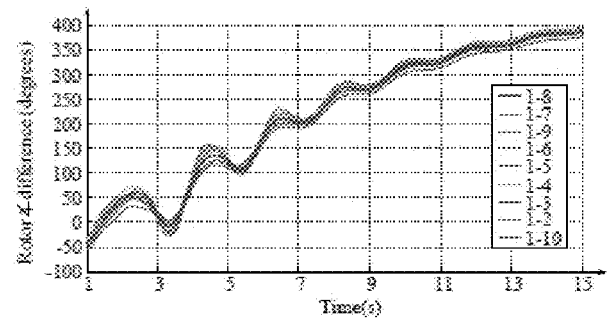
FIG. 37 shows the coherency between the generators at bus 30 to 39 from the generator internal voltage angles separation.

For a three-phase fault applied at bus 5 for a duration of 110 ms, the generator bus voltage swing curves with respect to the reference generator bus (generator 1 at bus 39) are shown in FIG. 34. The generators at buses 30 to 38 start separating from the reference generator bus during the post-fault condition and as soon as all of the generators' bus voltage angles separate beyond 5 degrees, the coherency between the generators at buses 30 to 38 is identified. The coherency between the generators is also confirmed using the internal voltage angle deviation of the generator groups with respect to the reference generator, which is shown in FIG. 35. Similarly, for the fault at bus 27, which was cleared after 110 ms, the generator bus voltage angle with respect to the reference generator bus is shown in FIG. 36. The generators (at bus 30 to 38) separate from the reference generator bus at bus 39. The coherency among the generators from 30 to 38 is predicted at 0.203 s. The coherency between the generators at bus 30 to 39 can also be seen from the generator internal voltage angles separation, which is shown in FIG. 37. By observing when all of the generators' bus voltage angles separate from the reference generator bus voltage angle beyond a certain amount (such as 5 degrees), and by also observing the internal voltage angles, coherency between the generators at bus 30 to 38 is identified.

6B. Testing Methodology

Figure 54:
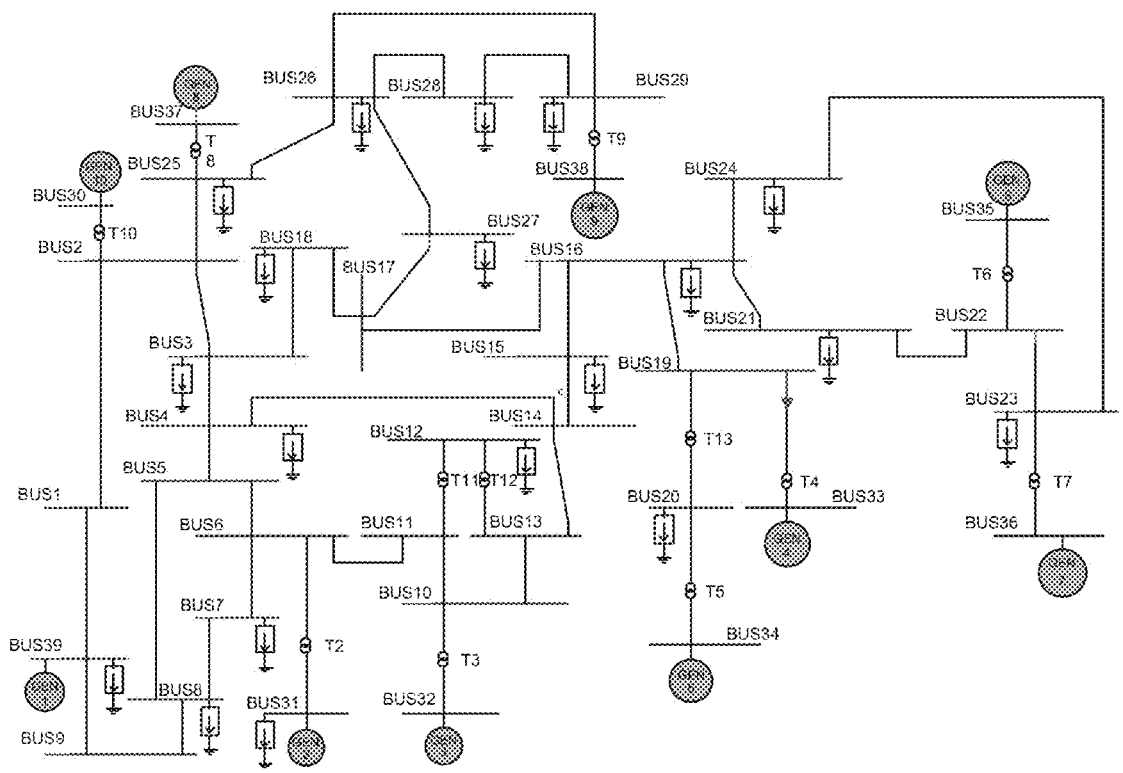
FIG. 54 is a schematic of the IEEE 39-bus test system.

Whenever a fault occurs at a bus in a power system (the tests used an IEEE 39-bus test system as shown in FIG. 54), the faulted bus information is communicated to the relay, and network reduction is carried out for the during-fault condition. As soon as the fault is cleared from the bus, the network reduction is carried out for the post-fault condition and is done in the same time interval when the coherent machines are being identified. The coherent groups of machines are found using real time coherency analysis as explained in section 2. As soon as the generator bus voltage angle or the equivalent generator bus voltage angle (measured from the initial post fault value) deviates from the reference generator bus voltage angle beyond a certain value (5 degrees were used for the tests), the associated machines are assumed to separate from the reference generator. The reference generator chosen in the testing was generator 1 connected at bus 39. When the generators separate from the reference generator, the SMIB equivalent process is carried out using the during-fault and post-fault network equivalents to calculate the during-fault and post-fault power-angle characteristics. The CCT was calculated using SPA, and the instability was predicted using the criterion explained in Section 3.4. The stable swing prediction results in blocking all of the distance relays on the lines experiencing power swing, whereas when instability is predicted between the two areas, system separation can be decided in two ways. First, the tie lines through which the system separates can be found using either online generator and load power measurements to keep generation-load balance in the different regions, past data or data from offline simulation studies, and the system can be separated at those lines. Second, a threshold value can be set for the bus voltage angle, and if the difference goes beyond the threshold value after the instability is predicted, separation can be initiated on those lines.

6C. Results of Case Studies Using an IEEE 39-Bus Test System

The IEEE 39-bus test system is simulated in PSCAD™. The system data are shown in Appendix B. Three phase fault is applied at different buses in the system and the instability is predicted using the SPA-based method. Test results for 2 cases, a stable and an unstable scenario, will be discussed. A three phase fault is applied at bus 3 for the first case and at bus 13 for the second case. The fault durations are varied to get stable and unstable cases.

Figure 40:
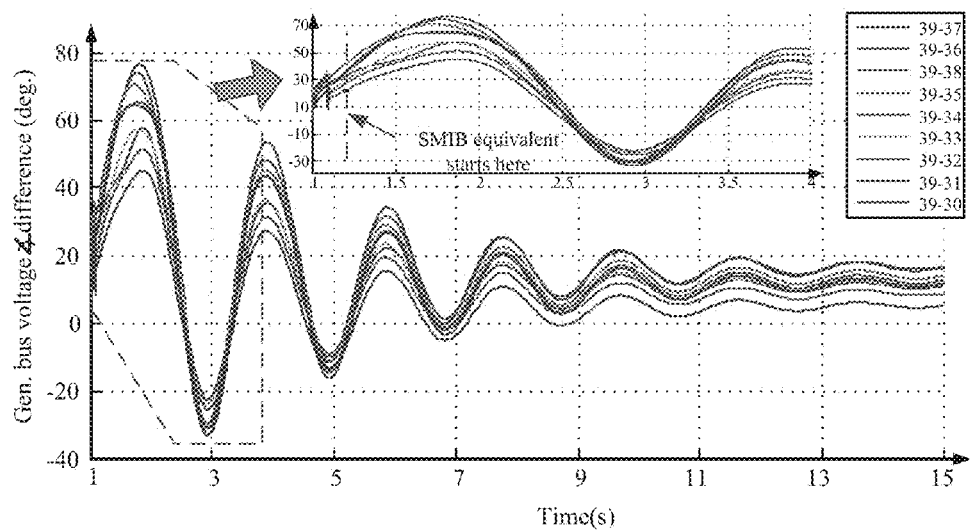
FIG. 40 shows the voltage angle swing observed at different generator buses with respect to the reference generator bus for a fault at bus 3 that was applied at 1 s and cleared after 80 ms.
Figure 41A:
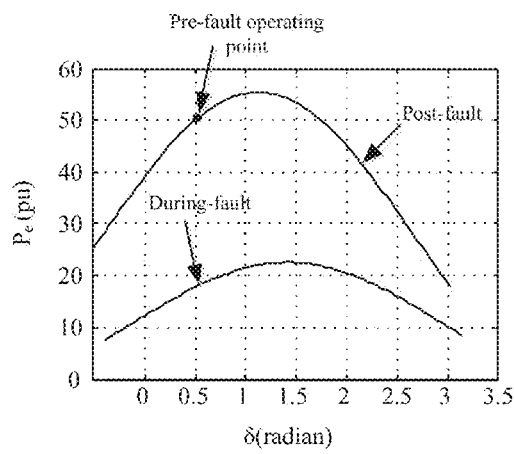
FIG. 41a shows the predicted power-angle characteristics for the during-fault and post fault conditions for the fault of FIG. 40.
Figure 41B:
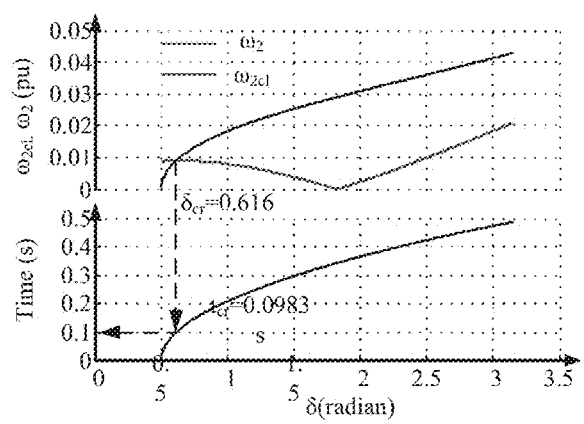
FIG. 41b shows the plot and method used to determine the CCT for the fault of FIG. 40.
Figure 42:
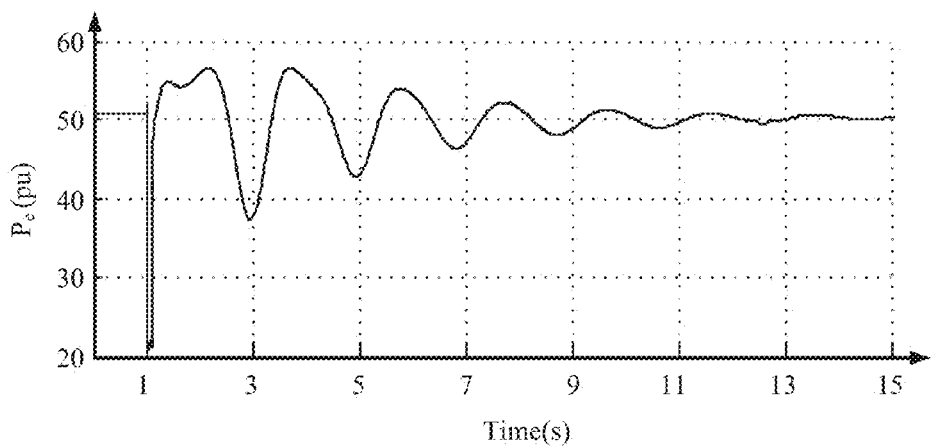
FIG. 42 shows the electrical power for the SMIB equivalent system obtained from a simulation for the fault of FIG. 40.
Figure 43:
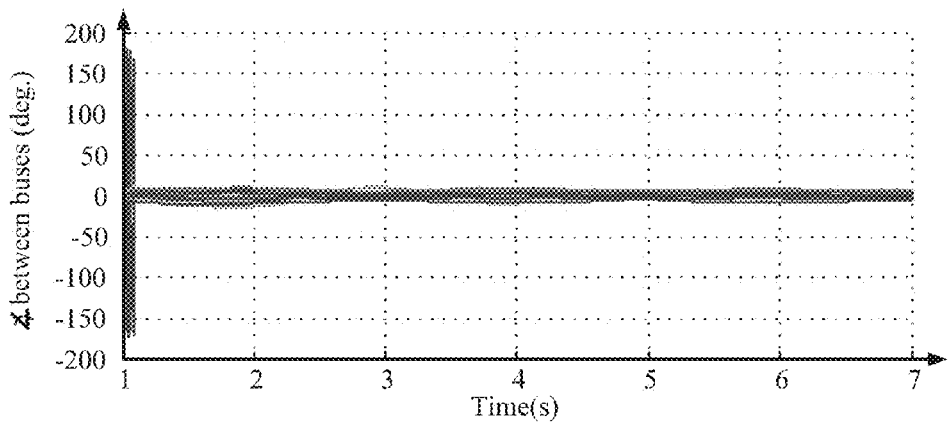
FIG. 43 shows a plot of the voltage angle difference between series elements for the fault of FIG. 40.

For the fault at bus 3, the fault was applied at 1 s and was cleared after 80 ms. The voltage angle swing observed at different generator buses with respect to the reference generator bus are shown in FIG. 40. At 0.19 s, all of the machines (i.e. machines 2 to 10) separate from the reference machine. At this point, calculations were carried out to find the power-angle characteristics of the SMIB equivalent system. The predicted power-angle characteristics for the during-fault and post-fault conditions are shown in FIG. 41a. The protective relay 10 then performed SPA to calculate the CCT which is shown in FIG. 41b. The calculated CCT was 0.0983 s. The fault duration was less than the CCT and so the power system was stable. FIG. 42 shows the electrical power from the SMIB equivalent system obtained from the simulation which also shows a stable swing. During the post-fault condition, the voltage angle at the individual buses throughout the power system may oscillate, but the voltage angle difference between series elements is going to be small. FIG. 43 plots the voltage angle difference between series elements and confirms that the variation is minor.

Figure 45:
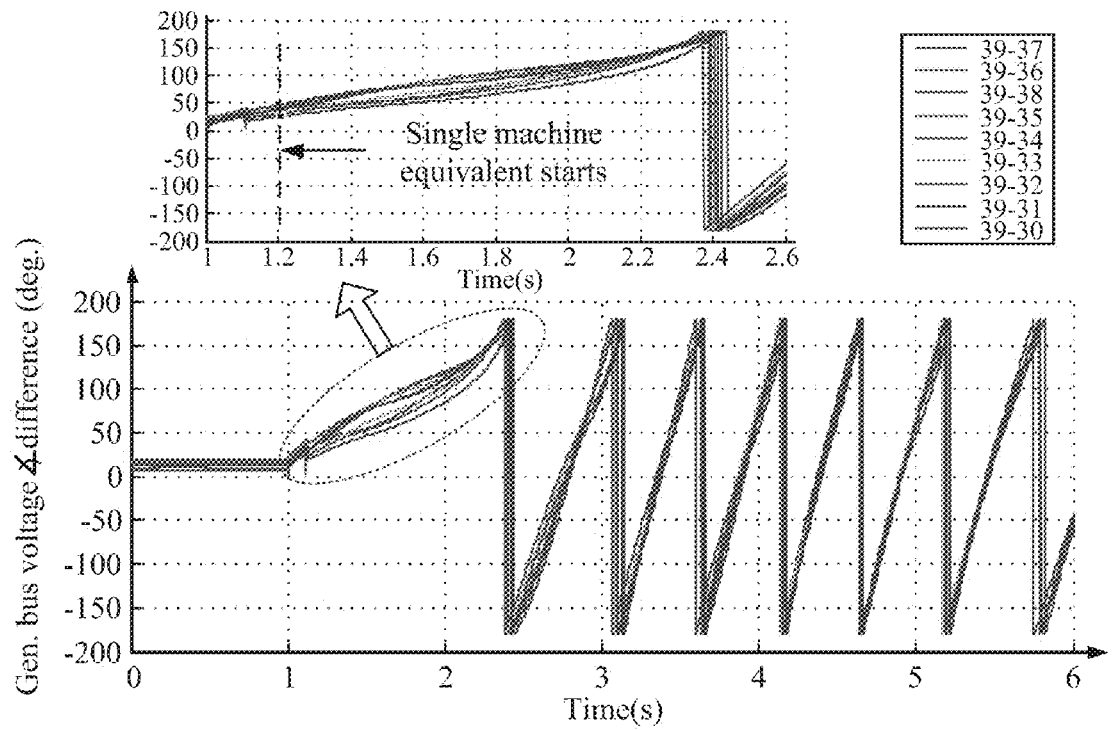
FIG. 45 shows the angular separation of the generator bus angles with respect to the reference generator for the fault of FIG. 44.
Figure 46:
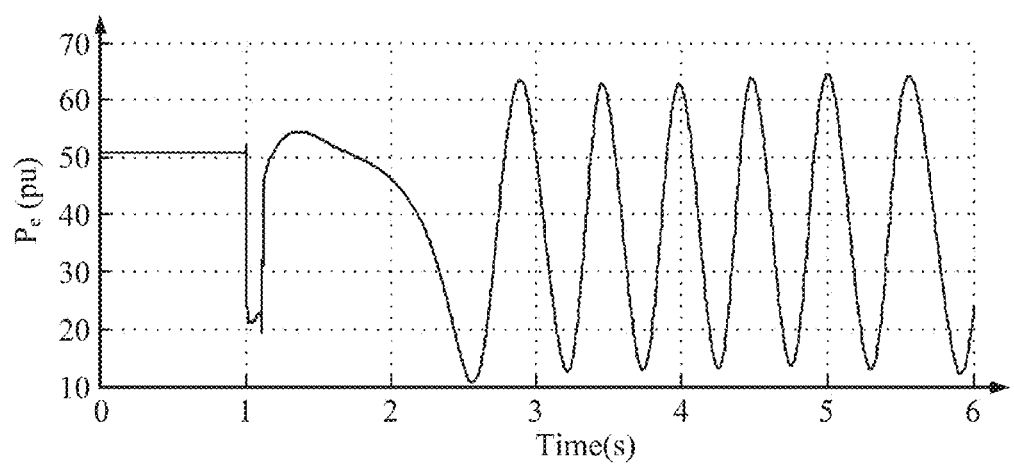
FIG. 46 shows the electrical power of the SMIB equivalent system obtained from a simulation for the fault of FIG. 44.

The fault duration was increased to 100 ms for the fault at bus 3. The angular separation of the generator bus angles with respect to the reference generator bus angle is shown in FIG. 45. All of the other generator bus voltage angles deviate from the reference bus. The separation beyond 5 degrees is detected at 0.2 s and the SMIB equivalent procedure is started. The results of the CCT calculation procedure are shown in FIGS. 41a and 14b. Since the fault duration is greater than the calculated CCT, the system becomes unstable. The electrical power of the SMIB equivalent system is shown in FIG. 46.

Figure 44:
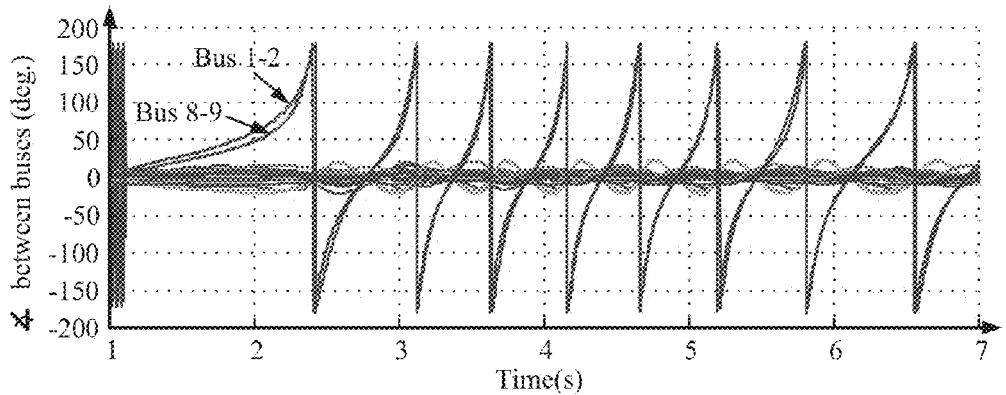
FIG. 44 shows the voltage angle difference between consecutive buses for a fault at bus 3 that was applied at 1 s and cleared after 100 ms.

FIG. 44 shows the voltage angle difference between consecutive buses. From FIG. 44 it can be seen that the angles between buses 1-2 and 8-9 have become unbounded which means that the two groups are going to separate at these two lines. Once the out-of-step prediction is made, the lines between 1-2 and 8-9 are tripped.

Figure 47:
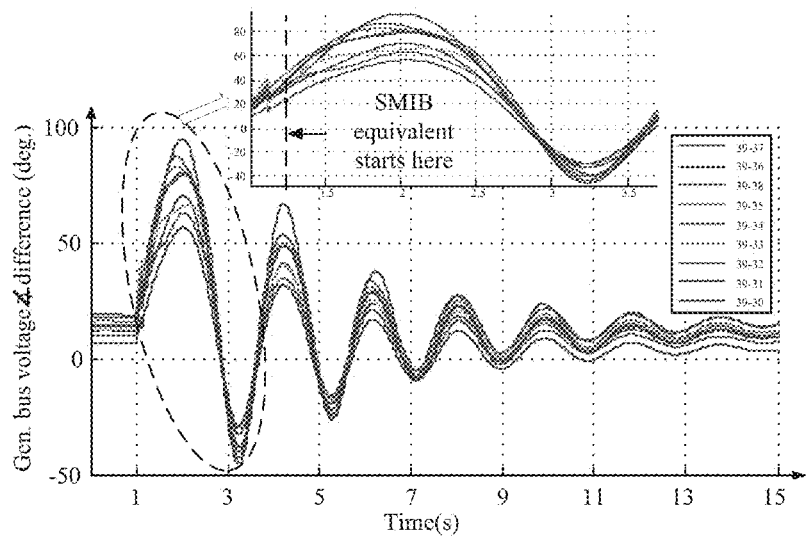
FIG. 47 shows the voltage angle swing observed at different generator buses with respect to a reference generator bus for a three phase fault applied at bus 13 which was cleared after 0.115 s.

Similar tests were performed where the three phase fault was applied at bus 13 and cleared after 0.115 s. The voltage angle swing observed at different generator buses with respect to the reference generator bus is shown in FIG. 47.

Figure 48:
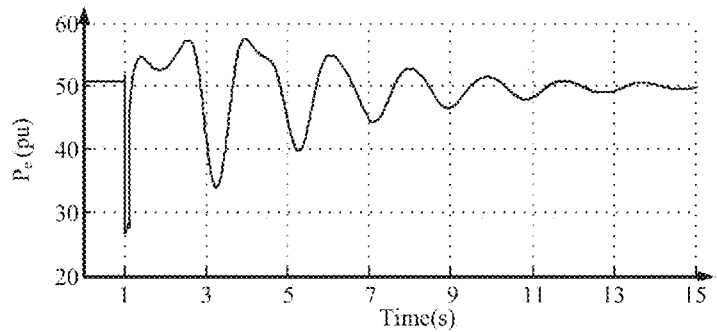
FIG. 48 shows the electrical power for the SMIB equivalent system obtained from a simulation for the fault of FIG. 47.
Figure 49A:
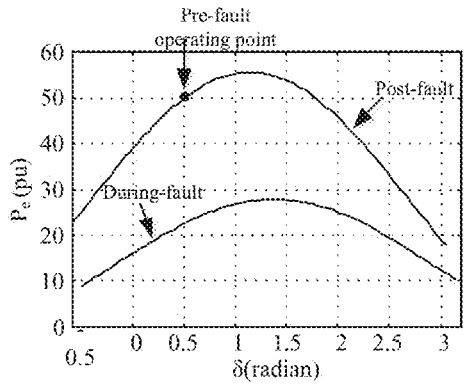
FIG. 49a shows the relay predicted power-angle characteristics for the fault of FIG. 47.
Figure 49B:
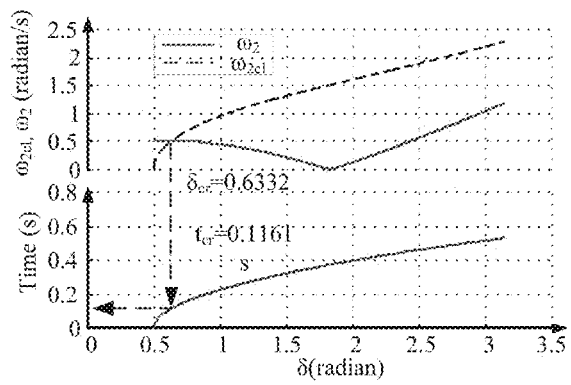
FIG. 49b shows the plot and method used to determine the CCT for the fault of FIG. 47.

At 0.23 s, all of the machines (i.e. machines 2 to 10) separate beyond 5 degrees from the reference machine. At this point, the protective relay 10 calculates the power-angle characteristics for the SMIB equivalent system. The power-angle characteristics predicted by the protective relay 10 are shown in FIG. 49*a*. The protective relay 10 then performed SPA to calculate the CCT, which is shown in FIG. 49*b*. The CCT was calculated to be 0.1161 s. The fault duration is less than the calculated CCT. Therefore, the protective relay 10 predicts the oscillation as stable. FIG. 48 shows the electrical power for the SMIB equivalent system obtained from the simulation. The power oscillation also shows a stable swing, which is in agreement with the CCT calculations made using SPA.

Figure 50:
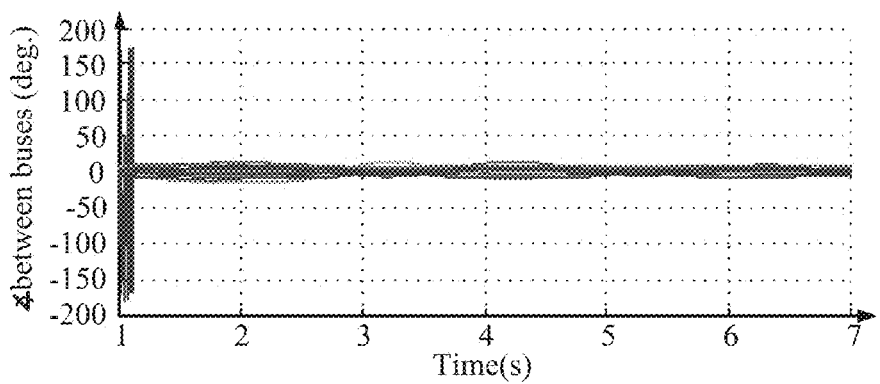
FIG. 50 shows a plot of the voltage angle difference between two ends of the transmission line for the fault of FIG. 47.

The voltage angle differences between the two ends of the transmission line are shown in FIG. 50 which shows that there was no large angular separation between the bus voltage angles throughout the power system. This is in agreement with the stability prediction made by the protective relay 10.

Figure 51:
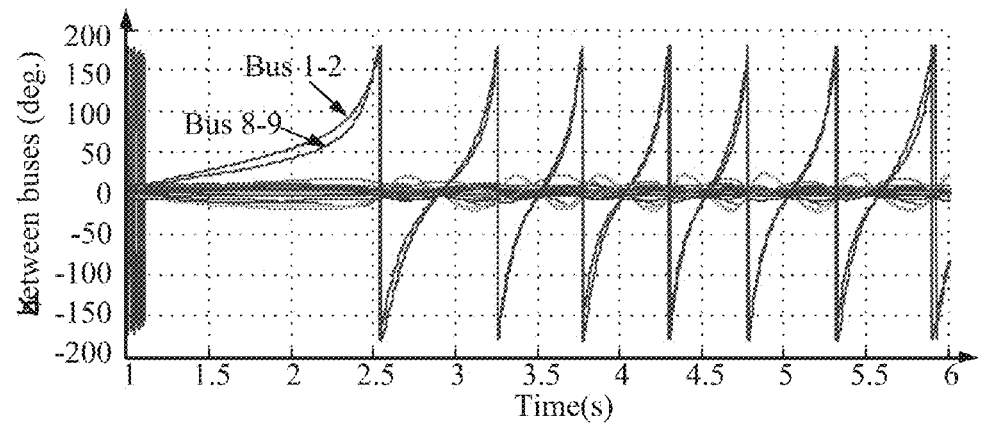
FIG. 51 shows that the power system separates between the two lines connecting buses 1-2 and 8-9 as when the fault of FIG. 47 is increased to 100 ms.
Figure 52:
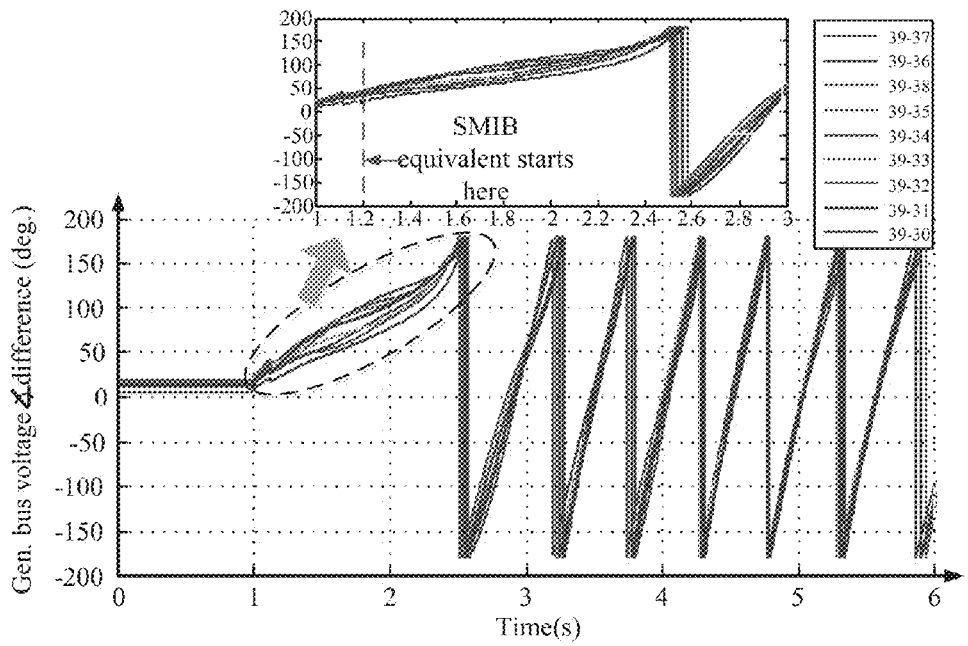
FIG. 52 shows the generator bus voltage angles when the fault of FIG. 47 is increased to 125 ms.
Figure 53:
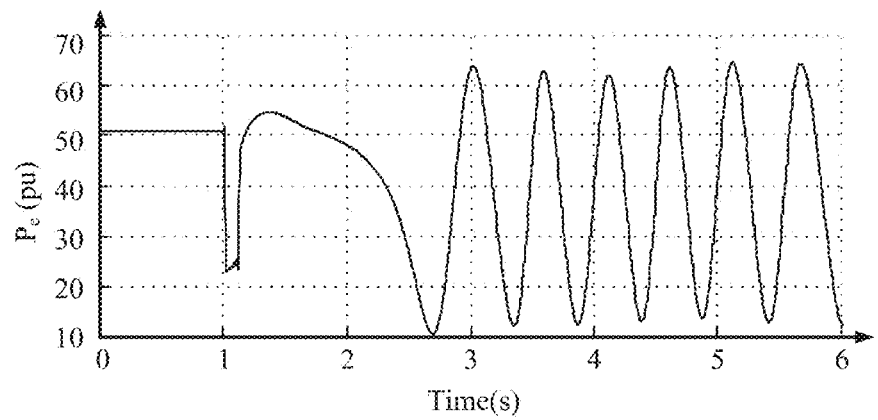
FIG. 53 shows the electrical power for the SMIB equivalent system obtained from simulation.

For the same bus fault, the fault duration was increased to 125 ms. The plot of the generator bus voltage angles for this fault is shown in FIG. 52. The power-angle characteristics and the calculation of the CCT for the fault at bus 13 were discussed previously using FIGS. 49*a* and 49*b*. Since the fault clearing time was greater than the CCT obtained in this figure, the power system is determined to be unstable and the time of prediction was 0.2 s. The electrical power for the SMIB equivalent system obtained from the simulation is shown in FIG. 53. The power swing is an unstable power swing, as expected. The power system separates between the two lines connecting buses 1-2 and 8-9 as shown in FIG. 51.

Using a similar procedure, instability in the power system was predicted for the fault at other bus locations. The calculated CCT and the prediction times for the corresponding cases are shown in Table VII.

TABLE VII

Test results of instability predictions using SPA

| Faulted bus | Fault duration(ms) | SPA CCT | TOP | Decision |
|---|---|---|---|---|
| 3 | 80 | 0.09828 | 0.20 | Stable |
|  | 100 |  | 0.19 | Unstable |
| 4 | 90 | 0.1010 | 0.21 | Stable |
|  | 110 |  | 0.19 | Unstable |
| 5 | 100 | 0.1060 | 0.1912 | Stable |
|  | 110 |  | 0.2112 | Unstable |
| 6 | 100 | 0.1061 | 0.1965 | Stable |
|  | 120 |  | 0.2147 | Unstable |
| 11 | 115 | 0.1153 | 0.2102 | Stable |
|  | 130 |  | 0.2132 | Unstable |
| 13 | 115 | 0.1161 | 0.2300 | Stable |
|  | 125 |  | 0.2000 | Unstable |
| 14 | 100 | 0.1047 | 0.1910 | Stable |
|  | 110 |  | 0.1927 | Unstable |
| 17 | 80 | 0.0942 | 0.1761 | Stable |
|  | 95 |  | 0.1820 | Unstable |
| 24 | 95 | 0.1083 | 0.1986 | Stable |
|  | 110 |  | 0.1996 | Unstable |
| 27 | 110 | 0.1239 | 0.2037 | Stable |
|  | 125 |  | 0.21173 | Unstable |

TOP: Time of Prediction

It should be noted that at least one of the embodiments described herein may be used for can be used for system separation at selected points in a power system so that unstable portions of the power system can be separated from the stable or healthy portions of the grid. This may also be known as "islanding" in power systems.

It should be noted that at least one of the embodiments described herein may be used in an offline "Transient Stability Analysis Software" package for transient stability analysis of a power system.

It should be noted that at least one of the embodiments described herein may be used for Real Time Stability Analysis or situational awareness of a power system in control rooms using asynchronous SCADA data or Synchrophasor Measurement ("referred to as SIPS (System Integrity Protection & Control Systems) in modern power systems terminology). In some cases, at least one of the embodiments described herein may be used for providing "Online Situational Analysis of the Power System".

It should be noted that at least one of the embodiments described herein may be used for finding the security margins of a power system.

It should be noted that at least one of the embodiments described herein may be used for initiating Remedial Action Schemes (RAS) in a power system.

It should be noted that at least one of the embodiments described herein may be used as part of a system integrity protection and control system.

At least some of the elements of the protective relay 10 that are implemented via software may be written in a high-level procedural language such as object oriented programming or a scripting language. Accordingly, the program code may be written in C, $C^{++}$, SQL or any other suitable programming language and may comprise modules or classes, as is known to those skilled in object oriented programming. In alternative embodiments, at least some of the elements of the protective relay 10 that are implemented via software may be written in assembly language, machine language or firmware as needed. In either case, the program code can be stored on a storage media or on a computer readable medium that is readable by a general or special purpose programmable computing device having a processor, an operating system and the associated hardware and software that is necessary to implement the functionality of at least one of the embodiments described herein. The program code, when read by the computing device, configures the processor to operate in a new, specific and predefined manner in order to perform at least one of the methods described herein.

Furthermore, at least a portion of some of the methods described herein are capable of being distributed in a computer program product comprising a computer readable medium that bears computer usable instructions for one or more processors. The medium may be provided in various forms such as, but not limited to, one or more diskettes, compact disks, tapes, chips, USB keys, external hard drives, wire-line transmissions, satellite transmissions, Internet transmissions or downloads, magnetic and electronic storage media, digital and analog signals, and the like. The computer useable instructions may also be in various forms, including compiled and non-compiled code.

While the applicant's teachings described herein are in conjunction with various embodiments for illustrative purposes, it is not intended that the applicant's teachings be limited to such embodiments. On the contrary, the applicant's teachings described and illustrated herein encompass various alternatives, modifications, and equivalents, without departing from the embodiments, the general scope of which is defined in the appended claims.

APPENDIX A

Machine and System Data

Generator data: 900 MV A, 20 kV $r_a$=0.0025 p.u., $x_l$=0.2 p.u., $x_d$=1.8 p.u., $x_q$=1.7 p.u., $x'_d$=0.3 p.u., $x'_q$=0.55 p.u., $x''_d$=0.25 p.u., $x''_q$=0.25 p.u., $T_{d0}$=8 s, $T''_{d0}$=0.03 s, $T'_{q0}$=0.4 s, $T''_{q0}$=0.05 s, $H(G_1)$=5.4 s, $H(G_2)$=6.25 s.

Transmission line data: r=0.053 Ω/km, $X_L$=0.53 Ω/km,

Exciter data: IEEE type ST1A exciter, $T_r$=0.01 s, $T_C$=1 s, $T_B$=10 s, $K_A$=50, $V_{MAX}$=9 p.u., $V_{MIN}$=−9 p.u.

Steam governor data: GE mechanical-hydraulic controls, Droop (R)=0.04 p.u., Speed relay lag time constant (TC) ($T_1$)=0.1 s, Gate servo TC ($T_3$)=0.25 s.

Steam turbine data (in p.u.): IEEE type 2 thermal turbine, $K_1$=0.0, $K_3$=0.25, $K_5$=0.0, $K_7$=0.0, $K_2$=0.25, $K_4$=0.5, $K_6$=0.0, $K_8$=0.0, Steam chest TC ($T_4$)=0.42 s, Reheater TC ($T_5$)=4.25 s, Reheater/cross-over TC ($T_6$)=0.72 s.

APPENDIX B

IEEE 39 Bus System

TABLE B.1

Generator data (Generator MVA base)

| Gen. No. | $T'_{do}$ | $T'_{qo}$ | H | $X_d$ | $X_q$ | $X'_d$ | $X'_q$ | $X''_d$ | $X_l$ |
|---|---|---|---|---|---|---|---|---|---|
| 1 | 3.797 | 0.438 | 5.8 | 2.134 | 2.049 | 0.319 | 0.478 | 0.224 | 0.185 |
| 2 | 3.826 | 0.5084 | 3.41 | 1.7241 | 1.6587 | 0.2586 | 0.4524 | 0.2029 | 0.145 |
| 3 | 6.7 | 0.41 | 6.05 | 1.87 | 1.74 | 0.37 | 0.467 | 0.2805 | 0.23 |
| 4 | 5.8 | 1.2 | 3.6 | 1.86 | 1.81 | 0.282 | 0.466 | 0.233 | 0.164 |
| 5 | 3.8260 | 0.5084 | 3.41 | 1.7241 | 1.6587 | 0.2586 | 0.4524 | 0.2029 | 0.145 |
| 6 | 5.3180 | 0.97 | 5.016 | 1.834 | 1.798 | 0.419 | 0.83 | 0.314 | 0.26 |
| 7 | 3.8 | 0.52 | 3.141 | 1.84 | 1.77 | 0.28 | 0.478 | 0.215 | 0.155 |
| 8 | 3.8 | 0.52 | 3.141 | 1.84 | 1.77 | 0.28 | 0.478 | 0.215 | 0.155 |
| 9 | 7.61 | 0.84 | 5.32 | 1.643 | 1.573 | 0.3169 | 0.4793 | 0.246 | 0.1922 |
| 10 | | | 500.00 | | | 0.0005 | | | |

TABLE B.2

Line data (100 MVA base)

| From Bus | To Bus | R | X | B | Transformer Tap Magnitude | Transformer Tap Angle |
|---|---|---|---|---|---|---|
| 1 | 2 | 0.0035 | 0.0411 | 0.6987 | 0.000 | 0.00 |
| 1 | 39 | 0.0010 | 0.0250 | 0.7500 | 0.000 | 0.00 |
| 2 | 3 | 0.0013 | 0.0151 | 0.2572 | 0.000 | 0.00 |
| 2 | 25 | 0.0070 | 0.0086 | 0.1460 | 0.000 | 0.00 |
| 3 | 4 | 0.0013 | 0.0213 | 0.2214 | 0.000 | 0.00 |
| 3 | 18 | 0.0011 | 0.0133 | 0.2138 | 0.000 | 0.00 |
| 4 | 5 | 0.0008 | 0.0128 | 0.1342 | 0.000 | 0.00 |
| 4 | 14 | 0.0008 | 0.0129 | 0.1382 | 0.000 | 0.00 |
| 5 | 6 | 0.0002 | 0.0026 | 0.0434 | 0.000 | 0.00 |
| 5 | 8 | 0.0008 | 0.0112 | 0.1476 | 0.000 | 0.00 |
| 6 | 7 | 0.0006 | 0.0092 | 0.1130 | 0.000 | 0.00 |
| 6 | 11 | 0.0007 | 0.0082 | 0.1389 | 0.000 | 0.00 |
| 7 | 8 | 0.0004 | 0.0046 | 0.0780 | 0.000 | 0.00 |
| 8 | 9 | 0.0023 | .0363 | 0.3804 | 0.000 | 0.00 |
| 9 | 39 | 0.0010 | 0.0250 | 1.2000 | 0.000 | 0.00 |
| 10 | 11 | 0.0004 | 0.0043 | 0.0729 | 0.000 | 0.00 |
| 10 | 13 | 0.0004 | 0.0043 | 0.0729 | .000 | 0.00 |
| 13 | 14 | 0.0009 | 0.0101 | 0.1723 | 0.000 | 0.00 |
| 14 | 15 | 0.0018 | 0.0217 | 0.3660 | 0.000 | 0.00 |
| 15 | 16 | 0.0009 | 0.0094 | 0.1710 | 0.000 | 0.00 |
| 16 | 17 | 0.0007 | 0.0089 | 0.1342 | 0.000 | 0.00 |
| 16 | 19 | 0.0016 | 0.0195 | 0.3040 | 0.000 | 0.00 |
| 16 | 21 | 0.0008 | 0.0135 | 0.2548 | 0.000 | 0.00 |
| 16 | 24 | 0.0003 | 0.0059 | 0.0680 | 0.000 | 0.00 |
| 17 | 18 | 0.0007 | 0.0082 | 0.1319 | 0.000 | 0.00 |
| 17 | 27 | 0.0013 | 0.0173 | 0.3216 | 0.000 | 0.00 |
| 21 | 22 | 0.0008 | 0.0140 | 0.2565 | 0.000 | 0.00 |
| 22 | 23 | 0.0006 | 0.0096 | 0.1846 | 0.000 | 0.00 |
| 23 | 24 | 0.0022 | 0.0350 | 0.3610 | 0.000 | 0.00 |
| 25 | 26 | 0.0032 | 0.0323 | 0.5130 | 0.000 | 0.00 |
| 26 | 27 | 0.0014 | 0.0147 | 0.2396 | 0.000 | 0.00 |
| 26 | 28 | 0.0043 | 0.0474 | 0.7802 | 0.000 | 0.00 |
| 26 | 29 | 0.0057 | 0.0625 | 1.0290 | 0.000 | 0.00 |
| 28 | 29 | 0.0014 | 0.0151 | 0.2490 | 0.000 | 0.00 |
| 12 | 11 | 0.0016 | 0.0435 | 0.0000 | 1.006 | 0.00 |
| 12 | 13 | 0.0016 | 0.0435 | 0.0000 | 1.006 | 0.00 |
| 6 | 31 | 0.0000 | 0.0250 | 0.0000 | 1.070 | 0.00 |
| 10 | 32 | 0.0000 | 0.0200 | 0.0000 | 1.070 | 0.00 |
| 19 | 33 | 0.0007 | 0.0142 | 0.0000 | 1.070 | 0.00 |
| 20 | 34 | 0.0009 | 0.0180 | 0.0000 | 1.009 | 0.00 |
| 22 | 35 | 0.0000 | 0.0143 | 0.0000 | 1.025 | 0.00 |
| 23 | 36 | 0.0005 | 0.0272 | 0.0000 | 1.000 | 0.00 |
| 25 | 37 | 0.0006 | 0.0232 | 0.0000 | 1.025 | 0.00 |
| 2 | 30 | 0.0000 | 0.0181 | 0.0000 | 1.025 | 0.00 |
| 29 | 38 | 0.0008 | 0.0156 | 0.0000 | 1.025 | 0.00 |
| 19 | 20 | 0.0007 | 0.0138 | 0.0000 | 1.060 | 0.00 |

TABLE B.3

Load Flow data (100 MVA base)

| Bus | Type | Voltage (p.u.) | Load MW | Load MVar | Generator MW | Generator MVar | Unit No. |
|---|---|---|---|---|---|---|---|
| 1 | PQ | — | 0.0 | 0.0 | 0.0 | 0.0 | |
| 2 | PQ | — | 0.0 | 0.0 | 0.0 | 0.0 | |
| 3 | PQ | — | 322.0 | 2.4 | 0.0 | 0.0 | |
| 4 | PQ | — | 500.0 | 184.0 | 0.0 | 0.0 | |
| 5 | PQ | — | 0.0 | 0.0 | 0.0 | 0.0 | |
| 6 | PQ | — | 0.0 | 0.0 | 0.0 | 0.0 | |
| 7 | PQ | — | 233.8 | 84.0 | 0.0 | 0.0 | |
| 8 | PQ | — | 522.0 | 176.0 | 0.0 | 0.0 | |
| 9 | PQ | — | 0.0 | 0.0 | 0.0 | 0.0 | |

TABLE B.3-continued

Load Flow data (100 MVA base)

| Bus | Type | Voltage (p.u.) | Load MW | Load MVar | Generator MW | Generator MVar | Unit No. |
|---|---|---|---|---|---|---|---|
| 10 | PQ | — | 0.0 | 0.0 | 0.0 | 0.0 | |
| 11 | PQ | — | 0.0 | 0.0 | 0.0 | 0.0 | |
| 12 | PQ | — | 7.5 | 88.0 | 0.0 | 0.01 | |
| 13 | PQ | — | 0.0 | 0.0 | 0.0 | 0.0 | |
| 14 | PQ | — | 0.0 | 0.0 | 0.0 | 0.0 | |
| 15 | PQ | — | 320.0 | 153.0 | 0.0 | 0.0 | |
| 16 | PQ | — | 329.0 | 32.3 | 0.0 | 0.0 | |
| 17 | PQ | — | 0.0 | 0.0 | 0.0 | 0.0 | |
| 18 | PQ | — | 158.0 | 30.0 | 0.0 | 0.0 | |
| 19 | PQ | — | 0.0 | 0.0 | 0.0 | 0.0 | |
| 20 | PQ | — | 628.0 | 103.0 | 0.0 | 0.0 | |
| 21 | PQ | — | 274.0 | 115.0 | 0.0 | 0.0 | |
| 22 | PQ | — | 0.0 | 0.0 | 0.0 | 0.0 | |
| 23 | PQ | — | 247.5 | 84.6 | 0.0 | 0.0 | |
| 24 | PQ | — | 308.6 | −92.0 | 0.0 | 0.0 | |
| 25 | PQ | — | 224.0 | 47.2 | 0.0 | 0.0 | |
| 26 | PQ | — | 139.0 | 17.0 | 0.0 | 0.0 | |
| 27 | PQ | — | 281.0 | 75.5 | 0.0 | 0.0 | |
| 28 | PQ | — | 206.0 | 27.6 | 0.0 | 0.0 | |
| 29 | PQ | — | 283.5 | 26.9 | 0.0 | 0.0 | |
| 30 | PV | 1.0475 | 0.0 | 0.0 | 250.0 | — | Gen10 |
| 31 | PV | 0.9820 | 9.2 | 4.6 | — | — | Gen2 |
| 32 | PV | 0.9831 | 0.0 | 0.0 | 650.0 | — | Gen3 |
| 33 | PV | 0.9972 | 0.0 | 0.0 | 632.0 | — | Gen4 |
| 34 | PV | 1.0123 | 0.0 | 0.0 | 508.0 | — | Gen5 |
| 35 | PV | 1.0493 | 0.0 | 0.0 | 650.0 | — | Gen6 |
| 36 | PV | 1.0635 | 0.0 | 0.0 | 560.0 | — | Gen7 |
| 37 | PV | 1.0278 | 0.0 | 0.0 | 540.0 | — | Gen8 |
| 38 | PV | 1.0265 | 0.0 | 0.0 | 830.0 | — | Gen9 |
| 39 | PV | 1.0300 | 1104.0 | 250.0 | 1000.0 | — | Gen1 |

APPENDIX C

Network Admittance Matrix Reduction

Figure 55:
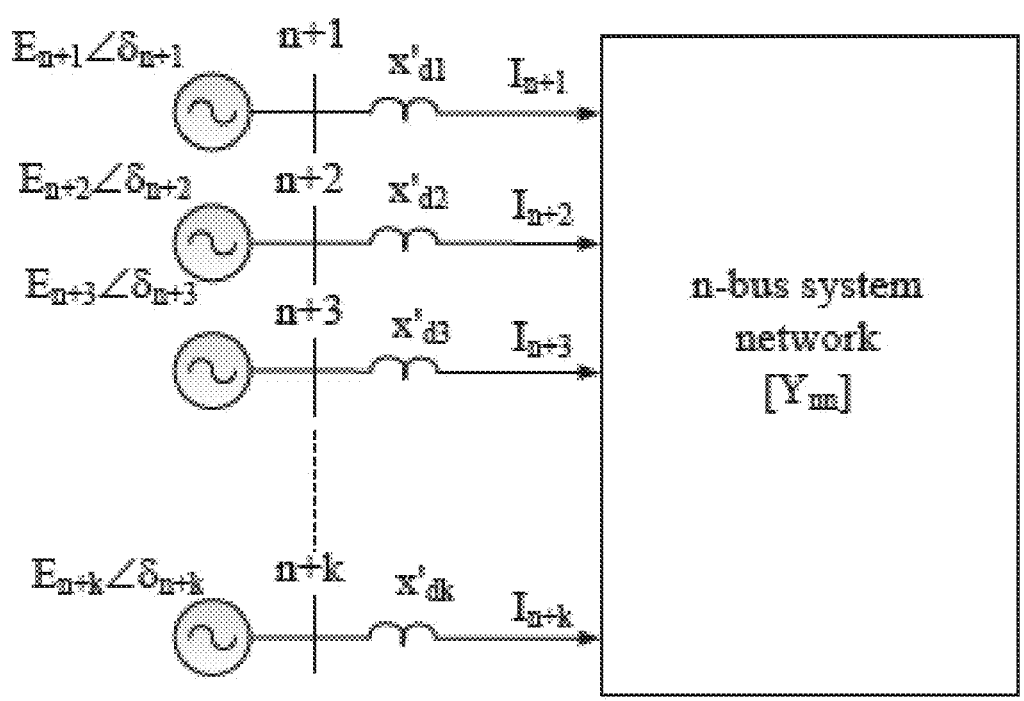
FIG. 55 shows the equivalent network representation used for network admittance matrix reduction.

With the synchronous machine represented as a constant voltage source behind the transient reactance and the load modeled as a constant impedance, the power system network can be reduced between the generator internal nodes. The n-bus network is augmented to an n+k-bus network to include the transient reactances of k generators. FIG. 55 shows the equivalent network representation used for network reduction. The nodes n+1, n+2, . . . , n+k represent the internal machine buses. The node voltage equation for the augmented network is given by equation C.1.

$$\begin{bmatrix} I_1 \\ I_2 \\ I_3 \\ \vdots \\ \vdots \\ \vdots \\ I_n \\ \hline I_{n+1} \\ I_{n+2} \\ \vdots \\ \vdots \\ I_{n+k} \end{bmatrix} = \begin{bmatrix} Y_{11} & \cdots & Y_{1n} & Y_{1(n+1)} & \cdots & Y_{1(n+k)} \\ Y_{21} & \cdots & Y_{2n} & Y_{2(n+1)} & \cdots & Y_{2(n+k)} \\ Y_{31} & \cdots & Y_{3n} & Y_{3(n+1)} & \cdots & Y_{3(n+k)} \\ \vdots & \cdots & \vdots & \vdots & \cdots & \vdots \\ \vdots & \cdots & \vdots & \vdots & \cdots & \vdots \\ \vdots & \cdots & \vdots & \vdots & \cdots & \vdots \\ Y_{n1} & \cdots & Y_{nn} & Y_{n(n+1)} & \cdots & Y_{n(n+k)} \\ \hline Y_{(n+1)1} & \cdots & Y_{(n+1)n} & Y_{(n+1)(n+1)} & \cdots & Y_{(n+1)(n+k)} \\ Y_{(n+2)1} & \cdots & Y_{(n+2)n} & Y_{(n+2)(n+1)} & \cdots & Y_{(n+2)(n+k)} \\ \vdots & \cdots & \vdots & \vdots & \cdots & \vdots \\ \vdots & \cdots & \vdots & \vdots & \cdots & \vdots \\ Y_{(n+m)1} & \cdots & Y_{(n+m)n} & Y_{(n+m)(n+1)} & \cdots & Y_{(n+m)(n+k)} \end{bmatrix} \begin{bmatrix} V_1 \\ V_2 \\ V_3 \\ \vdots \\ \vdots \\ \vdots \\ V_n \\ \hline E_{n+1} \\ E_{n+2} \\ \vdots \\ \vdots \\ E_{n+k} \end{bmatrix} \quad (C.1)$$

The buses other than the generator internal buses are eliminated by using the Kron reduction formula. The buses to be removed are represented in the upper n rows. Since no current enters or leaves the load buses, the currents in these n rows are set to zero. The generator currents are denoted by the vector $I_k$ and the generator and load voltages are denoted by $E_k$ and $V_n$, respectively. The equation C.1 can be represented in submatrix form as given by equation C.2.

$$\begin{bmatrix} 0 \\ I_k \end{bmatrix} = \begin{bmatrix} Y_{nn} & Y_{nk} \\ Y_{nk}^t & Y_{kk} \end{bmatrix} \begin{bmatrix} V_n \\ E_k \end{bmatrix} \quad (C.2)$$

By eliminating $V_n$ from the equation C.2, the expression for $I_k$ is given by equation C.3a.

$$I_k = [Y_{kk} - Y_{nk}^t Y_{nn}^{-1} Y_{nk}] E_k \quad (C.3a)$$

$$= Y_{bus}^{red} E_k \quad (C.3b)$$

where $Y_{bus}^{red} = [Y_{kk} - Y_{nk}^t Y_{nn}^{-1} Y_{nk}]$ is the reduced admittance matrix between the generator internal nodes.

We claim:

1. A method for predicting an out-of-step condition in a power system due to a disturbance including a fault, said power system comprising a power generator, and wherein the method comprises:

monitoring the power system for disturbances using a protective relay;

using a processing unit, when the disturbance is found, for:

determining values for a state plane trajectory for the power generator during the disturbance based on using an internal voltage angle ($\delta$) of the power generator and a during fault rotor speed ($\omega_1$) of the power generator as state variables;

determining time scale values based on values of $\delta$ and $\omega_1$ during the disturbance;

determining values for a critical state plane trajectory for the power generator after clearing the fault to obtain values for a post fault critical rotor speed ($\omega_{2cl}$) with respect to $\delta$;

determining values for a state plane trajectory for the power generator after clearing the fault to obtain values for a post fault rotor speed ($\omega_2$) with respect to $\delta$;

determining a critical clearing angle ($\delta_{cr}$) and a critical clearing time ($t_{cr}$) that occur when a difference between the post fault rotor speed ($\omega_2$) and the post fault critical rotor speed ($\omega_{2cl}$) is at a minimum;

predicting that the power generator will be stable after the fault is cleared when a time to clear the fault ($t_{cl}$) is less than the critical clearing time ($t_{cr}$) or predicting that the power generator will be unstable after the fault is cleared when $t_{cl}$ is greater than $t_{cr}$; and generating an output signal that is sent to another component of the power system when the power generator is predicted to be unstable to take appropriate remedial actions to counteract the effect of the unstable power generator.

2. The method of claim 1, wherein values for $\omega_1$ are obtained according to $\omega_1 = \pm\sqrt{2(P_1(\delta-\delta_0)+\cos\delta-\cos\delta_0)}$, where $P_1$ is $P_m/P_{max}$, $P_m$ is an output power of the power generator, $P_{max}$ is a maximum electrical power of the power generator and $\delta_0$ is an initial internal voltage angle of the power generator when the fault occurs.

3. The method of claim 1, wherein the time scale values are determined based on consecutive values of δ and $\omega_1$ as well as a time factor ($TF_1$) during the disturbance defined according to $$TF_1 = \sqrt{\frac{180*M}{\pi*P_{maxdf}}}$$

where $P_{maxdf}$ is a maximum power that can be transferred during the fault condition and M is an inertia, constant of the power generator.

4. The method of claim 1, wherein the post fault critical rotor speed ($\omega_{2cl}$) is obtained according to $$\omega_{2cl} = \left(\frac{TF_1}{TF_2}\right)\omega_1$$

where $$TF_1 = \sqrt{\frac{180*M}{\pi*P_{maxdf}}},$$

$$TF_2 = \sqrt{\frac{180*M}{\pi*P_{maxaf}}},$$

$P_{maxdf}$ is a maximum power that can be transferred during the fault condition, $P_{maxaf}$ is a maximum power that can be transferred after the fault condition and M is an inertia constant of the power generator.

5. The method of claim 1, wherein the critical state plane trajectory is a separatrix separating stable state plane trajectories within the separatrix from unstable state plane trajectories outside of the separatrix.

6. The method of claim 1, wherein the method further comprises generating a blocking signal to avoid tripping any of the power system elements when the power generator is predicted to be stable after the fault is cleared and the generated output signal is a trip signal when the power generator is predicted to be unstable after the fault is cleared.

7. The method of claim 1, wherein the method comprises determining the critical clearing angle and the critical clearing time simultaneously thereby enabling faster prediction of stable and unstable states and reducing computational effort.

8. The method of claim 1, wherein a model for the power generator is derived from a plurality of generators in a power system by:
separating the plurality of generators into first and second groups of generators to form a two machine power system; and
converting the two machine power system into a single power generator.

9. The method of claim 8, wherein the method further comprises using a Single Machine Infinite Bus (SMIB) model to convert the two machine power system into a single power generator.

10. The method of claim 8, wherein the method further comprises using coherency analysis to separate the plurality of generators into the first and second groups of generators.

11. The method of claim 10, wherein the method further comprises forming a first group of generators by selecting a reference generator from the plurality of generators, determining a first change in generator voltage angle for a given generator and a second change in generator voltage angle for the reference generator, and assigning the given generator to the first group of generators when the first change is within a certain amount of the second change.

12. A device for predicting an out-of-step condition in a power system due to a disturbance, such as a fault, said power system comprising a power generator, and wherein the device comprises:
an input for receiving information on voltage and current for the power generator;
a processing unit coupled to the input for receiving the information and processing the information to:
monitor the power system for disturbances;
determine values for a state plane trajectory for the power generator during the disturbance based on using an internal voltage angle (δ) of the power generator and a during fault, rotor speed ($\omega_1$) of the power generator as state variables;
determine time scale values based on values of δ and $\omega_1$ during the disturbance;
determine values for a critical state plane trajectory for the power generator after clearing the fault to obtain values for a post fault critical rotor speed ($\omega_{2cl}$) with respect to δ;
determine values for a state plane trajectory for the power generator after clearing the fault to obtain values for a post fault rotor speed ($w_2$) with respect to δ;
determine a critical clearing angle ($\delta_{cr}$) and a critical clearing time ($t_{cr}$) that occur when a difference between the post fault rotor speed ($w_2$) and the post fault critical rotor speed ($w_{2cl}$) is at a minimum;
predict that the power generator will be stable after the fault is cleared when a time to clear the fault ($t_{cl}$) is less than the critical clearing time ($t_{cr}$) or predict that the power generator will be unstable after the fault is cleared when $t_{cl}$ is greater than $t_{cr}$; and
generate an output signal to isolate the unstable power generator; and
an output coupled to the processing unit, the output providing the output signal to another component of the power system when the power generator is predicted to be unstable to take appropriate action to counteract the unstable power generator.

13. The device of claim 12, wherein values for $\omega_1$ are obtained according to $\omega_1 = \pm\sqrt{2(P_1(\delta-\delta_0)+\cos\delta-\cos\delta_0)}$, where $P_1$ is $P_m/P_{max}$, $P_m$ is an output power of the power generator, $P_{max}$ is a maximum electrical power of the power generator and $\delta_0$ is an initial internal voltage angle of the power generator when the fault occurs.

14. The device of claim 12, wherein the time scale values are determined based on consecutive values of δ and $\omega_1$ as well as a time factor ($TF_1$) during the disturbance defined according to $$TF_1 = \sqrt{\frac{180*M}{\pi*P_{maxdf}}}$$

where $P_{maxdf}$ is a maximum power that can be transferred during the fault condition and M is an inertia constant of the power generator.

15. The device of claim 12, wherein the post fault critical rotor speed ($\omega_{2cl}$) is obtained according to $$\omega_{2cl} = \left(\frac{TF_1}{TF_2}\right)\omega_1$$

where $$TF_1 = \sqrt{\frac{180 * M}{\pi * P_{maxdf}}},$$

$$TF_2 = \sqrt{\frac{180 * M}{\pi * P_{maxaf}}},$$

$P_{maxdf}$ is a maximum power that can be transferred during the fault condition, $P_{maxaf}$ is a maximum power that can be transferred after the fault condition and M is an inertia constant of the power generator.

16. The device of claim 12, wherein the critical state plane trajectory is a separatrix separating stable state plane trajectories within the separatrix from unstable state plane trajectories outside of the separatrix.

17. The device of claim 12, wherein the device generates the output signal to be a blocking signal to avoid tripping any of the power system elements when the power generator is predicted to be stable after the fault is cleared and the devices generates the output signal to be a trip signal when the power generator is predicted to be unstable after the fault is cleared.

18. The device of claim 12, wherein the device is one of a protective relay and a central control center for a power system.

19. The device of claim 12, wherein the processing unit comprises at least one processor, the at least one processor including a digital signal processor.

20. The device of claim 12, wherein a model for the power generator is derived from a plurality of generators in a power system by:
    separating the plurality of generators into first and second groups of generators to form a two machine power system; and
    converting the two machine power system into a single power generator.

21. The device of claim 20, wherein the model is a Single Machine Infinite Bus (SMIB) model that is used to convert the two machine power system into a single power generator.

22. The device of claim 20, wherein coherency analysis is used to separate the plurality of generators into the first and second groups of generators.

23. The device of claim 22, wherein the coherency analysis comprises forming a first group of generators by selecting a reference generator from the plurality of generators, determining a first change in generator voltage angle for a given generator and a second change in generator voltage angle for the reference generator, and assigning the given generator to the first group of generators when the first change is within a certain amount of the second change.

24. A non-transitory computer readable medium comprising a plurality of instructions, that when executed on a microprocessor of an electronic device, cause the electronic device to implement a method of predicting an out-of-step condition in a power system due to a disturbance including a fault, said power system comprising at least, one power generator and wherein the method comprises:
    monitoring the power system for disturbances;
    determining values for a state plane trajectory for the power generator during the disturbance based on using an internal voltage angle ($\delta$) of the power generator and a during fault rotor speed ($\omega_1$) of the power generator as state variables;
    determining time scale values based on values of $\delta$ and $\omega_1$ during the disturbance;
    determining values for a critical state plane trajectory for the power generator after clearing the fault to obtain values for a post fault critical rotor speed ($w_{2cl}$) with respect to $\delta$;
    determining values for a state plane trajectory for the power generator after clearing the fault to obtain values for a post fault rotor speed ($w_2$) with respect to $\delta$;
    determining a critical clearing angle ($\delta_{cr}$) and a critical clearing time ($t_{cr}$) that occur when a difference between the post fault rotor speed ($w_2$) and the post fault critical rotor speed ($\omega_{2cl}$) is at a minimum;
    predicting that the power generator will be stable after the fault is cleared when a time to clear the fault ($t_{cl}$) is less than the critical clearing time ($t_{cr}$) or predicting that the power generator will be unstable after the fault is cleared when $t_{cl}$ is greater than $t_{cr}$; and
    generating an output signal that is sent to another component of the power system when the power generator is predicted to be unstable to take appropriate action to counteract the unstable power generator.

\* \* \* \* \*

UNITED STATES PATENT AND TRADEMARK OFFICE
CERTIFICATE OF CORRECTION

PATENT NO. : 9,529,057 B2
APPLICATION NO. : 13/949629
DATED : December 27, 2016
INVENTOR(S) : Binod Shrestha and Ramakrishna Gokaraju It is certified that error appears in the above-identified patent and that said Letters Patent is hereby corrected as shown below:

On the Title Page

The Applicants "Binod Shrestha and Ramakrishna Gokaraju" should read -- University of Saskatchewan --

The Assignee should read -- University of Saskatchewan --

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*